(12) United States Patent
Bonderson et al.

(10) Patent No.: US 11,751,493 B2
(45) Date of Patent: Sep. 5, 2023

(54) SCALABLE DESIGNS FOR TOPOLOGICAL QUANTUM COMPUTATION

(71) Applicant: Microsoft Technology Licensing, LLC, Redmond, WA (US)

(72) Inventors: Parsa Bonderson, Santa Barbara, CA (US); Chetan Nayak, Santa Barbara, CA (US); David Reilly, Sydney (AU); Andrea Franchini Young, Goleta, CA (US); Michael Zaletel, Berkeley, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 263 days.

(21) Appl. No.: 17/134,942

(22) Filed: Dec. 28, 2020

(65) Prior Publication Data

US 2022/0067563 A1 Mar. 3, 2022

Related U.S. Application Data

(60) Provisional application No. 63/070,112, filed on Aug. 25, 2020.

(51) Int. Cl.
*H10N 99/00* (2023.01)
*B82Y 40/00* (2011.01)
(Continued)

(52) U.S. Cl.
CPC .............. *H10N 99/05* (2023.02); *B82Y 40/00* (2013.01); *G06F 18/25* (2023.01); *G06N 10/40* (2022.01);
(Continued)

(58) Field of Classification Search
CPC ........ B82Y 40/00; B82Y 10/00; G06N 10/40; H01L 27/18; H01L 29/7613; H01L 39/228
See application file for complete search history.

(56) References Cited

U.S. PATENT DOCUMENTS 9,842,921 B2  12/2017  Eriksson et al.
10,565,515 B2  2/2020  Lampert et al.
10,692,924 B2  6/2020  Dzurak et al.

OTHER PUBLICATIONS

Bishara, et al., "Effect of Landau level mixing on the effective interaction between electrons in the fractional quantum Hall regime", In Journal of Physical Review, vol. 80, Sep. 3, 2009, 4 Pages.
(Continued)

*Primary Examiner* — Matthew L Reames
(74) *Attorney, Agent, or Firm* — Klarquist Sparkman, LLP

(57) ABSTRACT

Apparatus, methods, and systems are disclosed for robust scalable topological quantum computing. Quantum dots are fabricated as van der Waals heterostructures, supporting localized topological phases and non-Abelian anyons (quasiparticles). Large bandgaps provide noise immunity. Three-dot structures include an intermediate quantum dot between two computational quantum dots. With the intermediate quantum dot in an OFF state, quasiparticles at the computational quantum dots can be isolated, with long lifetimes. Alternatively, the intermediate quantum dot can be controlled to decrease the quasiparticle tunneling barrier, enabling fast computing operations. A computationally universal suite of operations includes quasiparticle initialization, braiding, fusion, and readout of fused quasiparticle states, with, optionally, transport or tunable interactions—all topologically protected. Robust qubits can be operated without error correction. Quasilinear arrays of quantum dots or qubits can be scaled arbitrarily, up to resource limits, and large-scale topological quantum computers can be realized. Extensive two-dimensional arrays can also be used.

20 Claims, 21 Drawing Sheets

(51) Int. Cl.
G06N 10/40 (2022.01)
H01L 29/423 (2006.01)
H01L 29/66 (2006.01)
H10N 60/10 (2023.01)
H10N 60/80 (2023.01)
B82Y 10/00 (2011.01)
H01L 29/16 (2006.01)
H01L 29/12 (2006.01)
H01L 29/76 (2006.01)
H01L 29/06 (2006.01)
H01L 29/26 (2006.01)
G06F 18/25 (2023.01)
H10N 60/01 (2023.01)
H10N 69/00 (2023.01)

(52) U.S. Cl.
CPC ........ *H01L 29/0692* (2013.01); *H01L 29/127* (2013.01); *H01L 29/1606* (2013.01); *H01L 29/26* (2013.01); *H01L 29/423* (2013.01); *H01L 29/66977* (2013.01); *H01L 29/7613* (2013.01); *H10N 60/0912* (2023.02); *H10N 60/128* (2023.02); *H10N 60/805* (2023.02); *H10N 69/00* (2023.02); *B82Y 10/00* (2013.01)

(56) References Cited

OTHER PUBLICATIONS

Blokhina, et al., "CMOS Position-Based Charge Qubits: Theoretical Analysis of Control and Entanglement", In Repository of arXiv:1912.11544v1, Dec. 24, 2019, 15 Pages.
Eich, et al., "Spin and Valley States in Gate-Defined Bilayer Graphene Quantum Dots", In Repository of arXiv:1803.02923v1, Mar. 8, 2018, 15 Pages.
Freedman, et al., "The Two-Eigenvalue Problem and Density of Jones Representation of Braid Groups", In Repository of arXiv:math/0103200v1, Mar. 28, 2001, pp. 1-32.
Frohlich, et al., "Braid Statistics in Local Quantum Theory", In Journal of Reviews in Mathematical Physics, vol. 2, Issue 03, 1990, pp. 251-353.
Goldin, et al., "Comments on "General Theory for Quantum Statistics in Two Dimensions"", In Journal of Physical Review Letters, vol. 54, Issue 6, Feb. 11, 1985, pp. 603-603.
Island, et al., "Spin-orbit-driven band inversion in bilayer graphene by the van der Waals proximity effect", In Journal of Nature, vol. 571, Jul. 4, 2019, pp. 85-89.
Koshino, et al., "Landau level spectra and the quantum Hall effect of multilayer graphene", In Journal of Physical Review, vol. 83, Issue 16, Apr. 27, 2011, 9 Pages.
Kumar, et al., "Nonconventional Odd-Denominator Fractional Quantum Hall States in the Second Landau Level", In Journal of Physical Review Letters, vol. 105, Issue 24, Dec. 10, 2010, 4 Pages.
Liu, et al., "2D materials for quantum information science", In Journal of Nature Reviews Materials, vol. 4, Issue 10, Aug. 19, 2019, 17 Pages.
Liu, et al., "Van der Waals integration before and beyond two-dimensional materials", In Journal of Nature, vol. 567, Mar. 21, 2019, pp. 323-333.
Mong, et al., "Fibonacci anyons and charge density order in the 12/5 and 13/5 quantum Hall plateaus", In Journal of Physical Review B, vol. 95, Mar. 20, 2017, pp. 1-14.
Moore, et al., "Nonabelions in the Fractional Quantum Hall Effect", In Journal of Nuclear Physics B., vol. 360, Issue 2-3, Aug. 1991, pp. 362-396.
Morf, et al., "Transition from Quantum Hall to Compressible States in the Second Landau Level: New Light on the $v = 5 / 2$ Enigma", In Journal of Physical Review Letters, vol. 80, Issue 7, Feb. 16, 1998, pp. 1505-1508.

"International Search Report and Written Opinion Issued in PCT Application No. PCT/US2021/032245", dated Mar. 18, 2022, 16 Pages.
Pisoni, et al., "Gate-Tunable Quantum Dot in a High Quality Single Layer MoS2 Van der Waals Heterostructure", In Repository of arXiv:1801.00452v1, Jan. 1, 2018, 4 Pages.
Radu, et al., "Quasiparticle Tunneling in the Fractional Quantum Hall State at $v = 5/2$", In Repository of arXiv:0803.3530v1, Mar. 25, 2008, pp. 1-6.
Read, et al., "Beyond paired quantum Hall states: Parafermions and incompressible states in the first excited Landau level", In Journal of Physical Review B, vol. 59, Mar. 15, 1999, pp. 8084-8092.
Rezayi, et al., "Incompressible Paired Hall State, Stripe Order, and the Composite Fermion Liquid Phase in Half-Filled Landau Levels", In Journal of Physical Review Letters, vol. 84, Issue 20, May 15, 2000, pp. 4685-4688.
Rezayi, Edward H., "Landau Level Mixing and the Ground State of the $v = 5 / 2$ Quantum Hall Effect", In Journal of Physical Review Letters, vol. 119, Issue 02, Jul. 14, 2017, 5 Pages.
Sodemann, et al., "Landau level mixing and the fractional quantum Hall effect", In Journal of Physical Review, vol. 87, Issue 24, Jun. 21, 2013, 15 Pages.
Storni, et al., "Fractional Quantum Hall State at $v = 5/2$ and the Moore-Read Pfaffian", In Journal of Physical Review Letters, vol. 104, Feb. 18, 2010, 4 Pages.
Willett, et al., "Interference measurements of non-Abelian e/4 & Abelian e/2 quasiparticle braiding", In Repository of arXiv:1905.10248v1, May 24, 2019, 88 Pages.
Willett, et al., "Magnetic field-tuned Aharonov-Bohm oscillations and evidence for non-Abelian anyons at v=5/2", In Repository of arXiv:1301.2639v1, Jan. 12, 2013, pp. 1-10.
Willett, et al., "Measurement of Filling Factor 5/2 Quasiparticle Interference: Observation of e/4 and e/2 Period Oscillations", In Repository of arXiv:0807.0221v3, May 18, 2009, pp. 1-26.
Zaletel, et al., "Infinite density matrix renormalization group for multicomponent quantum Hall systems", In Journal of Physical Review, vol. 91, Issue 4, Jan. 14, 2015, 12 Pages.
Barkeshli et al., "Symmetry Fractionalization, Defects, and Gauging of Topological Phases", arXiv 1410.4540, pp. 1-108 (Aug. 2019).
Bonderson, "Non-Abelian Anyons and Interferometry", California Institute of Technology Ph.D. Thesis, available at https://thesis.library.caltech.edU/2447/2/thesis.pdf, pp. 1-131 (May 2007).
Bonderson et al., "Interferometry of non-Abelian Anyons", arXiv 0707.4206, pp. 1-62 (Jan. 2008).
Bonderson et al., "Measurement-Only Topological Quantum Computation", arXiv 0802.0279, pp. 1-5 (Aug. 2008).
Bonderson et al., "Measurement-Only Topological Quantum Computation via Anyonic Interferometry", arXiv 0808.1933, pp. 1-57 (Nov. 2008).
Bonderson, "Splitting the Topological Degeneracy of non-Abelian Anyons", arXiv:0905.2726, pp. 1-5 (Sep. 2009).
Bonderson, "Measurement-Only Topological Quantum Computation via Tunable Interactions", arXiv:1210.7929, pp. 1-10 (Jan. 2013).
Bonderson et al., "On Invariants of Modular Categories Beyond Modular Data", 2000 Mathematics Subject Classification, arXiv 1805.05736, pp. 1-25 (Jun. 2018).
Bosacchi et al., "Preparation of high mobility GaAs/GaAIAs heterostructures and observation of fractional Quantum Hall Effect", Vuoto vol. XX, N. 3, pp. 555-564 (Jan. 1990).
Braakman et al., "Long-range coherent coupling in a quantum dot array", arXiv 1303.1034, pp. 1-22 (Mar. 2013).
Burton, "A Short Guide to Anyons and Modular Functors", arXiv:1610.05384, pp. 1-16 (Oct. 2016).
Castro et al., "Biased bilayer graphene: semiconductor with a gap tunable by electric field effect", arXiv:0611342, pp. 1-5 (Nov. 2007).
Colless et al., "Dispersive Readout of a Few-Electron Double Quantum Dot with Fas trf Gate-Sensors", arXiv 1210.4645, pp. 1-5 (Oct. 2012).
Dean et al., "Chapter 1: Fractional Quantum Hall Effects in Graphene", pp. 1-60, also published as "Chapter 1: Fractional Quantum Hall

(56) References Cited

OTHER PUBLICATIONS

Effects in Graphene", *Fractional Quantum Hall Effects: New Developments* (World Scientific, Singapore, 2020), pp. 317-375 (Jul. 2020).
Forsythe, et al., "Band Structure Engineering of 2D materials using Patterned Dielectric Superlattices", arXiv:1710.01365, 15 pages (Oct. 2017).
Freedman, "P/NP, and the quantum field computer", Proc. Natl. Acad. Sci., vol. 95, pp. 98-101 (Jan. 1998).
Geim et al., "Van der Waals heterostructures", arXiv:1307.6718, pp. 1-12 (2013).
Gonzalez-Zalba et al., "Probing the limits of gate-based charge sensing", Nature Communications, 6:6084, pp. 1-8 (Jan. 2015).
Greentree et al., "Coherent electronic transfer in quantum dot systems using adiabatic passage", arXiv:0407008, pp. 1-7 (Oct. 2005).
Huang, "Van der Waals Stacking of Two-Dimensional Materials", Cornell University Dissertation, pp. 1-116 (Aug. 2017).
Jarratt et al., "Dispersive Gate Sensing the Quantum Capacitance of a Point Contact", arXiv:1903.07793, pp. 1-6 (Mar. 2019).
Karzig et al., "Scalable Designs for Quasiparticle-Poisoning-Protected Topological Quantum Computation with Majorana Zero Modes", arXiv 1610.05289, pp. 1-34 (Jun. 2017).
Ki et al., "Observation of even denominator fractional quantum Hall effect in suspended bilayer graphene", arXiv 1305.4761, 16 pages, (Mar. 2014).
Kitaev, "Fault-tolerant quantum computation by anyons", Annals of Physics 303, 2, https://www.sciencedirect.com/science/article/abs/pii/S0003491602000180, pp. 2-30, (Jan. 2003).
Kliros, "A Phenomenonological Model for the Quantum Capacitance of Monolayer and Bilayer Graphene Devices", Romanian Journal of Information Science and Technology, vol. 13, No. 3, pp. 332-341 (2010).
Knapp et al., "How quickly can anyons be braided? Or: How I learned to stop worrying about diabatic errors and love the anyon", arXiv 1601.05790, pp. 1-35 (Aug. 2016).
Lee et al., "Atomically thin p-n junctions with van der Waals heterointerfaces", arXiv:1403.3062, pp. 1-29 (2014).
Levaillant et al., "Universal Gates via Fusion and Measurement Operations on $SU(2)_4$ Anyons", arXiv 1504.02098, pp. 1-18 (Jul. 2015).
Li et al., "Even denominator fractional quantum Hall state in bilayer graphene", arXiv:1705.07846, pp. 1-6 (May 2017).
Lucatto et al., "Charge qubit in van der Waals heterostructures", arXiv:1904.10785, pp. 1-11 (Apr. 24, 2019).
Nayak et al., "Non-Abelian Anyons and Topological Quantum Computation", arXiv 0707.1889, pp. 1-73 (Mar. 2008).
Onodera et al., "Assembly of van der Waals heterostructures: exfoliation, searching, and stacking of 2D materials", Japanese Journal of Applied Physics 59, 010101, pp. 1-9 (2020).
Papic et al., "Topological Phases in the Zeroth Landau Level of Bilayer Graphene", arXiv 1307.2909, pp. 1-5 (Jul. 2013).
Park et al., "From adiabatic to dispersive readout of quantum circuits", arXiv:2007.05030, pp. 1-10 (Jul. 2020).
Pereira et al., "Tunable quantum dots in bilayer graphene", arXiv:0703194, pp. 1-5 (Mar. 2007).
Petit et al., "Universal quantum logic in hot silicon qubits", arXiv:1910.05289, pp. 1-10 (Oct. 2019).
Rossi et al., "Dispersive readout of a silicon quantum dot with accumulation-mode gate sensor", arXiv:1610.00767, pp. 1-6 (Oct. 2016).
Tran et al., "Optimizing Clifford gate generation for measurement-only topological quantum computation with Majorana zero modes", arXiv:1909.03002, pp. 1-72 (Mar. 2020).
Van Heck et al., "Topological blockade and measurement of topological charge", arXiv:1207.0542, pp. 1-5 (Feb. 2013).
Wang et al., "One-Dimensional Electrical Contact to a Two-Dimensional Material", Science, vol. 342, pp. 614-617 (Nov. 2013).
Wei et al., "Mach-Zehnder interferometry using spin- and valley-polarized quantum Hall edge states in graphene", Science Advances 3, el700600, pp. 1-7 (Aug. 2017).
West et al., "Gate-based single-shot readout of spins in silicon", arXiv:1809.01864, pp. 1-8 (Oct. 2018).
Zheng et al., "Measurement-only topological quantum computation without forced measurements", arXiv:1607.07475, pp. 1-10 (Jan. 2017).
Zibrov et al., "Tunable interacting composite fermion phases in a half-filled bilayer-graphene Landau level", Nature, vol. 549, pp. 360-364 (Sep. 2017).
Zibrov et al., "Robust fractional quantum Hall states and continuous quantum phase transitions in a half-filled bilayer graphene Landau level", arXiv 1611.07113, pp. 1-27 (Apr. 2017).
U.S. Appl. No. 17/134,953, filed Dec. 28, 2020.

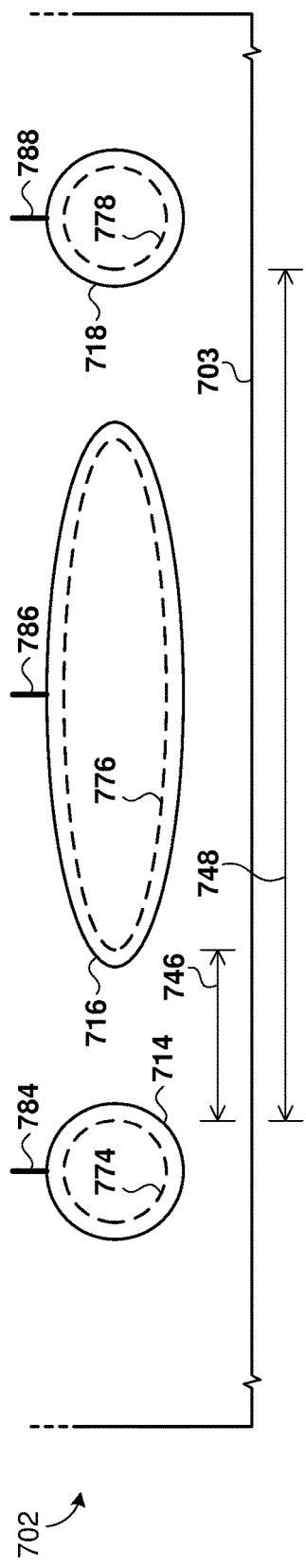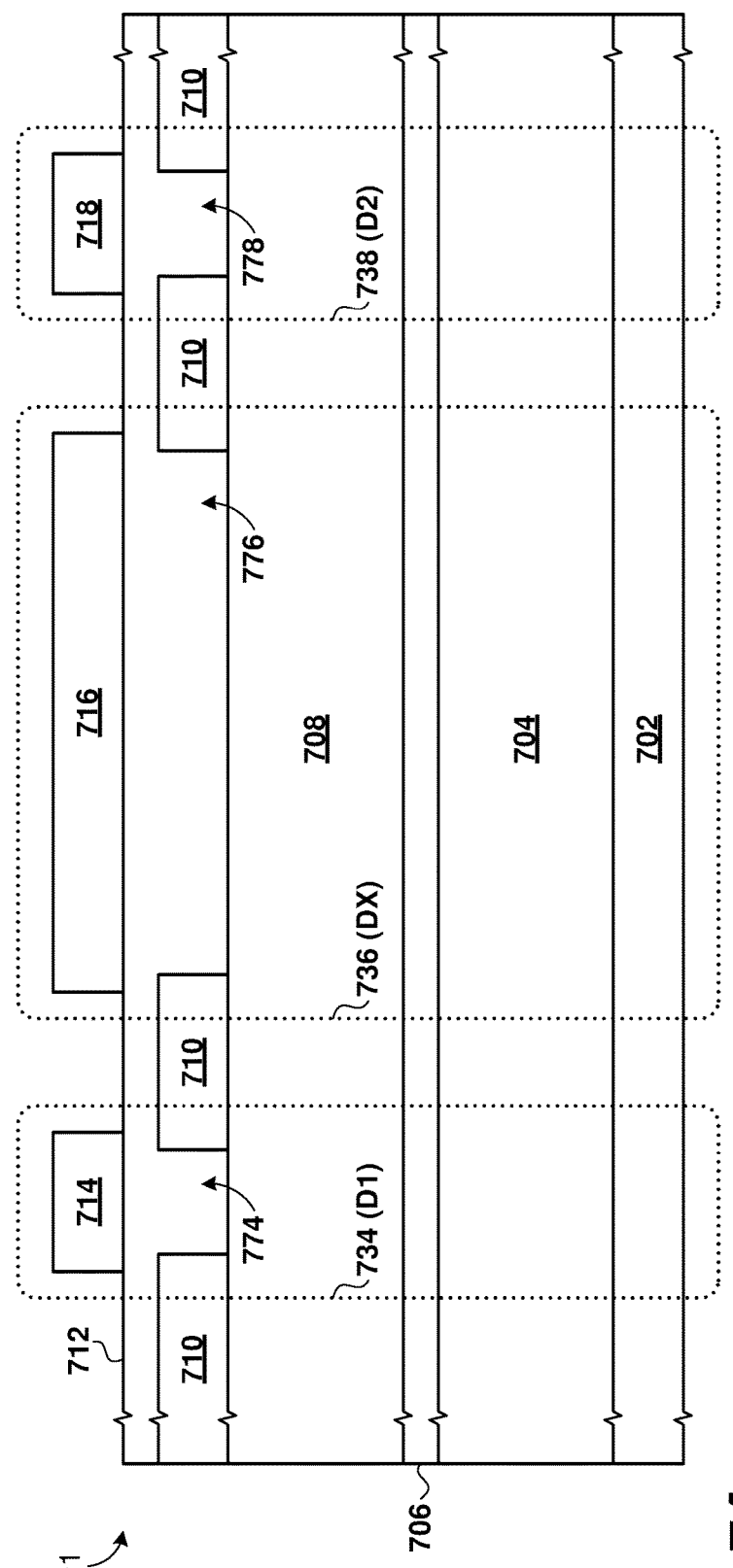

SCALABLE DESIGNS FOR TOPOLOGICAL QUANTUM COMPUTATION

CROSS REFERENCE TO RELATED APPLICATIONS

This application claims the benefit of U.S. Provisional Application No. 63/070,112, filed on Aug. 25, 2020, which is incorporated herein by reference in its entirety.

FIELD

This application relates generally to quantum dot devices and topological quantum computing.

SUMMARY

In brief, the disclosed technologies enable robust scalable topological quantum computing. Some examples of the disclosed technologies implement quantum dots as van der Waals heterostructures, to provide localized topological phases with which non-Abelian anyons (quasiparticles) can be implemented. The van der Waals systems can exhibit large bandgaps and provide noise immunity. Additional examples utilize a three-dot structure, with an intermediate quantum dot positioned between two computational quantum dots. With the intermediate quantum dot in an OFF state, quantum states encoded in quasiparticles at the computational quantum dots can have a long lifetime, with immunity from decoherence. Alternatively, the intermediate quantum dot can be controlled to provide tunneling and tunable interactions between the computational quantum dots, enabling computing operations on a practical timescale. Further examples provide a suite of computational operations (including initialization of quasiparticles, transport, tunable interactions, braiding, fusion, and readout of fused quasiparticle states) all of which are topologically protected. Still further, the disclosed technologies enable reliable qubits without any error correction. Additionally, quasilinear arrays of quantum dots can be organized as qubits and extended arbitrarily, limited only by constraints of space or other resources. Such features, in various combinations and subcombinations, enable large-scale robust topological quantum computers to be realized.

In certain examples, the disclosed technologies can be implemented as a quantum dot incorporating an all-van der Waals heterostructure. The heterostructure can include distinct transverse van der Waals layers stacked vertically, the layer stack having, in order: a bottom electrode layer, a bottom dielectric layer, an active layer, a top dielectric layer, and a top electrode layer. A dot electrode can be positioned over the top dielectric layer at an opening in the top electrode layer.

In certain examples, the disclosed technologies can be implemented as a quantum dot array having a plurality of quantum dots including first, intermediate, and second quantum dots. These quantum dots can be independently configurable to support a given type of non-Abelian anyon under respective electromagnetic field environments. The intermediate quantum dot can be configurable between its respective electromagnetic field environment and an OFF state. In a first case, with the first and second quantum dots under their respective electromagnetic field environments and the intermediate quantum dot in the OFF state, a first tunneling barrier for the given type of non-Abelian anyon, between the first quantum dot and the second quantum dot, can be above a first limit. In a second case, with the first and intermediate quantum dots under their respective electromagnetic field environments, a second tunneling barrier for the given type of non-Abelian anyon, between the first quantum dot and the intermediate quantum dot, can be below a second threshold.

In certain examples, the disclosed technologies can be implemented as a method of forming a heterostructure. A succession of van der Waals layers can be formed above a substrate, the van der Waals layers including a bottom electrode layer, a bottom dielectric layer, an active layer, a top dielectric layer, a top dielectric layer, and a top electrode layer. A dot electrode can be formed at an opening in the top electrode layer.

In certain examples, the disclosed technologies can be implemented as a quantum computer having a coupled plurality of qubits formed as a quasilinear array of quantum dots. The quasilinear array can have an aspect ratio in a range 50:1 to 10000:1. The array of quantum dots can be configured to support localized non-Abelian quasiparticles, and can include computational quantum dots and control quantum dots. Each control quantum dot can be configured to control a tunneling barrier or a tunneling amplitude between a respective pair of the computational quantum dots.

In certain examples, the disclosed technologies can be implemented as a method. Signals can be applied to control electrodes of first and second quantum dots of a qubit, to initialize first and second quasiparticles, which are non-Abelian topological quasiparticles localized at the first and second quantum dots respectively. A voltage change can be applied to a control electrode of a third quantum dot of the qubit, positioned between the first quantum dot and a fourth quantum dot of the qubit, to decrease a tunneling barrier for the first quasiparticle between first quantum dot and the fourth quantum dot and cause the first quasiparticle to be transported from the first quantum dot to the fourth quantum dot.

In certain examples, the disclosed technologies can be implemented as a computer readable medium storing instructions which, when executed by one or more hardware processors can cause the following actions to be performed. One or more gate voltages can be altered at a set of gates to create one or more first tunnel couplings between two or more quantum dots fabricated as a Van der Waals heterostructure. The first tunnel couplings can alter energy levels of two first non-Abelian quasiparticles on the two or more quantum dots, resulting in a hybridization of quantum states in the quantum system. A hybridization energy of the quantum system can be measured. A joint topological charge of the two first non-Abelian quasiparticles can be determined based on the measured hybridization energy.

The foregoing and other objects, features, and advantages of the invention will become more apparent from the following detailed description, which proceeds with reference to the accompanying figures.

BRIEF DESCRIPTION OF THE DRAWINGS

FIG. 7A-7B are views of an example quantum dot array according to the disclosed technologies.

DETAILED DESCRIPTION

I. Introduction

Figure 1:
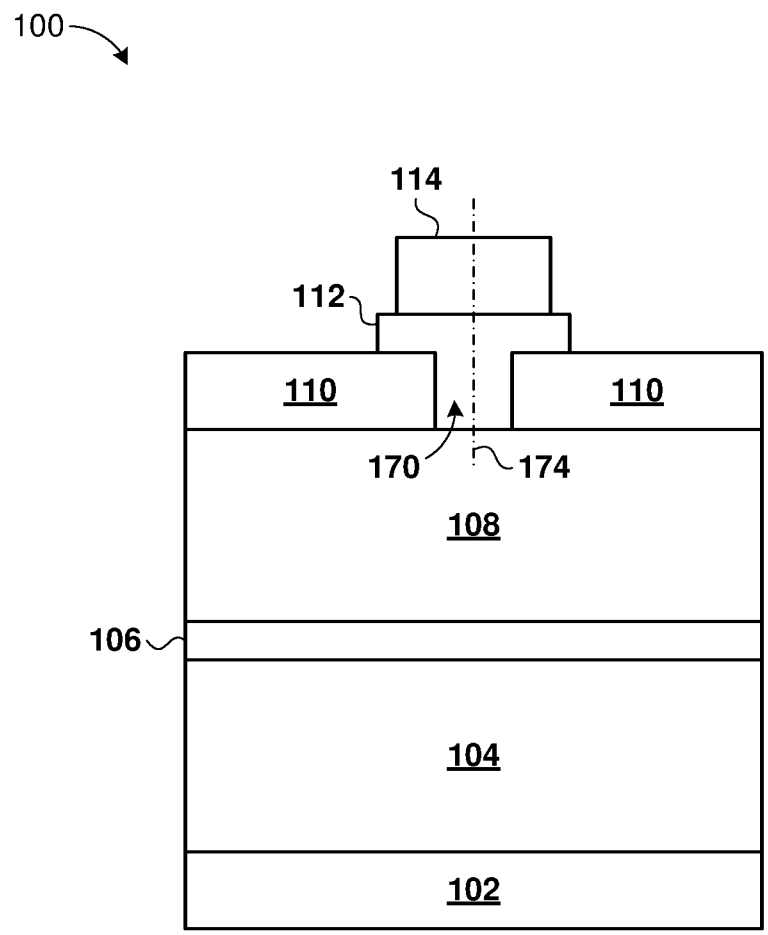
FIG. 1 is a diagram of a first example heterostructure according to the disclosed technologies.

The topological approach to quantum computation employs the emergent nonlocal state spaces manifested by topological phases of matter, which provide a "topologically protected" way to encode and manipulate quantum information. Such systems suppress errors that arise from local noise sources and perturbations by a factor that is exponential in the spatial extent of the non-local states or the inverse temperature. Certain (2+1)D topological phases may support quasiparticle excitations that are non-Abelian anyons. Such quasiparticles collectively possess a multi-dimensional topological state space and exchange operations, i.e. "braiding," act on this state space as unitary transformations. In addition to performing braiding exchanges of quasiparticles by physically transporting the quasiparticles, one can equivalently generate the braiding transformations of non-Abelian anyons through sequences of topological charge measurements or tunable interactions acting on quasiparticles whose positions remain fixed.

Two well-known types of non-Abelian anyons are the Ising and Fibonacci anyons. Braiding transformations and topological charge measurements of Ising anyons yield the Clifford quantum gates, which are computationally universal when supplemented by any non-Clifford gate, such as the $\pi/8$-phase gate. Braiding transformations of Fibonacci anyons yield a computationally universal gate set. It is natural to search for such anyons in fractional quantum Hall (FQH) systems, since they are the best established examples of nontrivial topo-logical phases.

II. Overview

Conventionally, quantum computing has been challenged by issues such as noise, decoherence and, generally, lack of scalability. The disclosed technologies address such problems and enable robust, scalable, topological quantum computing.

In one aspect, examples of the disclosed technologies implement a van der Waals heterostructure, in which a two-dimensional electron gas (2DEG) can support non-Abelian fractional quantum Hall states. Quantum dots in such a heterostructure can localize quasiparticles (collective modes) of the quantum Hall states which are non-Abelian anyons. The van der Waals heterostructure can provide significantly larger bandgaps for such phases, compared to other attempted topological computing structures such as GaAs. Larger bandgaps can provide improved noise immunity or can permit higher temperature operation with less power consumption required for cooling. Disclosed van der Waals heterostructures can also provide low correlation lengths, and consequently a significant enhanced topological protection based on the size of a topological phase being greater than the correlation length.

In a second aspect, quantum computers based on quantum dots can have conflicting constraints. On one hand, physical separation between quantum dots is desirable to provide isolation and avoid decoherence, so that long lifetimes can be achieved for quasiparticles and qubit states. On the other hand, practical computing can require low tunneling barriers so that tunneling interactions occur on practical timescales, so that computing operations can be completed with high probability in a short period of time, which favors closer packing of quantum dots. Examples of the disclosed technologies implement a basic unit of three quantum dots, in which two computational quantum dots can be separated by an intermediate quantum dot. With the intermediate quantum dot in an OFF state, quasiparticles at the computational quantum dots can be isolated, with immunity from decoherence and a long lifetime. To effect computing operations, the intermediate quantum dot can be controlled to decrease a tunneling barrier and provide transport or tunable interactions between the computational quantum dots, enabling fast computing operations under program control.

Generally, topological quantum computing can provide additional noise immunity due to quantum rules such as conservation of topological charge. In the disclosed quantum dot implementations, the topological protection is gained from the nonlocal nature of the collective state of non-Abelian anyons, where even though the individual quasiparticles are localized on dots, their collective state (e.g. fusion channels) are nonlocal and distributed over the extent of the entire collection of quasiparticles. Still, in some topological quantum computers, the benefits of topological protection can be compromised by requiring at least one operation that is not topologically protected (such as a π/8 phase gate, or T gate) in order to achieve computation universality. In some embodiments, the disclosed technologies overcome this limitation with a suite of operations that are computationally universal, and are all topologically protected. Such a suite can include operations for initialization of quasiparticles, tunable interactions between quasiparticles, transport of quasiparticles between quantum dots, braiding of quasiparticles, fusion of quasiparticles, and readout of fused quasiparticles.

Such features, singly or in combination, enable groups of quantum dots to be used as qubits without error correction. Whereas some other technologies require 10, 100, or even thousands of physical qubits to implement one reliable logical qubit, the disclosed technologies allow a 1:1 correspondence between physical and logical qubits. That is, a reliable logical qubit can be built from exactly one physical qubit.

Another issue for scalable quantum computing has been electrical connectivity. In some architectures, extracting electrical leads (e.g. for control electrodes) from a crowded array of devices. In contrast, the disclosed technologies allow quasilinear arrays of quantum dots to be organized as qubit chains of virtually unlimited length, subject to available space or other resource constraints. This advantage is partly due to the feasibility of qubits that are robust without error correction. Extracting electrical leads from two sides of a quasilinear qubit chain can be straightforward, and all required electrical connectivity readily obtained.

In summary, combinations and subcombinations of these and other features enable construction and operation of reliable large-scale topological quantum computers with hundreds, thousands, or even millions of qubits. Embodiments are described in the following sections. An Appendix provides additional technical detail.

III. Terminology

The term "aspect ratio" refers to a dimensionless ratio of a structure's sizes in two principal directions, and commonly applies to length:width of a quantum dot array, qubit, or array of qubits. The sizes can be specified in physical units (e.g. nm or μm) or in structural units (e.g. a qubit of FIG. 10A can have a length of 7 quantum dots and a width of 3 quantum dots, or a qubit chain can have a length of 50 qubits and a width of 1 qubit).

A "braiding transformation" (or simply "braiding") refers to a transformation of two or more non-Abelian quasiparticles that can be performed in two or more different ways that have different topological properties. For example, quasiparticles Q1, Q2 can be transposed by a right-hand half-twist (Q1, Q2 going clockwise relative to each other, as viewed from above) or by a left-hand half-twist (Q1, Q2 going anti-clockwise). For non-Abelian quasiparticles, the order of operations can be distinguished, as they effect unitary rotations in a multi-dimensional state space. Braiding can be performed by physical movement of the quasiparticles, but that is not a requirement. As described further herein, braiding can also be performed by suitably sequenced interaction operations or fusion channel measurements between non-Abelian quasiparticles. Braiding transformations can be successively combined, e.g. a half-twist of Q1, Q2 followed by a half-twist of Q2 and Q3, to result in braids of three or more quasiparticles resembling everyday examples such as braids of rope or hair.

"Computation operations" refer to actions performed on qubits to read, write, or modify the qubit state. In examples, a qubit can be written (initialized) by controlling physical components of the qubit (e.g. quantum dots) to render splitting of a vacuum state into two complementary quasiparticles energetically favorable. In other examples, a qubit can be written by waiting for a thermal fluctuation to populate the quantum dots. In further examples, a qubit can be written (or modified) by interaction with another qubit. In examples, a qubit can be read by measuring capacitance during fusion of two quasiparticles, and inferring the energy of the fused quasiparticle and its fusion state therefrom. A qubit can be modified by operations (collectively, "modification operations") including transport of one quasiparticle, interaction of two quasiparticles, or fusion of two quasiparticles. Modification operations can be performed within a single qubit (e.g. between one or more quasiparticles initially localized at respective quantum dots of the qubit) or between two qubits. Embodiments of the disclosed technologies need not support all of these modification operations, or can support alternative computational operations. A fusion operation can be utilized for modification or for reading. The described modification operations can be regarded as elementary operations from which successively more complex operations (e.g. braiding) can be built. Not all of transport, tunable interactions, and fusion are required for computational universality. Fusion can be retained for purpose of reading a qubit while, in some examples, one or both of transport or tunable interactions can be omitted. Transport operations are denoted D1→D2 with reference to the quantum dots between which the transport occurs. Tunable interactions are denoted D1↔D2 or Q1↔Q2 for quasiparticles Q1, Q2 on dots D1, D2. Fusion operations are denoted as Q1⊗Q2 between quasiparticles. In some instances, fusion operations are denoted D1⊗D2 referring to fusion of quasiparticles initially localized on quantum dots D1, D2.

The term "computationally universal" refers to a set of operations that can transform one or more qubits from any initial state (e.g. α|0⟩ +β|1⟩ for a single qubit) to any final state (e.g. α'|0⟩ +β'|1⟩ ), within a specified tolerance, in a finite number of operations. In this way, the available state space (e.g. α, β) can be densely populated, leading to more efficient quantum computation.

The terms "dielectric" and "insulator" refer to materials which, in bulk form, have a gap greater than kT between their valence and conduction bands, where k is the Boltzmann constant and T is the absolute temperature. Because of this property, valence electrons cannot move freely through the bulk material. Such materials are generally electrically insulating. The term is understood to refer to properties of material at room temperature (300 K) and normal pressure (1 atm) where disclosed devices can be manufactured, which may differ from properties of the material in a cryogenic environment where disclosed devices maybe used.

An "electrode" is an electrically conducting component of a structure that serves as an interface between another electrically conducting component (e.g. an electrical lead or wire) and a less conducting component, such as a dielectric layer of a van der Waals heterostructure. Some electrodes of interest in this disclosure are the electrodes of top and bottom electrode layers in a van der Waals heterostructure, and a control electrode for a quantum dot (dubbed "dot electrode") positioned at an opening in an electrode, or between multiple electrodes, in the top electrode layer. The active layer of a van der Waals heterostructure can also be an electrode. The term "gate," as a noun, can be used as an alternative to electrode.

The term "energy profile" refers to the dependence of potential energy (sometimes, "chemical potential"), for a quasiparticle, along a spatial coordinate. An energy profile can have a well ("potential well", "pinning potential") in which case a quasiparticle having energy less than the depth of the well can be localized in the well. An energy profile can have a "barrier" where the potential energy exceeds the energy of the quasiparticle. The quasiparticle can tunnel through a barrier with an interaction strength dependent on the height and width of the barrier. An energy profile can be "monotonic" between two points, i.e. non-increasing or non-decreasing, indicating an absence of a local potential well in which the quasiparticle can be localized or trapped. Some illustrative energy profiles that can be employed are described below in context of FIG. 15.

The terms "environmental condition" or "electromagnetic field environment" refer to macroscopic properties such as electric or magnetic fields (or, for environmental condition, also temperature) that can affect the behavior of a device such as a quantum dot or an active layer in a van der Waals heterostructure. Particularly, the carrier density in the active layer can be determined by the sum of voltages VT+VB on top and bottom electrodes relative to a grounded active layer. Together with an applied magnetic field, the electric field at the active layer (determined by difference in voltages VT−VB) can determine the existence of a desired fractional quantum Hall state. Further, a control voltage applied to a dot electrode can develop a potential well relative to surrounding regions in which a topological phase (e.g. in a non-Abelian fractional quantum Hall state) can be stably localized.

The term "fusion" refers to making a measurement by coalescing of two or more quasiparticles into a single quasiparticle, e.g. through hybridization of their waveforms. Because of quantum conservation rules, fusion between two quasiparticles can be limited to a finite number of possibilities ("channels") having respective probabilities of occurrence. In some examples, the channel actually followed can be determined e.g. by measurement of a capacitance, but this is not a requirement. However, a "fusion channel measurement" does not require coalescing of the interacting quasiparticles.

A "fusion rule" is a specification of topological charge values c into which a pair of given topological charges a, b can fuse. Particularly, fusion a×b can follow pathways to one or more topological charge values c according to Equation (1).

$$a \times b = \Sigma_c N_{ab}^c \cdot c. \quad (1)$$

The coefficient $N_{ab}^c \neq 0$ for allowed fusion products c, and is zero otherwise.

"Graphite" is an allotrope of carbon that is a van der Waals material with hexagonal crystalline planes of covalently bonded carbon atoms. "Graphene" refers to a thin sheet of graphite having 1-4 such planes (levels) of covalently bonded carbon atoms. Bilayer graphene, used in some disclosed embodiments, has two monolayers and a thickness of about 0.8 nm. Like common graphite, the two monolayers can have a transverse offset denoted as "Bernal stacking", but this is not a requirement.

The term "heterostructure" refers to a device or structure having inhomogeneous composition, i.e. with constituent parts (often, layers) formed of distinct materials. Of interest in this disclosure are heterostructures formed of "van der Waals" materials.

The term "hybridization" refers to a coherent superposition of quantum mechanical states between two quasiparticles or other entities.

In the context of heterostructures or quantum dots, the term "layer" refers to a component of the heterostructure or quantum dot, predominantly extending in two directions (e.g. transverse plane) with a small thickness (e.g. in a vertical direction) and having generally homogeneous composition. Some layers can have transverse structure within the layer, for example an aperture or gap which can be vacant or filled with a dissimilar material. Some layers herein are van der Waals layers, however the term extends to other materials as well. Inasmuch as van der Waals materials can have different properties in a basal plane and in an orthogonal direction, a layer need not be isotropic. A layer need not be flat, but can be shaped e.g. to conform with an underlying substrate. Layers of interest in some disclosed devices include active layers, dielectric layers, and electrode layers. An "active layer" is one that can define a collective state supporting a non-Abelian topological phase, such as a fractional quantum Hall state in a two-dimensional electron gas. Example active layers can be Bernal-stacked bilayer graphene, but this is not a requirement and monolayer graphene or a transition metal dichalcogenide ("TMD") such as $MoS_2$ can also be used. A "dielectric layer" is formed of a dielectric material, such as hexagonal BN or a TMD. An "electrode layer" is formed of an electrically conductive material and can be formed as a single electrode (with optional apertures) or as a pattern of multiple electrodes.

A "metal" is a material which, in bulk form, has overlapping valence and conduction bands. Because of this property, valence electrons can move freely through the bulk material. Such materials are generally electrically conductive. The term is understood to refer to properties of material at room temperature (300 K) and normal pressure (1 atm) where disclosed devices can be manufactured, which may differ from properties of the material in a cryogenic environment where disclosed devices maybe used.

The term "non-Abelian" refers to phases, states, or quasiparticles for which operations are not commutative. Non-Abelian phases, states, or quasiparticles have advantageous properties for quantum computing.

A "quantum dot" (or simply "dot") is a device having inhomogeneous structure in one dimension defining macroscopically accessible quantum states, and a homogeneous structure with finite extent (hence, designated as a dot) in other dimensions. The finite extent of the homogeneous structure can limit a finite extent of the quantum states, and can be defined by features in one or a few layers of the quantum dots (such as an aperture in a top electrode layer, or a finite control electrode), while other layers of the structure extend beyond such features. Example quantum computing apparatus described herein incorporate arrays of quantum dots, which can be used to localize and store quasiparticles, or to perform computation operations with quasiparticles. Disclosed qubits can incorporate quantum dots having different roles. "Computational quantum dots" can collectively define a qubit state, and can persistently store quasiparticles between computation operations, across multiple computation operations, or simply as storage. "Ancillary quantum dots" can store quasiparticles and can facilitate computation operations, without being part of a qubit's state. "Intermediate quantum dots" can be used to control tunneling barriers between the computational or ancillary quantum dots, or between the intermediate quantum dot and another quantum dot. In some examples, an intermediate quantum dot can be configured to have a potential well and can provide transient storage of a quasiparticle. Two quantum dots are said to be "coupled" if the tunneling barrier between them is below a threshold. The threshold can be based on a requirement for practical computation operations, viz. a predetermined high probability that the operation completes in a predetermined small amount of time. Two quantum dots are said to be isolated if the tunneling barrier between them is above a limit. The limit can be based on a predetermined lifetime. To illustrate, a lifetime of $10^7$ s can correspond to a likelihood of $10^{-7}$ per second that a given tunneling interaction occurs. In some disclosed examples, quantum dot phenomena can be localized effects in an active layer of an all-van der Waals heterostructure.

The term "quasilinear" refers to a structure that can be extended by replication in one direction (referred to as its "length") without any change to its size in other directions (which can be "width" or thickness). Terms like length and width may also be used in other contexts, in their common meaning.

A "quasiparticle" is a collective mode of physical particles which exhibits particle-like properties. Particularly, due to quantum conservation rules, macroscopic properties can be conserved (e.g. topological charge, or electrical charge). Quasiparticles can interact with other quasiparticles according to predetermined rules. Some quasiparticles of interest in this disclosure are non-Abelian anyons. Where used without qualification, the term quasiparticle refers to a non-Abelian quasiparticle.

A "qubit" or "quantum bit" is a device storing an elemental unit of quantum information. A qubit can have two basis states denoted $|0\rangle$ and $|1\rangle$, similar to the 0, 1 states of a conventional data bit. However, unlike a conventional bit, a qubit can exist in a linear superposition of its basis states, denoted $\alpha|0\rangle + \beta|1\rangle$, where $\alpha$, $\beta$ are represent a point on a unit sphere. A qubit can refer to a physical qubit, which is a hardware device storing an elemental unit of quantum information, or it can refer to a logical qubit, which is a logical device providing reliable storage of an elemental unit of quantum information to a quantum computing program. Because some implementations of quantum computers are prone to errors from noise and decoherence, such quantum computers can employ sophisticated error correction (e.g. stabilizer codes) to present a reliable logical qubit to a program, using e.g. additional physical qubits for error correction. Where used without qualification, the term qubit refers to a physical qubit although, as described further herein, physical and logical qubits can be identical in some embodiments of the disclosed technologies. Two qubits are "coupled" if quantum interactions can be performed between them, in a chain through other qubits as needed. A set of qubits is coupled if every pair of the set is coupled. In contexts other than coupled quantum dots or coupled qubits (e.g. electrical circuit components or thermal coupling), "couple" can retain its ordinary meaning. Like bits of a conventional non-quantum computer, a qubit can be utilized for memory or storage, or as computation data (e.g. as a register).

The term "spacer" refers to a component of a structure that maintains physical separation between two other components of the structure. Commonly, a spacer can be a dielectric material placed between two conductive materials, but this is not a requirement.

The term "stack" describes a three-dimensional structure in which distinct and generally planar functional units are situated one above another.

The term "state" refers to a characterization of a qubit, a quasiparticle, or a quantum dot that is sufficient to determine its behavior or probabilities of measurement outcomes. For example, a qubit's state can be represented as $\alpha|0\rangle + \beta|1\rangle$, or a quasiparticle's state can be represented as a charge q and a topological charge c. In disclosed examples, a quantum dot with a pinning potential can exist in a superposition of eigenstates corresponding to respective quasiparticles. Some of these eigenstates or quasiparticles can have an energy below the energy gap of an instant device and can be retained for analyzing or describing operations or properties of the quantum dot. Other eigenstates can have energy levels above the energy gap of the instant device and can be omitted while analyzing or describing computation operations or modification operations of the instant device. Particularly, superposition of states with different topological charge values can often rapidly decohere due to local noise.

A "substrate" is a layer supporting a heterostructure or other device. Generally, a substrate is not electrically functional, although it can have capacitance, resistance, or parasitic electrical properties. A substrate can be thermally functional, providing heat conduction or serving as a cold finger. In common examples of the disclosed technologies, a substrate can be positioned below a quantum computing device, but this is not a requirement, and inverted geometries can also be used.

The "thickness" of a layer or component (e.g. a component of a heterostructure) is its extent in the vertical direction (i.e. with reference to the definition of top, etc.).

The terms "top," "bottom," "up," "down," "above," "below," "transverse," "vertical" and the like are used for convenience, with respect to a common configuration in which a control electrode is at the top, and an active layer or a stack of van der Waals layers is below the control electrode. In such a configuration, transverse refers to the horizontal, i.e. parallel to a given heterostructure layer, and heterostructure layers can be stacked vertically one above another. One of ordinary skill will understand from this disclosure that a choice of actual orientation can be varied without departing from the scope of the disclosed technologies. Often, a substrate is situated at the bottom of a heterostructure layer stack, but this is not a requirement.

A "topological phase" is a phase of matter characterized by collective behavior of atomic or subatomic particles (e.g. a two-dimensional electron gas) and emergent conserved quantum numbers which can be denoted "topological charges." Rules applicable to the conserved quantum numbers result in robustness to local perturbations. Of interest in disclosed examples are non-Abelian topological phases which have properties useful for quantum computation. Some fractional quantum Hall states (e.g. of an active layer in a van der Waals heterostructure) can support non-Abelian topological phases as described in some examples. Quasiparticles of a topological phase can be localized at a quantum dot.

The "transverse extent" of a structure is its extent in a transverse direction (i.e. horizontal, with reference to the definition of top, etc.) Often, structures can have a major transverse extent which is the largest value of transverse extent in any transverse direction, and a minor transverse extent which is the smallest value of transverse extent in any transverse direction.

Figure 15:
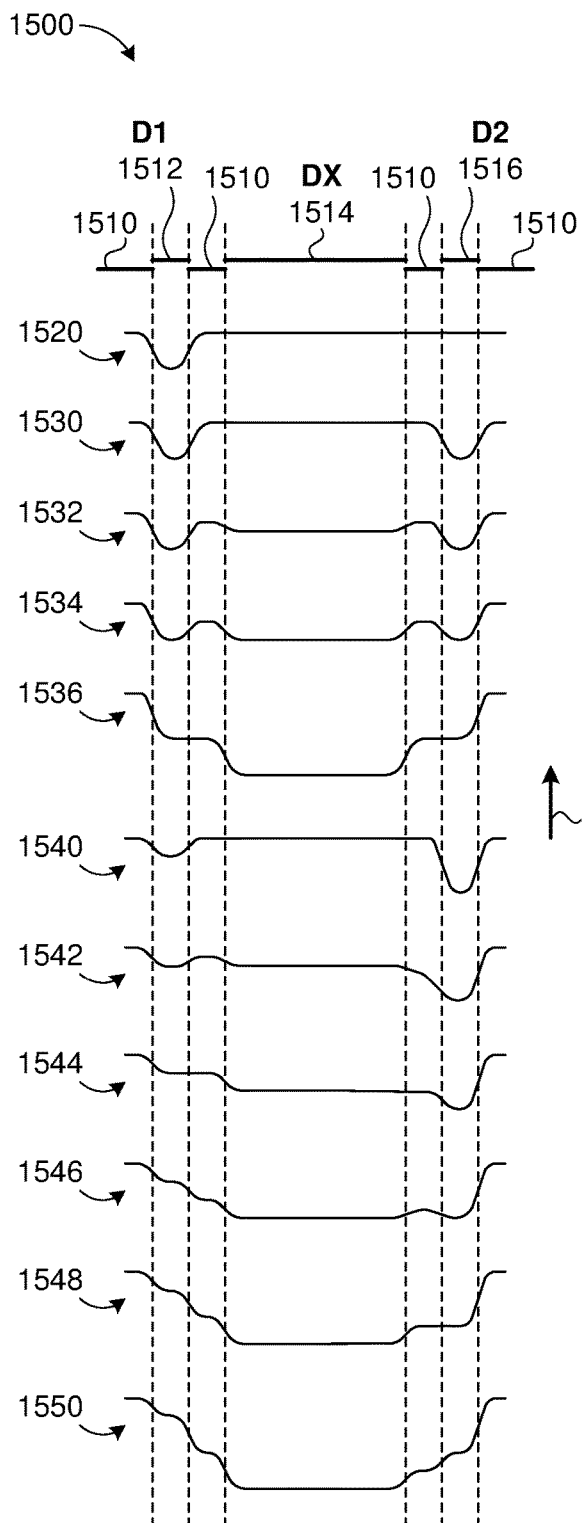
FIG. 15 is a diagram illustrating exemplary energy profiles for two quantum dots separated by an intermediate quantum dot according to an example of the disclosed technologies.

"Tunable interaction" refers to an interaction between quasiparticles in which the degree of interaction can be varied. For example, a tunneling barrier between quantum dots on which the quasiparticles are localized can be decreased to varying degrees to control the degree of interaction. A time duration for which the tunneling barrier is decreased can also be controlled. In some disclosed examples, the tunneling barrier can be controlled by varying one or more voltages applied to dot electrodes. With reference to FIG. 15, energy profiles 1530, 1532, 1534 illustrate examples of controlling a dot electrode voltage on intermediate quantum dot DX 1514 to vary the tunneling barrier between computational quantum dots D1 1512, D2 1516 in a three-dot geometry. A tunneling barrier can also be controlled by varying dot electrode voltages on the quantum dots on which the quasiparticles are localized, e.g. D1, D2 in FIG. 15. To illustrate, the energy profiles 1530, 1540 can have distinct tunneling barriers and, accordingly, tunable interactions can be implemented in a two-dot geometry having no intermediate quantum dot DX.

"Tunneling" refers to a process whereby quasiparticle at one quantum dot can interact with or move to another quantum dot. Often, tunneling involves penetration through a potential barrier exceeding the energy of the quasiparticle, but the term can be extended to situations where the potential barrier is completely removed and the particle can travel freely to a region of lower potential energy.

A "tunneling barrier" can be a function used to quantify tunneling for a given quasiparticle between respective states at initial and final locations, and can depend on exemplary factors such as a height of a potential barrier between the initial and final locations, a separation distance between the initial and final locations, or an energy difference between the quasiparticle states at the initial and final locations. Particularly, a tunneling barrier can be decreased by decreasing the height of the potential barrier between the initial and final locations, or by decreasing the separation distance between the initial and final locations. Alternatively, the tunneling barrier can be varied by changing the energy of at least one of the states at the initial or final location (which can affect the energy favorability of an instant tunneling interaction or transport event). Controlling a tunneling barrier extends to complete removal of a potential barrier (in which case the tunneling barrier can be regarded as zero for any temporal duration, subject to a favorable energy profile), or to the converse process. Tunneling can alternatively be quantified in terms of a "tunneling amplitude", which is a coefficient representative of an amplitude of a waveform of a quasiparticle in a tunneling region (i.e. a region where an energy potential exceeds the quasiparticle energy), or in terms of a "tunneling probability", which can be specified as the likelihood, per unit time, of a tunneling event (e.g. transport or interaction). Particularly, a tunneling barrier above a predetermined first limit can ensure that a quasiparticle lifetime requirement is met, while a tunneling barrier below a second threshold can ensure that a required cycle time for quantum computation operations is met. When distance r between two quasiparticles is much greater than coherence length $\xi$ of the quasiparticles, tunneling amplitude $\Gamma$ can be exponentially suppressed, i.e. $\Gamma \sim \exp(-r/\xi)$.

A "van der Waals" material is a material composed of one or more levels of covalently bonded atoms having van der Waals bonds between successive levels. While some van der Waals materials have a planar arrangement of atoms in a given level, this is not a requirement, and some van der Waals materials of interest such as $MoS_2$ can have a level structure resembling a corrugated sheet. A plane of covalently bonded atoms in a van der Waals material is dubbed a "basal plane". In materials having non-planar levels, the basal plane can be a medial plane of a covalently bonded level.

A "van der Waals heterostructure" having one or more internal layers between two electrode layers, all of which incorporate van der Waals materials. In some examples, disclosed van der Waals heterostructures have three internal van der Waals layers: an active layer and two electrically insulating layers spacing the active layer from each of the electrode layers. The term "all-van der Waals heterostructure" refers to heterostructures having no non-van der Waals materials between the electrode layers. References to van der Waals heterostructures herein are understood to apply also to all-van der Waals heterostructures. A van der Waals heterostructure can have apertures or gaps in an electrode layer. An electrically functional device component (e.g. a control electrode) can be located within or above an aperture in a top electrode layer of a van der Waals heterostructure, and need not be composed of a van der Waals material. An aperture in an electrode layer of a van der Waals heterostructure can also be filled with a non-van der Waals material.

IV. First Example Device

FIG. 1 is a cross-sectional view 100 of a first example heterostructure. The illustrated heterostructure comprises a vertical stack of van der Waals layers, topped by a control electrode.

Active layer 106 can be positioned between bottom electrode layer 102 and top electrode layer 110, and separated from the electrode layers 102, 110 by bottom dielectric layer 104 and top dielectric layer 108 respectively. Top electrode layer 110 can have an aperture 170, above which a control electrode 114 can be situated. A gap between electrodes 114, 110 allows independent control of electrodes 114, 110. In some examples, electrically insulating material in the form of spacer 112 can maintain the gap between electrodes 114, 110. Layers 102, 104, 106, 108, 1110 can all be van der Waals layers as described herein. In some examples, one or both of spacer 112 and dot electrode 114 can also be van der Waals layers, so that the device illustrated in FIG. 1 is composed of van der Waals materials, however this is not a requirement.

Active layer 106 can support non-Abelian topological phases, which can be realized through application of suitable electric or magnetic fields to the active layer. A magnetic field can be developed externally, as described further herein, while electric fields can be developed through application of suitable voltages to electrodes of electrode layers 102, 110, active layer 106, and/or dot electrode 114.

In some examples, the active layer 106 can be a graphene bilayer, while in other examples the active layer 106 can be monolayer graphene, or a transition metal dichalcogenide (TMD) with good electrical conductivity or electron mobility parallel to the basal plane. The bottom or top electrode layers 102, 110 can be graphite. In some examples, electrode layers 102, 110 can be single electrodes, while in other examples, one or each of electrode layers 102, 110 can include a plurality of patterned electrodes distinct from one another. The bottom or top dielectric layers 104, 108 can be hexagonal boron nitride, which has advantageous properties of large bandgap (about 5-6 eV), low electrical conductivity, and high thermal conductivity. However, this is not a requirement, and one or both dielectric layers 104, 108 can alternatively incorporate other materials, such as a TMD with electrical insulating properties orthogonal to the basal plane.

One, some, or all of van der Waals layers 102, 104, 106, 108, 110 can be oriented with transverse basal planes, i.e.

basal planes parallel to the layers. Where two adjacent layers have transverse basal planes, the dissimilar materials can adhere to one another through van der Waals attraction, even if the lattice constants are unequal or the basal planes are rotated (within the transverse plane) relative to one another.

The illustrated heterostructure can have symmetry about centerline 174. As examples, aperture 170 and dot electrode 114 can both be circular or can both be oval when viewed from above. In other examples, aperture 170 can be circular or oval while electrode 114 can be square or rectangular. As illustrated, electrode 114 has a transverse extent beyond the perimeter of aperture 170, but this is not a requirement, and in other examples, the transverse extent of electrode 114 can be smaller in area or can lie within the transverse extent of aperture 170.

The dot electrode 114 can be metal, graphite, or a van der Waals material common with the top electrode layer 110. The spacer 112 can be boron nitride, another electrically insulating material, or a van der Waals material common with the top dielectric layer 108.

V. Example Van Der Waals Material

Figure 2:
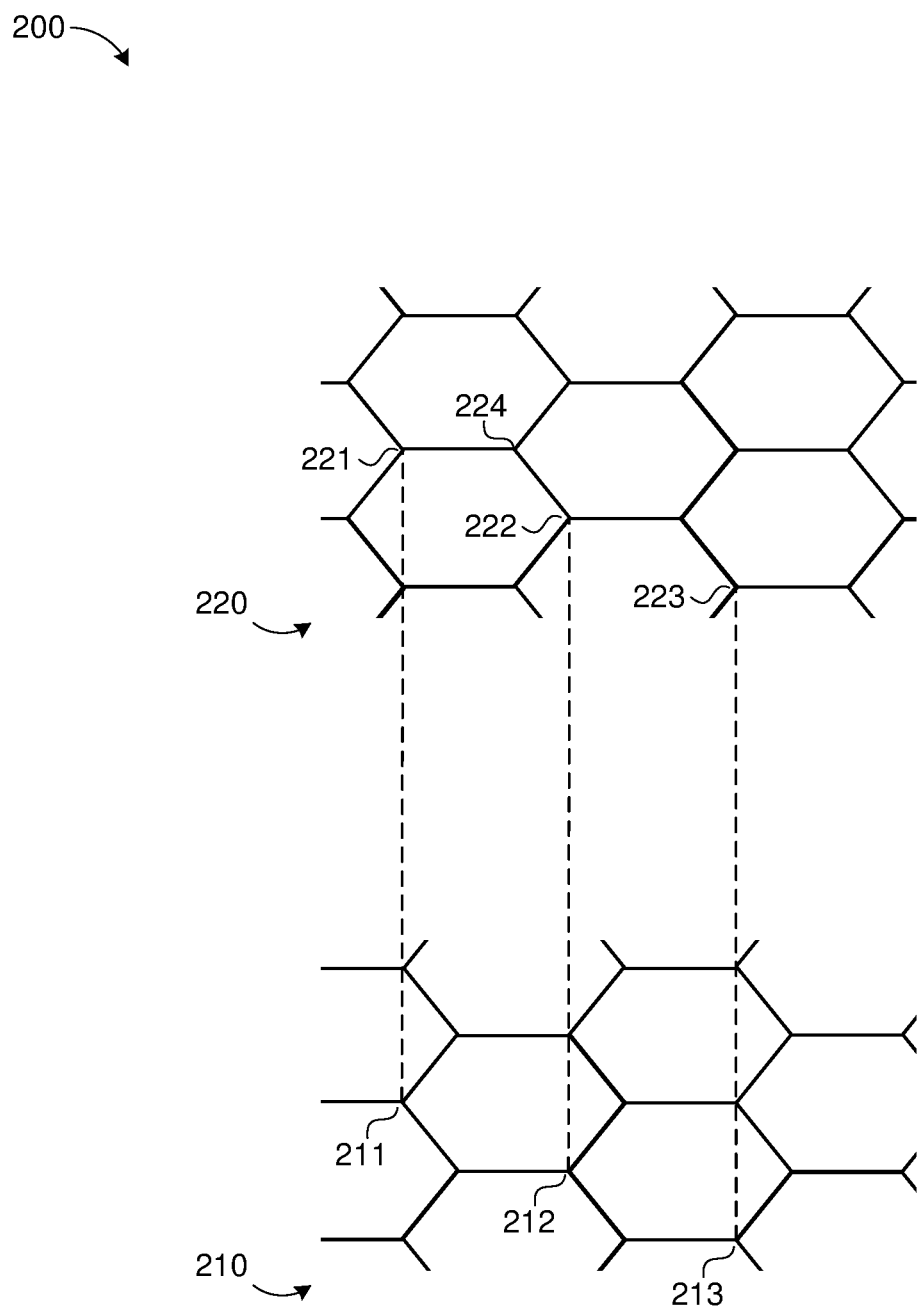
FIG. 2 is a diagram of an example van der Waals material suitable for use with the disclosed technologies.

FIG. 2 is a diagram 200 of an example van der Waals material suitable for use with the disclosed technologies. Basal plane 210 has a hexagonal structure, with atoms (not shown) at each vertex of the hexagons, and covalent bonds among neighboring atoms as shown by the edges of the hexagons. Basal plane 220 is similar, positioned directly above plane 210, that is, with atoms 221-223 directly above atoms 211-213 of plane 210, as shown by dashed lines. The vertical separation between planes 210, 220 has been exaggerated in FIG. 2 for clarity of illustration.

The configuration illustrated is Bernal stacking, where the hexagonal patterns of planes 210, 220 are offset from one another and atom 224 is positioned above the open center of a hexagon in plane 210 rather than above another atom. However, Bernal stacking is not a requirement and other stacking configurations can be used.

FIG. 2 also depicts a crystal structure in each plane 210, 220 as formed of regular planar hexagons, as found in numerous materials including graphite, graphene, or hexagonal boron nitride. However, this is not a requirement. A van der Waals material such as $MoS_2$ can have a monolayer of non-planar hexagons, with a basal plane of Mo atoms sandwiched between vertically offset planes of S atoms. Phosphorene can incorporate twisted hexagons, with P atoms in two planes vertically offset from a medial basal plane. Borophene can have a triangular structure of covalently bonded B atoms.

VI. Example Topological Quantum Computer

Figure 3:
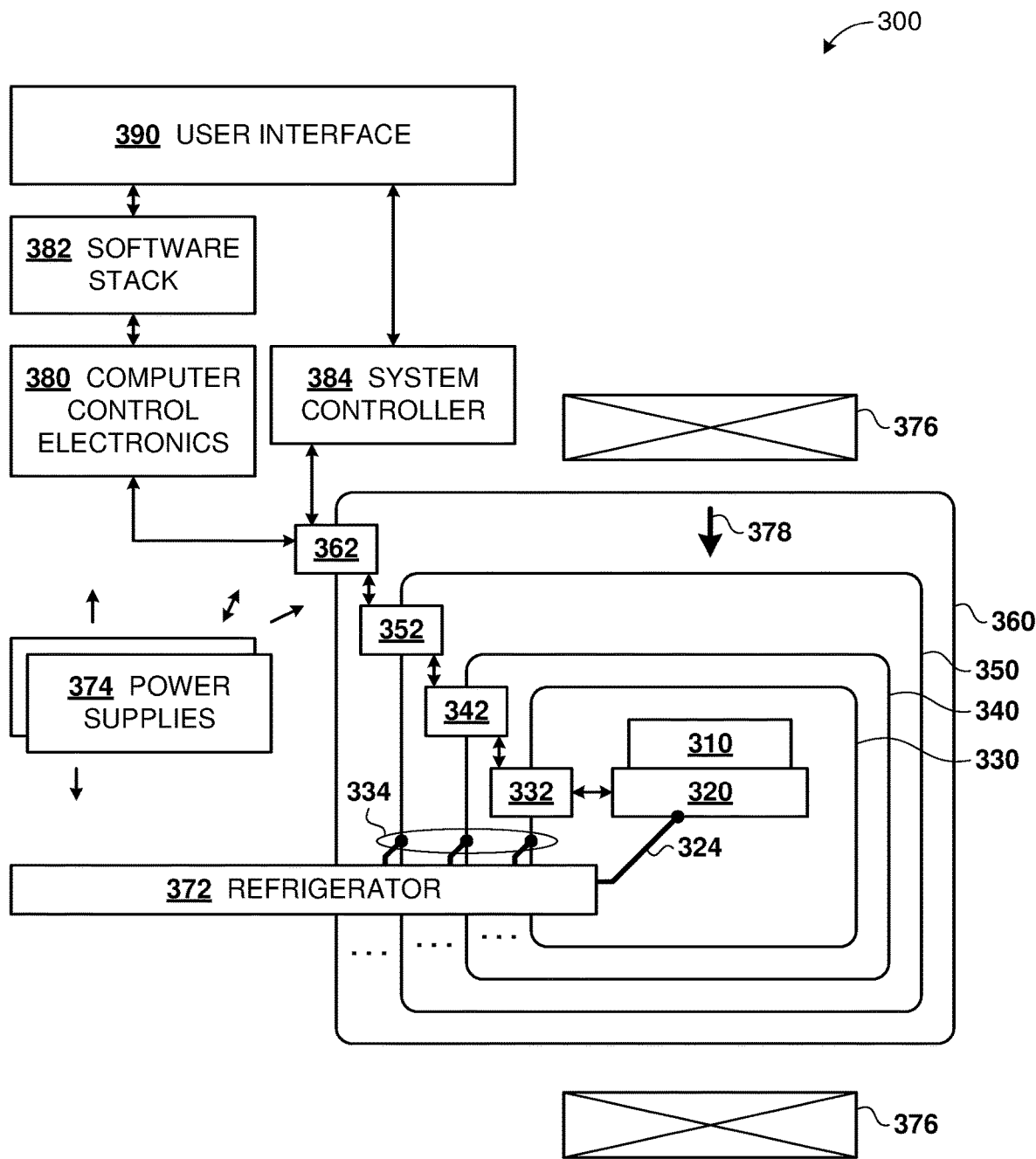
FIG. 3 is a diagram of an example topological computer according to the disclosed technologies.

FIG. 3 is a diagram of an example topological computer 300 according to the disclosed technologies. The illustrated computer 300 has a computing structure mounted within a cryogenic apparatus, along with support equipment, control equipment (including for computing operations), and a user interface.

Processor 310 can incorporate an array of heterostructures, quantum dots, or qubits as disclosed herein (such as in context of FIGS. 1, 4, 5, 7A-7B, 8A-8D, 10A-10E, 11, 17) with electrical leads through which requisite static or dynamic voltages can be applied, for initializing qubit states, performing computing operations, or reading out states. Computing structure 310 can be mounted on a carrier 320. In addition to mechanical support, carrier 320 can provide electrical connectivity between external wiring and the electrical leads of processor 310. Carrier 320 can also serve as a thermal sink to maintain processor 310 at its target temperature which can be below 1 K, or in a range 10-100 mK in some examples. For example, carrier 320 can be a cold finger.

Processor 310 and carrier 320 can be mounted within a cryostat having temperature regulated frames 330, 340, 350, 360. While four frames 330, 340, 350, 360 are illustrated, this is not a requirement, and more or fewer frames can be used, as indicated by ellipses (" . . . ") between frames 330, 340, 350, 360. An innermost frame 330 can be maintained at 1 K or below. The outer frame 360 can be a room temperature enclosure. In further examples, frames 340, 350 or other frames can be maintained at 4 K, 10-20 K, or 77 K by refrigerator 372. Thermal couplings 324, 334 provide heat extraction from carrier 320 and frames 330, 340, 350 as shown. In varying examples, one, some, or all of frames 330, 340, 350 can be partial enclosures (e.g. baffles) or full enclosures (with penetrations for refrigeration or electrical functions).

Electrical interfaces 332, 342, 352, 362 provide coupling of electrical signals into or out from carrier 320 and processor 310. Electrical interfaces 332, 342, 352, 362 can provide DC or AC electrical coupling between interior and exterior sides of frames 330, 340, 350, 360, or can provide additional functions. In some examples, an interface at an intermediate temperature (e.g. 77 K) can include an auxiliary processor or controller to provide low-level control or readout functions to or from processor 310.

Processor 310 can be immersed in a magnetic field 378 provided by external magnets 376. In some examples, magnetic fields 378 in a range 5-20 T, or 10-15 T can be used. The illustrated topological computer 300 can incorporate power supplies 374 to provide the electrical power required by subsystems of computer 300, such as refrigerator 372, magnets 376, computer control electronics 380, system controller 384, or other support or monitoring equipment not expressly shown in FIG. 3.

Computer control electronics 380 can provide the dynamic signaling to execute computing operations on processor 310, while system controller 384 can provide control of environmental conditions of processor 310 (e.g. voltages on van der Waals electrode layers and an active layer as described in context of FIG. 1). In addition to environmental control of processor 310, system controller can also control or monitor other equipment such as refrigerator 372, power supplies 374, or magnets 376 (control paths not shown). In turn, computer controller 380 and system controller 384 can be configured or monitored from a user interface 390, which can be a display or remote terminal. Computer control electronics 380 or system controller 384 can each embody some of the functions of QP subcontroller(s) 2104 of FIG. 21 discussed below.

In some examples, computer controller 380 can control dot electrodes of disclosed heterostructures to initialize non-Abelian topological phases on qubits of processor 310, to perform modification operations on one or more of the qubits, or to read fusion outputs of one or more of the qubits.

Topological computer 300 can be configured to execute a client user's computer program. The user's programming instructions can be compiled or adapted for the topological computer by a software stack 382. In some examples, a stack similar to Microsoft Azure® Quantum stack can be used.

The illustration of FIG. 3 is illustrative. Particularly, in some embodiments one or more components illustrated can be omitted, or other components can be added.

VII. Second Example Device

Figure 4:
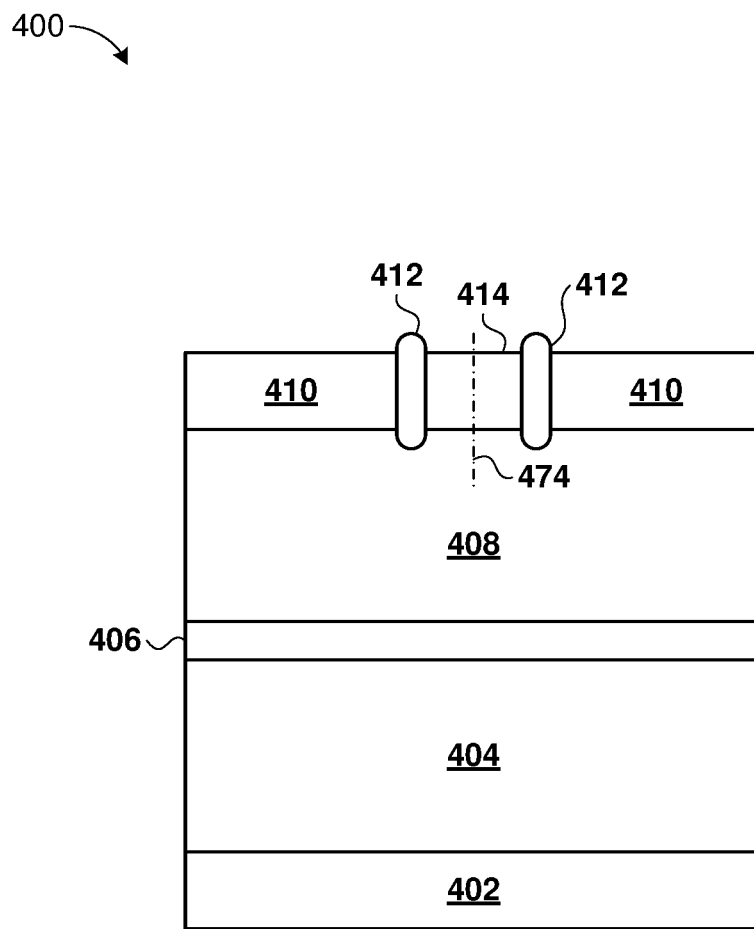
FIG. 4 is a diagram of a second example heterostructure according to the disclosed technologies.

FIG. 4 is a cross-sectional view 400 of a second example heterostructure according to the disclosed technologies. The second heterostructure is generally similar to the heterostructure of FIG. 1, with active layer 406 separated from parallel electrode layers 402, 410 by dielectric layers 404, 408. Similar considerations can be applied to each of these layers as described for the layers of FIGS. 1, 5, or elsewhere in this disclosure.

Distinguished from FIG. 1, control electrode 414 is positioned in a same plane as top electrode 410. In some examples, control electrode 414 can be formed as part of a common layer with top electrode 410, subsequently separated by an annular etch around electrode 414. The annular etch can be filled with an electrically insulating spacer 412. In other examples, spacer 412 can be formed above dielectric layer 408, prior to deposition of electrically conductive material of electrodes 410, 414. Other features of control electrode 414 and spacer 412 can follow those described for dot electrode 114 or spacer 112 herein.

Layers 402, 404, 406, 408, 410, and electrode 414 can be van der Waals materials as described herein. Spacer 412 can be a bulk material or a van der Waals material.

Similar to FIG. 1, control electrode 414 can have symmetry about centerline 474. In varying examples, the top view of control electrode 414 can be circular, elliptical, square or rectangular. The latter shapes can optionally have beveled or rounded corners.

VIII. Third Example Device

Figure 5:
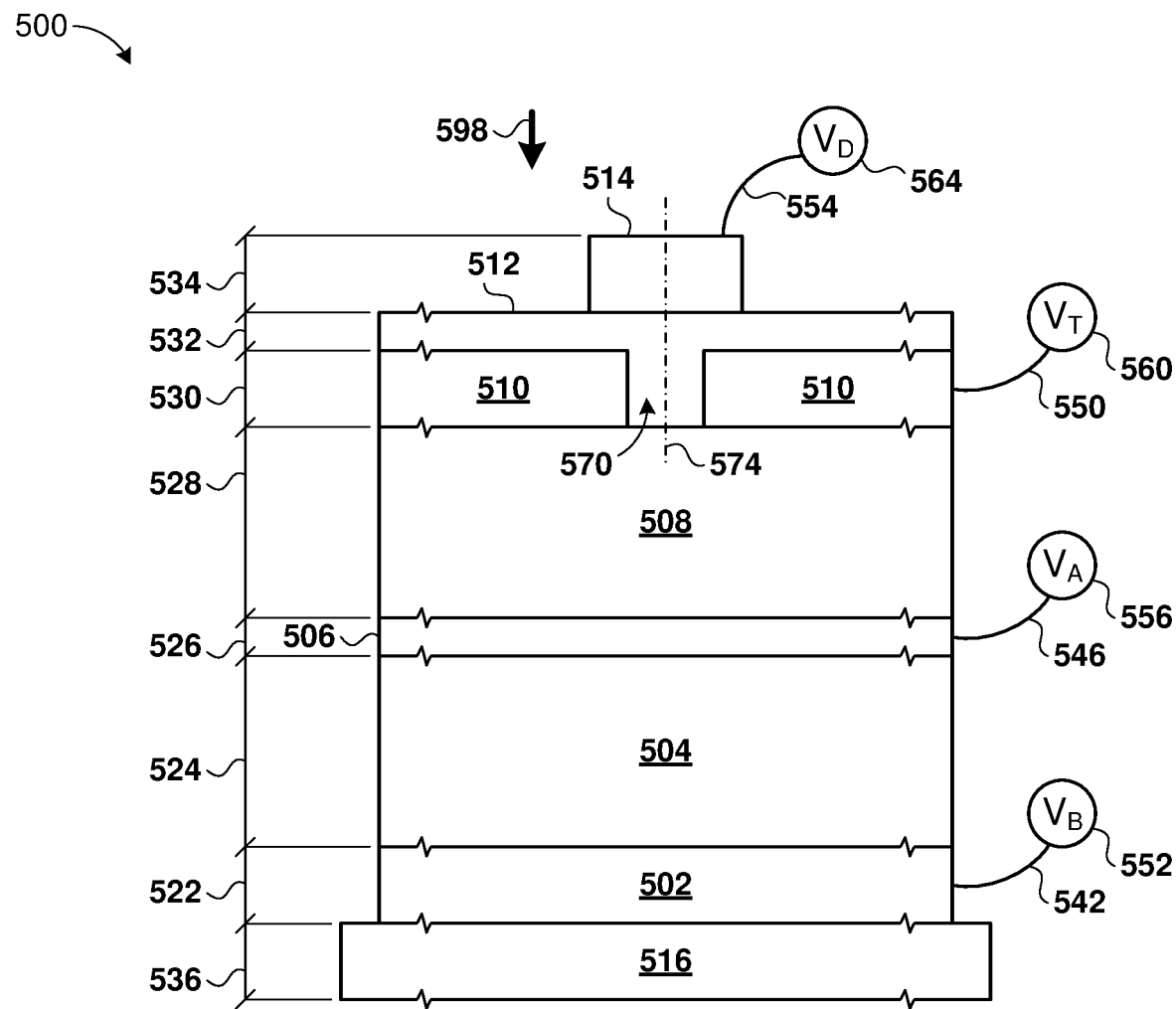
FIG. 5 is a diagram of an example quantum dot according to the disclosed technologies.

FIG. 5 is a diagram 500 of an example quantum dot according to the disclosed technologies. The illustrated quantum dot can be based on a structure similar to the heterostructures of FIG. 1 or 4. A van der Waals active layer 506 is shown separated from parallel van der Waals electrodes 502, 510 by van der Waals dielectric layers 504, 508. Dot electrode 514 is shown situated above aperture 570 in the top electrode 510, and separated from top electrode 510 by electrically insulating spacer layer 512. Active layer 506 can be a graphene bilayer or another electrically conductive van der Waals material as described herein. Dielectric layers 504, 508 can be boron nitride or another electrically insulating van der Waals material as described herein. Electrodes 502, 510 can be graphite or another electrically conductive van der Waals material as described herein. Dot electrode 514 can be metal, graphite, or another electrically conductive van der Waals material as described herein. Other considerations can be applicable to the illustrated layers, or to electrode 514, as described for corresponding items of FIGS. 1, 4, or elsewhere in this disclosure.

In examples featuring a TMD material for active layer 506, the thickness 526 of active layer 506 can be in a range 1-20 nm, or 2-10 nm. A graphene bilayer has a thickness 526 of about 0.8 nm. The thicknesses 524, 528 of dielectric layers 504, 508 can be independently selected and can be in a range 10-200 nm, 20-100 nm, or about 50 nm. The thicknesses 522, 530, 534 of electrodes 502, 510, 514 can be independently selected and can be in a range 2-100 nm, 3-30 nm, or about 10 nm. In variations where an electrode 502, 510, 514 is graphene, the corresponding electrode thickness 522, 530 can be in a range 0.3-2 nm. For example, the thicknesses of 1-4 layer graphenes are about 0.3, 0.8, 1.3, and 1.8 nm respectively. Spacer 512 can have a thickness 532 in a range 1-10 nm or 2-5 nm.

The illustrated device also incorporates electrical leads 542, 546, 550, 554 respectively coupled to electrically conducting layers 502, 506, 510, and dot electrode 514, whereby suitable voltages VB, VA, VT, VD can be applied to the illustrated device from respective external power supplies 552, 556, 560, 564 as shown. In some examples, voltages VB, VA, VT can be steady voltages selected to configure a two-dimensional electron gas in active layer 506, while voltage VD can be dynamically controlled to effect initialization of a non-Abelian quasiparticle localized at the illustrated quantum dot, modification operations with such quasiparticle, or readout of such quasiparticle, e.g. via a fusion operation. Relative to VA, voltages VB, VT, VD can be in the tens of volts, commonly in a range 2-100 V, 5-50 V, or 10-30 V. In some examples, VA can be local or system ground, i.e. 0 V.

The illustrated device has a substrate layer 516 for mechanical support of the other layers. Substrate 516 can incorporate silicon, silica (e.g. quartz), or other suitable cryogenic substrate materials. Substrate 516 can also support electrical leads 542, 546, 550, or 554, for example beyond a transverse extent of the layers 502, 506, or 510. However, substrate 516 is not a requirement and, in other examples, the layers from bottom electrode layer 502 to dot electrode 514 can be mounted in a flip-chip style below a top-side substrate (not shown), with or without the illustrated bottom-side substrate 516.

Transverse dimensions are related to process limitations (e.g. manufacturing feature size of at least about 10 nm or spacing of at least about 10 nm based on present technologies); desired proximity (for efficient tunneling) or separation (for isolation and long lifetime) between quantum dots; or desired transverse extent of a quasiparticle (larger size offering greater topological protection against e.g. thermal noise).

IX. First Example Method

Figure 6:
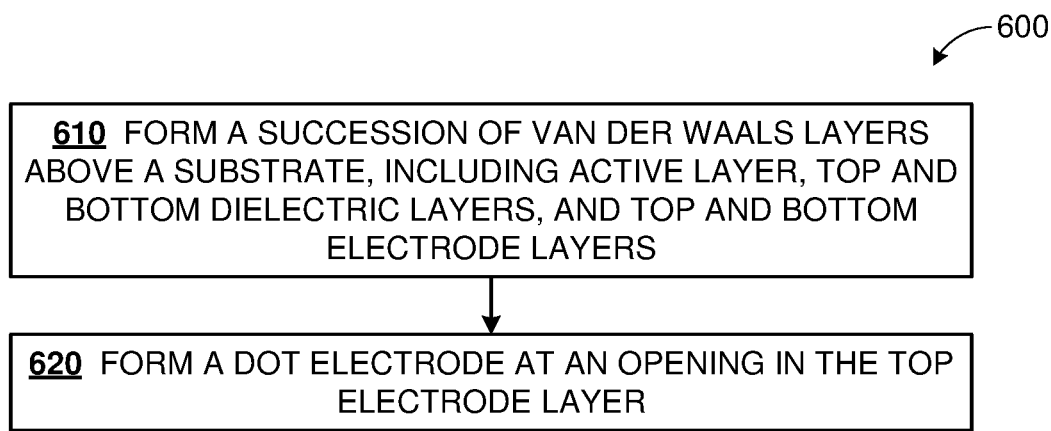
FIG. 6 is a flowchart of an example method of manufacturing a heterostructure according to the disclosed technologies.

FIG. 6 is a flowchart 600 of an example method of manufacturing a heterostructure according to the disclosed technologies. In this method, a van der Waals layer stack and a dot electrode are formed as a heterostructure similar to those described in context of FIGS. 1, 4, 5, or elsewhere herein.

At process block 610, a succession of van der Waals layers are formed above a substrate. These van der Waals layers can include a bottom electrode layer, a bottom dielectric layer, an active layer, a top dielectric layer, and a top electrode layer. The active layer can incorporate a material (e.g. bilayer graphene) that can support non-Abelian topological phases.

At process block 620, a dot electrode can be formed at an opening in the top electrode layer. In some examples, the opening can be etched in the top electrode layer and a spacer can be formed above the top electrode layer (and within the opening) prior to formation of the dot electrode.

Numerous variations and extensions can be implemented within the scope of disclosed technologies. In some examples, the van der Waals layers can be formed in order (starting with bottom electrode layer, then bottom dielectric layer, active layer, top dielectric layer, and top electrode layer, in that order) on top of a substrate. In other examples, the van der Waals layers can be assembled in the opposite order (starting with top electrode layer and ending with bottom electrode layer) on a temporary substrate, and then transferred onto a permanent substrate below the bottom electrode. In further examples, a subset of layers (e.g. a dielectric layer and an active layer) can be pre-assembled and transferred as a group atop other layers (e.g. the bottom electrode layer or the bottom dielectric layer). Other sequences of forming operations can also be used.

Numerous techniques are available for formation or assembly of the van der Waals layer stack. In some examples, layers can be laminated one above the other. For example, a given layer can be exfoliated onto an adhesive stamp and transferred onto a partially assembled heterostructure (or, onto the substrate). Van der Waals attraction between planes of a van der Waals material (weaker than covalent bonding within a plane) permits clean separation of exfoliated layers. Van der Waals attraction between dissimilar materials results in high quality bonded interfaces between the layers, which can be free of impurities or imperfections. The lamination process can use a dry transfer processes, e.g. using mechanical peel-off of a polydimethylsiloxane (PDMS) transfer sheet. In other examples, the lamination process can employ a wet transfer process, e.g. using a transfer sheet coated with a water-soluble polymer and water as a separation agent, or a water-insoluble polymer with acetone or another organic solvent as a separation agent.

Other fabrication techniques can also be used, such as chemical vapor deposition (CVD), atomic layer deposition (ALD), or epitaxial growth. Fabrication techniques can be combined. For example, the van der Waals layer stack can be assembled using a successive lamination process, a spacer above the top electrode layer can be formed by vapor deposition, and the dot electrode can be formed by a lithographic process, or by a combination of coating and etching. In examples having a non-metallic dot electrode, the dot electrode can be formed by epitaxially growing, laminating, or depositing the non-metallic material. A layer of the non-metallic material can be etched to delineate a perimeter of the dot electrode.

Lithographic processes for conventional microelectronics are generally applicable to disclosed devices. Particularly, the same equipment can be used. Similar to conventional microelectronics, process recipes can be tailored to the particular device being fabricated. Bond wires or edge connectors can be used to extend electrical connectivity off the device from on-device leads or electrodes.

The fabricated heterostructure can be a quantum dot, or can have features described herein, e.g. in context of FIGS. 1, 4, 5, or elsewhere herein. The method of FIG. 6 can be extended to formation of a second dot electrode above a second opening in the top electrode layer, and formation of a third dot electrode above a third opening in the top electrode layer. The third dot electrode can be situated between the initial dot electrode formed at block 620 and the second dot electrode, resulting in a quantum dot array. The quantum dot array can have features as described herein, e.g. in context of FIGS. 7, 8, or elsewhere herein.

1. Manufacture of an Array of Individually Controllable Quantum Dots

An array of controllable quantum dots in an all-vdW graphene heterostructure can be constructed in the following manner First, a vdW double-gated device (e.g. similar to device 100 of FIG. 1) can be fabricated consisting of the following layers: a graphite bottom gate (102), a boron nitride (BN) spacer (104) of thickness d≈50 nm, Bernal stacked bilayer (106) graphene (dubbed BLG; this layer hosts an FQH state), a second BN spacer (108, also having thickness about d), and a graphite top gate (110) in which an array of holes (170) has been pre-etched. These holes can define the locations of the quantum dots in the BLG layer.

A thin layer of BN (112, having thickness d') can then be deposited over the top gate. In some examples, individual metallic gates (114, dot gates) can then be fabricated over each hole by conventional electron beam lithography and standard deposition techniques. In other examples, an additional layer of graphite can be processed subtractively to form the dot gates (114).

Each dot gate can be used to create a local electrostatic potential well in the BLG layer whose depth can be controlled in-situ via the applied voltage. While the metal contact of a particular dot gate can extend across the device, its effect in the BLG layer is screened by the top gate, except in the region below the hole etched out of the top gate. Thus, the electrostatic influence of the dot gate in the FQH state can be restricted to the region defined by the etched hole of an instant quantum dot.

The two different approaches to dot gate manufacture have respective advantages. With fabrication of a device with d'<<d is more straightforward with the metal dot gate approach, graphite dot gates offer other advantages. With d'<<d, the screening environment for the BLG will be identical in the bulk material between dots and at the transverse position of a dot. Thus, when the dot gate voltage VD equals the top gate voltage VT, the electrostatic field at the dot will be unperturbed and electron-electron interactions in the BLG will be transversely uniform across the transverse area of the dot and its surrounding region. This ensures that the dot can be brought to an OFF state in which the uniform FQH state exists (without a localized quasiparticle excitation) across the transverse position of the dot and its immediate vicinity. Using BN as the spacer, d' can be made as thin as 2-5 nm.

In some examples, FQH states are exhibited in devices having d>10 nm (and up to about 50 nm, 100 nm, or 200 nm). Thus, transverse extent R on the order of several tens of nanometers can be achieved, which is on the order of the achievable correlation length of a localized quasiparticle.

X. Example Quantum Dot Array

FIG. 7A-7B are views 701, 702 of an example quantum dot array according to the disclosed technologies. FIG. 7A shows a cross-section of a three dot array, while FIG. 7B shows a plan view of the same structure.

Starting with FIG. 7A, apertures 774, 776, 778 and respective dot electrodes 714, 716, 718 define respective positions of first quantum dot 734, second quantum dot 738, and intermediate quantum dot 736. The dotted outlines for quantum dots 734, 736, 738 are approximate: the transverse extents of dots 734, 736, 738 can variously depend on layer thicknesses, applied voltages, aperture dimensions, or dot electrode dimensions.

Each dot 734, 736, 738 can be independently configurable and can support a given type of non-Abelian anyon under respective electromagnetic field environments. In some examples, the electromagnetic environment of dots 734, 736, 738 can be characterized by a vertically oriented magnetic field, a voltage applied to respective control electrodes 714, 716, 718, and voltages applied to other electrode layers as described herein.

Particularly, electrode 716 can switch the intermediate quantum dot 736 between an OFF state, in which a given type of non-Abelian anyon has a tunneling barrier between dots 714, 718 that is above a first limit. The first limit can be established based on a required lifetime. As an illustration, a voltage VD applied to electrode 716 can match the voltage VT applied to top electrode 710 and can provide a lifetime of $10^7$ seconds for the given type of non-Abelian anyon on dot 731, meaning that for a first limit of $10^{-7}$ per second, a voltage VD≤VT (assuming negatively charged carriers in the active layer, a more negative voltage can increase a barrier for the anyon) can suffice to maintain intermediate dot 736 in the OFF state.

Further, in a second case, with first and intermediate quantum dots 734, 736 in their respective electromagnetic field environments (which can support the given type of non-Abelian anyon), a tunneling barrier between the first and intermediate quantum dots 734, 736 can be below a second threshold. The second threshold can be established based on a required operating speed, such as a 1 ns cycle time for a computing operation.

Numerous variations and extensions can be implemented within the scope of disclosed technologies. Each dot 734, 736, 738 can have a layer stack with successive layers being a bottom electrode layer 702, a bottom dielectric layer 704, active layer 706, a top dielectric layer 708, and a top electrode layer 710 as illustrated. Electrical insulation between top electrode layer 710 and dot electrodes 714, 716, 718 can be provided by spacer layer 712. One, some, or all of these layers can incorporate a van der Waals material, however this is not a requirement. In other aspects, features of the quantum dot structures can be similar to those described for corresponding items of FIGS. 1, 4, 5, or elsewhere herein. Dots 734, 736, 738 can share a common active layer 706, or can share an entire layer stack 702, 704, 706, 708, 710 as illustrated.

Turning to FIG. 7B, the plan view 702 shows dot electrodes 714, 716, 718 within the transverse extent 703 of the illustrated device. Hidden outlines of apertures 774, 776, 778 are also shown. As shown, the first and second dot electrodes 714, 718 are circular, while the intermediate dot electrode 716 has an elongated shape. The elongated shape of electrode 716 can provide increased separation between first and second quantum dots 734, 738, to obtain better isolation between quantum dots 734, 738 when the intermediate quantum dot 736 is in its OFF state, as compared to closer spacing between dots 734, 738 with a smaller intermediate quantum dot 736 or no intermediate quantum dot at all. That is, it can be desirable to have a small spacing 746 for fast compute operations subject to the second threshold, and it can be desirable to have a large spacing 748 for better isolation subject to the first limit. While not a requirement, an elongated intermediate quantum dot 736 enables both constraints to be conveniently satisfied. In some examples, the transverse extent of apertures 774, 778 (which can define the extent of dot electrodes 714, 718 not shielded by top electrode 710) can be in a range 10 to 30 nm. The minor transverse extent of aperture 776 can be in a range 10 to 30 nm, while the major transverse extent of aperture 776 can be in a range 30 to 100 nm. An aspect ratio of apertures 774, 778 can be in a range 1:1 (i.e. circular) to 1.2:1, while an aspect ratio of aperture 776 can be in a range of 1:1 to 2:1 or 1.5:1 to 10:1.

Figure 9:
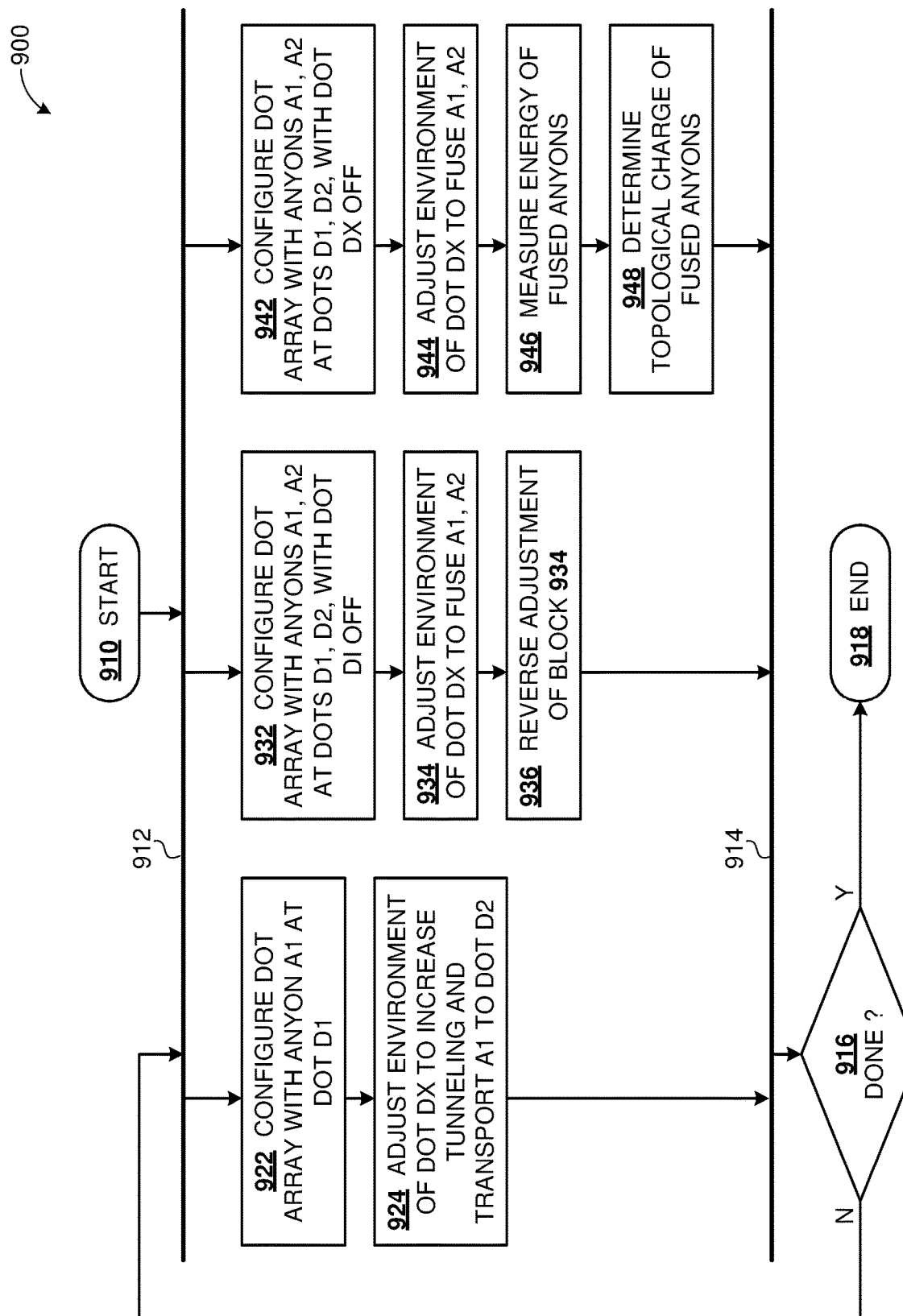
FIG. 9 is a flowchart of an example method of operating a quantum dot array according to the disclosed technologies.
Figure 10A:
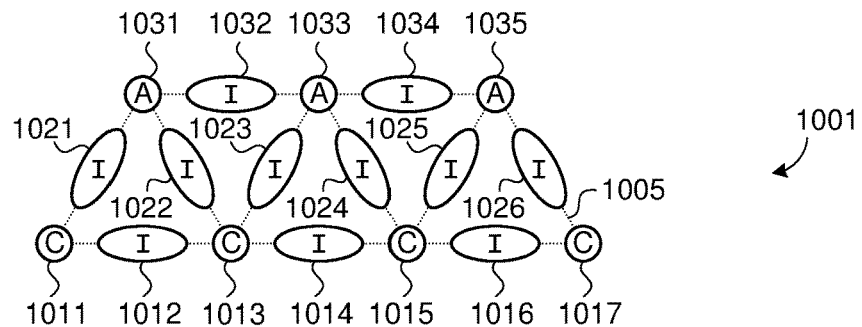
FIGS. 10A-10E are views of an example qubit computing device according to the disclosed technology.
Figure 10B:
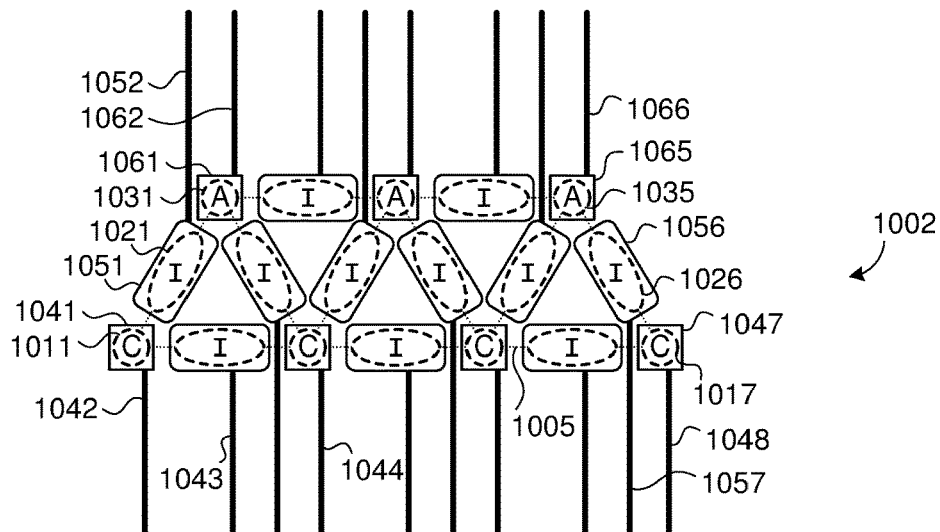
Figure 10C:
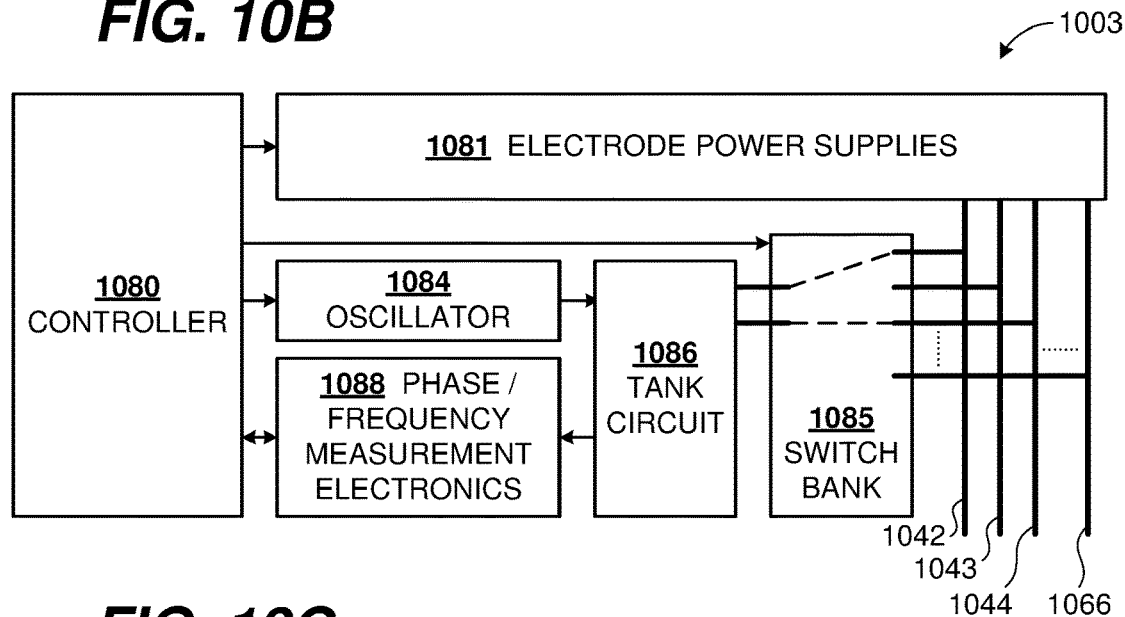

Also shown in FIG. 7B are electrical leads 784, 786, 788 which serve to apply control voltages to dot electrodes 714, 716, 718 respectively, or to measure capacitance between any pair of these electrodes 714, 716, 718, as further described in context of FIGS. 5, 9, 10C, or elsewhere herein. Some illustrative energy profiles that can be employed are described herein in context of FIG. 15.

As an alternative, single elongated intermediate 736 can be replaced by a chain of smaller intermediate quantum dots in some examples, for increased flexibility of control. An illustrative energy profile is described below in context of FIG. 16.

A three-dot array can support different operational approaches. In some examples, such as described in context of FIG. 15, an intermediate dot DX can be used to control tunneling amplitudes between two neighboring computational dots D1, D2. In other examples, the intermediate dot can be used as a temporary storage location. With reference to FIG. 15, a quasiparticle on dot D1 can be transported to dot DX. Dots DX, D2 being proximate, a practical rate of tunneling can be achieved between dots DX, D2. Finally, any remaining quasiparticle on dot DX can be transported back to dot D1, and dots D1, D2 can revert to isolation from each other.

XI. Additional Examples of Quantum Dot Arrays

FIGS. 8A-8D are diagrams 801-804 illustrating example variations and groupings of the quantum dot array of FIG. 7. Computational quantum dots can be used to maintain non-Abelian anyons between computing operations and are labeled with a "C", while intermediate quantum dots labeled "I" can be used to control interaction between computational quantum dots, or for transient storage of non-Abelian anyons.

Figure 8A:
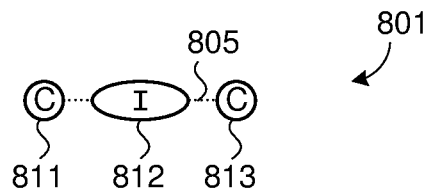
FIGS. 8A-8D are diagrams of example extensions and groupings of the quantum dot array of FIGS. 7A-7B.

Initially, FIG. 8A illustrates a basic three-dot configuration with intermediate dot 812 between computational dots 811, 813. This configuration can be similar to the dot configuration illustrated in FIGS. 7A, 7B. Dotted line 805 illustrates possible tunneling couplings between neighboring quantum dots, according to the dot control voltages and other parameters of the dots' electromagnetic environments.

Figure 8B:
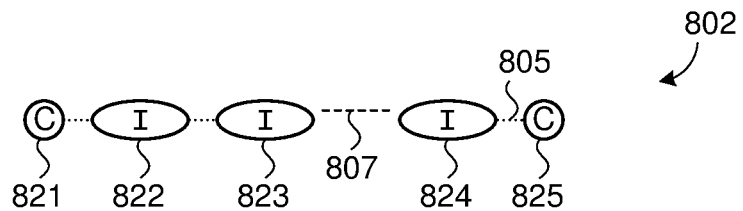

FIG. 8B depicts a configuration having multiple intermediate dots 822-824 between computational dots 821, 825. Dashed line 807 indicates that the chain of intermediate dots can be arbitrarily extended subject to space constraints. Dots 821, 822 are near each other, and additional dots 823 to 824 can be arranged to form a linear sequence of dots from dot 822 to dot 825.

Figure 8C:
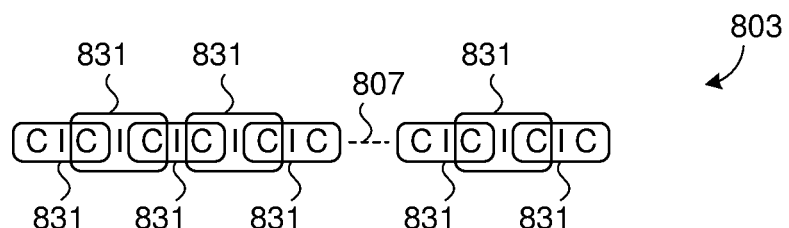

FIG. 8C depicts a sequence of 3-dot arrays 831 (shown as "C I C" for their constituent quantum dots). The second quantum dot (similar to 813) of a given array 831 is the first quantum dot (similar to 811) of an immediately following array 831, with exceptions at the ends of the sequence. Dashed line 807 indicates that the chain of 3-dot arrays 831 can be arbitrarily extended subject so space constraints. In examples, the illustrated sequence of quantum dot arrays can be a quasilinear array with at least 20, 50, 100, 200, 500, 1000, or 2000 computational dots. Practical computer designs can have maximum array lengths of 1000, 2000, 5000, 10,000, 20,000, 50,000, or 100,000 computational dots.

Figure 8D:
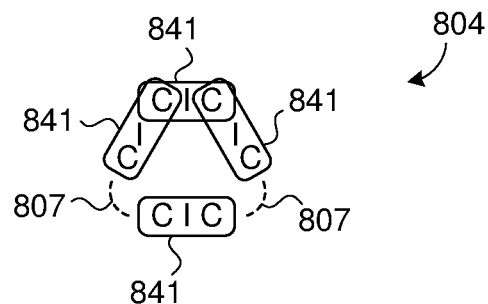

FIG. 8D depicts a loop of 3-dot arrays 841 (shown as "C I C" for their constituent quantum dots). The second quantum dot (similar to 813) of a given array 841 is the first quantum dot (similar to 811) of an adjacent array 841. Dashed lines 807 indicates that the loop of 3-dot arrays 841 can be arbitrarily extended to form a loop of any size, subject so space constraints.

XII. Second Example Method

FIG. 9 is a flowchart 900 of an example method of operating a quantum dot array according to the disclosed technologies. The method is described in context of FIG. 7A, where dots 734, 736, 738 have respectively been labeled D1, DX, D2 for convenience of illustration. D1, D2 can be regarded as computational quantum dots and DX can be regarded as an intermediate quantum dot.

The method begins at start block 910, which can be responsive to execution of a computer program on a topological computer incorporating the instant quantum dot array. The method forks at fork point 912, performs some operations as described further below, and the forked branches join at join point 914. After joining, the method continues to decision block 916 where a determination is made whether an instant sequence of computing operations has been completed. If the sequence of operations is complete, the method follows the Y branch from block 916 to end block 918, where the method terminates. However, if the sequence of operations is not complete, the method follows the N branch from block 916 to fork point 912, to continue with subsequent operations.

Beginning with the left branch of operations at block 922, the quantum dot array can be configured with a first non-Abelian anyon A1 localized at D1 and dot DX in the OFF state. At block 924, the electromagnetic environment of dot DX can be adjusted (e.g. by modifying the voltage of its dot electrode) to decrease the tunneling barrier between D1 and DX below a threshold to cause transport of A1 from D1 to D2. The adjustment of DX can also decrease a tunneling barrier between dots DX and D2. In some examples, the adjustment of DX can result in a monotonic energy profile over the transverse extent of dot DX, so that dot DX is free of a potential well that can localize anyon A1 at dot DX.

Turning to the middle branch of operations at block 932, the quantum dot array can be configured with non-Abelian anyons A1, A2 respectively localized at dots D1, D2 and dot DX in the OFF state. At block 934, the electromagnetic environment of dot DX can be adjusted (e.g. by modifying the voltage of its dot electrode) to cause fusion of anyons A1, A2. The fusion can follow one among a set of possible fusion rules. Then, at block 936, the adjustment of block 934 can be reversed. The adjustment and reversal of blocks 934 and 936 can be performed in an adiabatic manner (although this is not a requirement), resulting in restoration of anyons A1, A2 localized at dots D1, D2 respectively, albeit with changed relative phase due to their temporary interaction.

Continuing to the right branch of operations at block 942, the quantum dot array can be configured with non-Abelian anyons A1, A2 respectively localized at dots D1, D2 and dot DX in the OFF state. At block 944, the electromagnetic environment of dot DX can be adjusted (e.g. by adjusting the voltage of its dot electrode) to cause fusion of anyons A1, A2. The fusion can follow one among a set of possible fusion rules. As the anyons fuse, an electrical measurement can be performed at block 946 to determine the energy of the fused anyons. Based on this measurement, the topological charge of the fused anyons can be determined at block 948.

In some examples, the electrical measurement can be a capacitance measurement between the interacting dots, e.g. dots D1, D2. With reference to FIG. 7B, the electrical leads 784, 788 can be configured to be coupled across one or more circuit components of a resonant circuit (e.g. a microwave resonant circuit or a combination of an inductance and a capacitance) so that the capacitance between 784, 788 can make a small perturbation to the circuit resonance condition, which can manifest as a small change in frequency or phase of a driven oscillation on the resonant circuit. The timing of this phase or frequency perturbation as the voltage on dot electrode 716 (for dot DX) is changed can reveal the energy of the selected fusion rule, and thus (a) which fusion rule was selected and correspondingly (b) the topological charge of the fusion product of anyons A1, A2 can be determined. Exemplary apparatus for performing such electrical measurements is described in context of FIG. 10C herein. In some examples, the dispersive phase shift of a microwave resonator can be expressed as $\Delta\theta \approx -2Q \cdot \Delta C/C$, where $\Delta C$ is the change in the capacitance C between two quantum dots due to tunneling, and Q is the quality factor of the resonator.

Numerous variations and extensions can be implemented within the scope of disclosed technologies. In some examples, the adjustment of DX environment at blocks 924, 934, 936, or 944 can be accompanied by adjusting the electromagnetic field environment of dots D1 or D2. To illustrate, if it is desired to transport anyon A1 from D1 to D2 at block 924, and the existing environments have equal energy levels at D1, D2, then a boost to control voltage of D2 or a lowering of control voltage of D1 can place the energy level at D2 below the energy level at D1, facilitating complete transfer of anyon A1 from D1 to D2 when tunneling is enabled at block 924. Some illustrative energy profiles that can be employed are described herein in context of FIG. 15.

In some scenarios, quick readout of a single fusion channel is desirable, and dispersive readout of capacitance, as described above, can be suitable. For example, under some representative conditions, a 1 μs measurement can provide over 0.999 measurement fidelity. In other scenarios, gate reflectometry can be used to measure the charge state of a quantum system by measuring the capacitance of a gate (dot electrode). Gate reflectometry can be implemented without source or drain leads, and can be suitable for large quantum computing devices, especially fabricated as 2-D arrays of qubits, where it can be desirable to limit the total number of leads.

Other possible measurement techniques include electrometers based on single electron transistors or point contact charge sensors to detect induced charge resulting from a fusion operation. In further examples, magnetic coupling of microwaves can be used, whereby an inductance shift between a pair of quasiparticles can be measured. Still further, photon assisted tunneling spectroscopy can be utilized to map energy states in quantum dots supporting multiple quasiparticles.

XIII. Example Qubit Structures

FIGS. 10A-10E are views 1001-1005 of an example quantum computing device using qubits according to the disclosed technology. The views show a basic qubit layout, coupled electrical leads, support electronics, and multiple qubit structures suitable for a topological quantum computer according to the disclosed technologies.

FIG. 10A is a top view of an exemplary qubit layout, showing an alternating sequence of computational ("C") and intermediate ("I") quantum dots 1011-1017, with dotted lines 1005 indicating tunneling possibilities between neighboring quantum dots. Additionally, the illustrated qubit has a second alternating sequence of ancillary ("A") and intermediate ("I") qubits 1031-1035 parallel to the first sequence 1011-1017. Ancillary dots 1031, 1033, 1035 can be similar to computational dots 1011, 1013, 1015, 1017 in structure and can likewise support computational operations similar to those described in context of FIG. 9 or elsewhere herein, however the qubit state can depend only on the states of anyons in the computational dots 1011, 1013, 1015, 1017. The ancillary dots 1031, 1033, 1035 can store ancillary anyons which can be utilized to perform braiding transformations on a given pair or triplet of computational anyons in computational dots 1011, 1013, 1015, 1017. Intermediate dots 1032, 1034 can be used to initialize anyons in the ancillary dots 1031, 1033, 1035, to facilitate interactions or fusion operations between ancillary dots 1031, 1033, 1035, or to facilitate long-range interactions between non-neighboring pairs of computational quantum dots such as (1011, 1015) or (1011, 1017). Additionally, the qubit layout of FIG. 10A includes intermediate dots 1021-1026, each of which (e.g. 1021) can act as a gate between a computational quantum dot (e.g. 1011) one side and an ancillary quantum dot (e.g. 1031) on the other side of the intermediate quantum dot. The quantum dots of FIG. 10A can support non-Abelian topological phases. Accordingly non-Abelian quasiparticles can be localized at respective ones of the illustrated quantum dots. As described in context of FIG. 7B, all intermediate dots of FIG. 10A in an OFF state can isolate their adjacent computational or ancillary quantum dots to maintain a high tunneling barrier and at least a predetermined anyon lifetime. Conversely, when their dot electrodes are suitably activated, the intermediate dots of FIG. 10A can enable tunneling by decreasing a tunneling barrier sufficiently to enable computation operations, involving the adjacent ancillary or computational dots, within a predetermined cycle time. Because dots 1032, 1034 are not required for transport-based braiding (as described in context of FIG. 14D), in some examples dots 1032, 1034 can be omitted.

In some examples, the quantum dots of the illustrated qubit can be formed as a van der Waals heterostructure. Because of the relatively high energy gap of an all-van der Waals heterostructure, and because of the inherent stability of topological quasiparticles in such a geometry, the illustrated qubit can be robust against both noise and decoherence. Accordingly, a quantum computer based on such qubits can dispense with additional qubits for error correction, and the number of logical qubits can be equal to the number of physical qubits.

The layout of FIG. 10A is merely illustrative. In other examples, other layouts or quantum dot organizations can be used. For example, four computational quantum dots to implement a qubit can be convenient, but this is not a requirement. In other examples, three, five, six, seven, or eight computational quantum dots can be used. Layouts similar to that illustrated can be extended to the right or left, or truncated, so that the base row of quantum dots has the desired number C of computational dots (C=4 in the illustrated in FIG. 10A). Correspondingly, the parallel row of ancillary quantum dots can be extended or shrunk to maintain a number A of ancillary quantum dots with A=C−1 (A=3 as illustrated). However, this is not a requirement. To illustrate, in some qubit layouts a single ancillary dot (e.g. 1031) can be shared among three or more computational dots (e.g. 1011, 1013, 1015) so that fewer than A=C−1 ancillary dots are required. As qubits with different numbers of computational or ancillary dots are implemented, the count I of intermediate dots can vary also. In some examples similar to the illustrated qubit, I=4C−5. Additional intermediate dots can also be included, e.g. to facilitate interactions between computational dots of the illustrated qubit and the computational dots of a neighboring qubit. The illustrated qubit structure is exemplary. Various qubit organizations and layouts can be used. In some examples, the number of computational quantum dots C in a qubit can be 3, 4, or in a range 5-8. Quantum dots of adjustable size or shape can be used, such as described in context of FIG. 17.

Turning to FIG. 10B, a metallization layer is shown superposed on the qubit layout of FIG. 10A. (Because the metallization layer can be above the dot electrodes, the dot electrodes are hidden and represented with dashed outlines in FIG. 10B.) For example, round computational dot 1011 can have a square metal cap 1041 through which dot 1011 is coupled to electrical lead 1042. Similarly dots 1021, 1031 have respective caps 1051, 1061 and are coupled to electrical leads 1052, 1062 respectively. In like manner, dots 1017, 1026, 1035 have metal caps 1047, 1056, 1065 and are coupled to electrical leads 1048, 1057, 1066 as shown. The remaining dots, unlabeled in FIG. 10B, can also be coupled to electrical leads through respective metal caps as shown. As shown, all electrode leads for dot electrodes of the illustrated qubit can be conveniently extricated from the array of quantum dots 1011-1017, 1021-1026, 1031-1035 on one side or another FIG. 10C is a diagram illustrating support equipment which can be coupled to an instant qubit via the electrical leads of FIG. 10B. Representative leads 1042-1044, 1066 can be driven by electrode power supplies 1081, which in turn are controlled by controller 1080. Additionally, FIG. 10C illustrates exemplary measurement electronics. In the illustration, controller 1080 can control oscillator 1084 to drive a resonant tank circuit 1086. The phase or frequency of the tank circuit oscillations can be measured by phase or frequency measurement electronics 1088. Controller 1080 can control the measurement electronics 1088 and can monitor phase or frequency measurements made by the measurement electronics 1088. Additionally, controller 1080 can control switch bank 1085 to select a pair of electrical leads (and their associated dot electrodes) for measurement. As illustrated, leads 1042, 1044 are selected for measurement and are coupled to the tank circuit 1086. In this configuration, changes to the capacitance between computational dot electrodes 1011, 1013 can be measured as phase or frequency changes in the tank circuit 1086. Functions of controller 1080 can be included in e.g. controllers 380, 384 of FIG. 3 or QP subcontroller 2104 of FIG. 21.

Figure 10D:
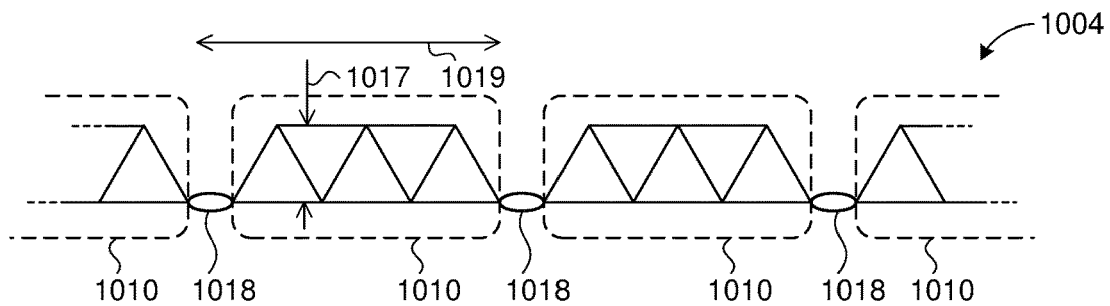

FIG. 10D shows organization of multiple qubits 1010 (in dashed outline) to form a multi-qubit computing device. The lead layout of FIG. 10B is scalable, and the chain of qubits 1010 can be extended indefinitely, subject to space limitations, to construct quantum computers with upwards of 50, 100, 200, 500, 1000, 2,000, 5,000, 10,000 or even more. For example, a representative qubit could have a length 1019 of about 600-700 nm. 10,000 such qubits stacked end-to-end can have a total length of 6-7 mm, which is a practical size for a computing device. A corresponding width 1017 of the qubit can be about 175-225 nm. Example topological computers can have up to 1000, 2,000, 5,000, 10,000 or even more qubits in a quasilinear chain. Qubit 1010 has a height of one qubit or 3 quantum dots, and a length of 1 qubit or 7 quantum dots. Thus, a quasilinear chain of 50 qubits similar to FIG. 10D of length 50 to 10,000 qubits can have aspect ratio (in qubits) of 50:1 to 10,000:1. Other examples can have aspect ratio as low as 2:1, 4:1, 10:1, 20:1, or 100:1; or can have aspect ratios as high as 1,000:1, 2,000:1, 5,000:1, 20,000:1, 50,000:1, 100,000:1, 200,000:1, 500,000:1 or 1,000,000:1. With manufacturing advances (e.g. roll-to-roll continuous processing) upper limits to aspect ratios can extend as high as $10^7$:1, $10^8$:1, $10^9$:1.

Figure 10E:
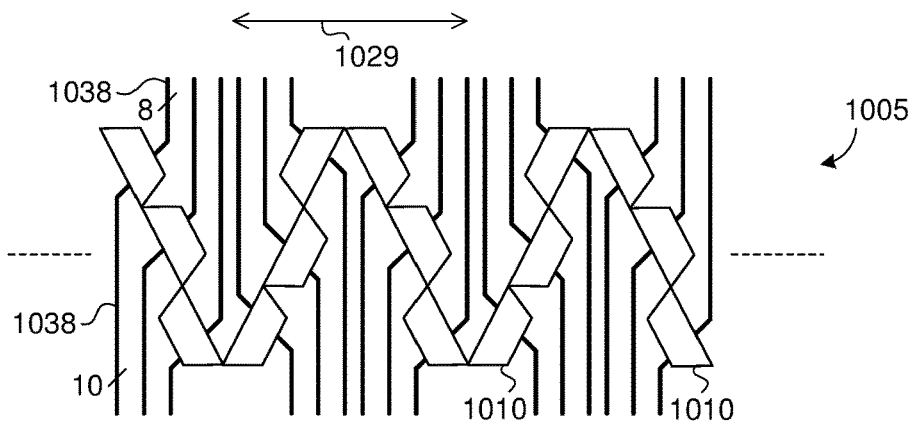

FIG. 10E shows an alternate qubit arrangement to FIG. 10D, featuring a folded chain of qubits 1010. Similar to FIGS. 10B, 10D, the electrical leads 1038 can be brought out conveniently on one side or another of the qubit chain. For clarity of illustration, the electrical leads from each qubit 1010 are grouped as indicated by representative markings "/8" and "/10". Neighboring qubits 1010 of FIG. 10E can be joined by intermediate quantum dots similar to 1018 of FIG.

10D. These dots and their associated electrical leads have been omitted from FIG. 10 for clarity of illustration. Through folding, the number of qubits that can be fitted in a length 1029 can be doubled as shown, from about 3 qubits to about 6 qubits. Through more complex folding, following e.g. a Koch snowflake pattern, the qubit density can be further increased, subject to a limit on how closely electrically leads can be packed in a particular manufacturing technology.

Figure 11:
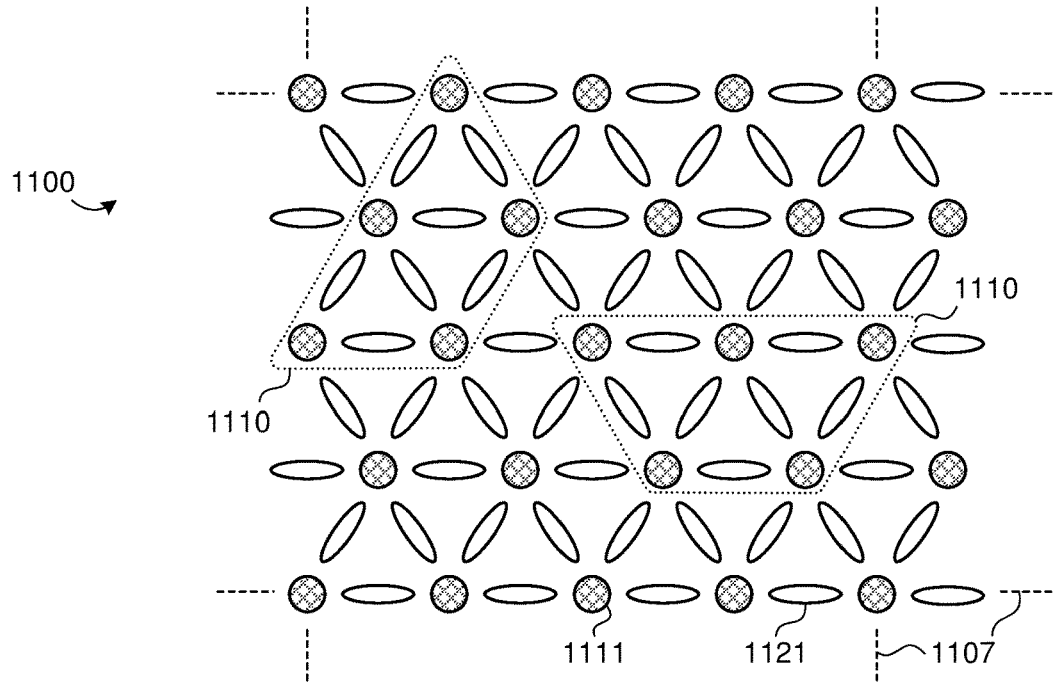
FIG. 11 is a diagram of an example two-dimensional sea 1100 of quantum dots according to the disclosed technologies.

Although some examples of the disclosed technologies can employ quasilinear arrays, this is not a requirement. FIG. 11 shows a two-dimensional sea 1100 of quantum dots which can be organized into arbitrary configurations of qubits. As illustrated, primary quantum dots 1111 can be coupled among each other by intermediate quantum dots 1121 in a hexagonal lattice. The primary quantum dots can be computational or ancillary quantum dots in various combinations. The sea of quantum dots 1100 can be extended in some or all directions as indicated by dashed lines 1107. Groups of the quantum dots can be organized as qubits. Dotted outlines 1110 indicate some of numerous possibilities for qubit organization, following the qubit pattern of FIG. 10A.

Numerous variations of FIG. 11 can be implemented. A sea of quantum dots can omit intermediate dots 1111, or can use expandable quantum dots in the manner of FIG. 17 below. In some examples, a rectangular or square pattern of quantum dots can be deployed similar to inset 1730 of FIG. 17 below. In further examples, a sea of quantum dots can feature internal zones free of quantum dots to facilitate out-of-plane extraction of electrical leads. In other examples, off-plane connections can be made separately at each quantum dot or in a group at each qubit. Off-plane connections can be implemented using 3-D chip stacking.

XIV. Third Example Methods

Figure 12A:
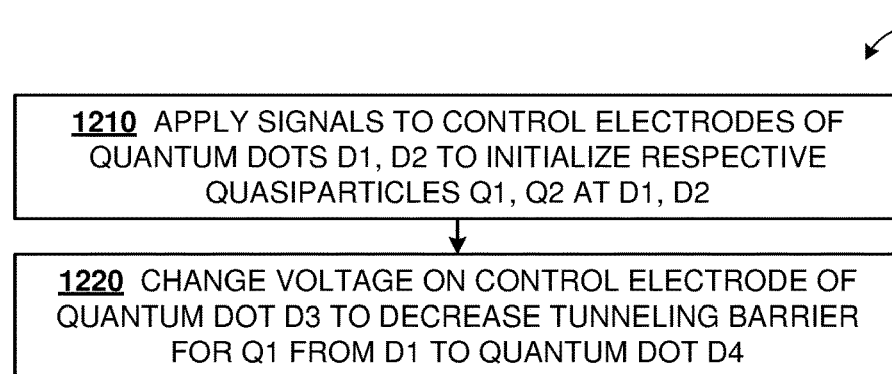
FIG. 12A-12D are flowcharts of example methods of operating a qubit according to the disclosed technologies.

FIG. 12A-12D are flowcharts 1201-1204 of example methods of operating a qubit according to the disclosed technologies. These methods can be applied to a qubit such as that of FIG. 10A or a qubit based on a van der Waals heterostructure such as FIG. 1. FIG. 12A describes a basic method, and FIGS. 12B-12D describe extensions or variations of this method.

1. Initialization and Transport

Referring to FIG. 12A, at block 1210 signals can be applied to control electrodes of quantum dots D1, D2 of a qubit, to initialize quasiparticles Q1, Q2 localized at dots D1, D2 respectively. Quasiparticles Q1, Q2 can be non-Abelian topological quasiparticles. The qubit can incorporate an all-van der Waals heterostructure. In some instances, quasiparticles Q1, Q2 can be created as antiparticles from a vacuum state by setting voltages on the control electrodes of dots D1, D2 to induce tunneling or render splitting of the vacuum into quasiparticle Q1 (on dot D1) and its antiparticle quasiparticle Q2 (on dot D2) energetically favorable, which can result in the creation of quasiparticles Q1, Q2. In other examples, the quasiparticles Q1, Q2 can be initialized from one or more quasiparticles pre-existing on dots D1, D2, or other quantum dots of the qubit.

Then, at block 1220, the voltage on a control electrode of quantum dot D3 can be changed to decrease a tunneling barrier from dot D1 to dot D4, which can cause quasiparticle Q1 to be transported from dot D1 to dot D4.

The method of FIG. 12A can support various embodiments. In one example, with reference to FIG. 10A, dots D1, D2 can be dots 1011, 1013 respectively, while dots D3, D4 can be dots 1021, 1031 respectively. The changed voltage can lead to a monotonic energy profile along the extent of dot 1021, so that quasiparticle does not get trapped at the intermediate dot 1021. In another example, dots D3, D4 can both refer to intermediate dot 1021, and the changed voltage at block 1220 can result in a potential well at dot D3 which can localize quasiparticle Q1 at dot D3. In a further example, the method of FIG. 12A can also be applied to a qubit lacking intermediate dots. Such a qubit can comprise just the seven computational and ancillary quantum dots of FIG. 10A. In the further example, D1, D2 can be dots 1011, 1013; D4 can be dot 1031; and process block 1220 can change voltages at both dots 1011, 1031 (so that dot D3 can be either of dots 1011, 1031). Examples of controlled energy profiles are described further in context of FIG. 15 herein.

2. Fusion and Tunable Interaction

Figure 12B:
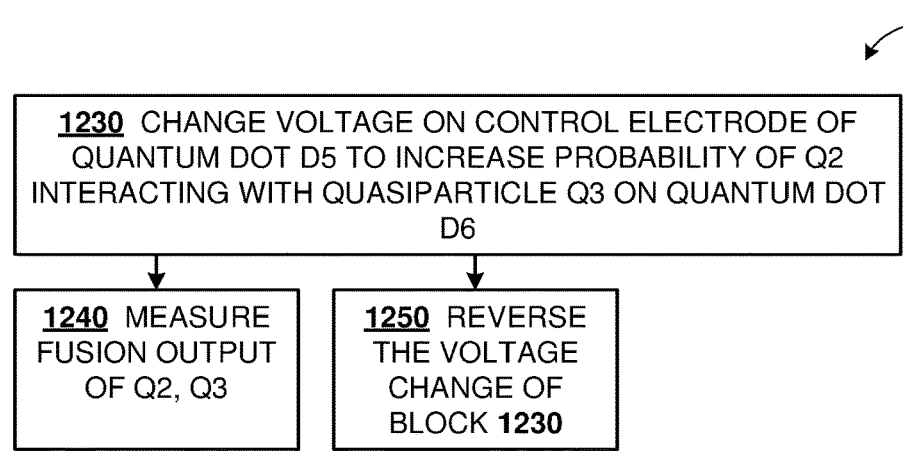

Turning to FIG. 12B, at block 1230, a voltage can be changed at a control electrode of a quantum dot D5 to increase a probability of quasiparticle Q2 (on D2) interacting with a quasiparticle Q3 on dot D6. In varying examples, and with reference to FIG. 10A, dots D2, D6 can be dots 1013, 1031, dot D5 can be dot 1022 or dot 1013. Similar operations can be applied to a modified qubit having e.g. dots 1011, 1013, 1015, 1017, 1031, 1033, 1035 but no intermediate dots.

Depending on the desired computer operation, in some examples the method can perform block 1240 where a fusion output of quasiparticles Q2, Q3 is measured. Block 1240 can be performed concurrently with the voltage change of block 1230, and can be performed as described in context of FIG. 10C, or elsewhere in this disclosure.

In other examples, the method can perform block 1250 after block 1230. At block 1250, the voltage change of block 1230 can be reversed. The voltage change of block 1230 and the reversal of block 1240 can be performed adiabatically, to result in restoration of quasiparticles Q2, Q3 to their original localized sites at dots D2, D6 respectively, albeit with a change in relative phase as compared to their condition before block 1230 was performed. Thus, the combination of blocks 1230, 1250 results in a tunable interaction between quasiparticles Q2, Q3 on dots D2, D6 without changing their localized positions.

In additional examples, quasiparticle fusion (qf) can be performed using an operational sequence similar to Table 1 below.

TABLE 1

Quasiparticle Fusion

| No. | Operation |
|---|---|
| qf1 | Start from an initial configuration that localizes one quasiparticle on dot D1 and one quasiparticle on dot D2. |
| qf2 | Tune the dots in an adiabatic manner, changing the localizing potentials of dots D1 and D2 from the initial configuration toward an intermediate configuration, using an intermediate dot D3 if needed, to turn on interactions between the dots D1 and D2. |
| qf3 | End the adiabatic tuning in the intermediate configuration that localizes one quasiparticle on dot D1 and no quasiparticle on dot D2. |
| qf4 | Measure the topological charge of the quasiparticle on dot D1. |
| qf5 | Tune the localization potential on dot D1 to a final configuration which has the measured topological charge value as the ground state. |

As a variation, operation qf4 can be replaced by a joint measurement of the initial quasiparticles on dots D1, D2, performed in between operations qf1, qf2.

3. Braiding

Figure 12C:
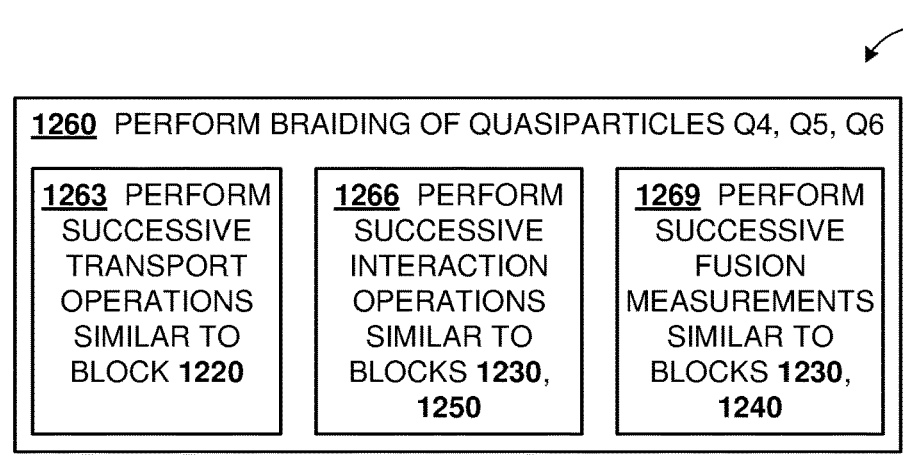

FIG. 12C describes a method for braiding three quasiparticles Q4, Q5, and Q6 present in the qubit. In an example and with reference to FIG. 10A, quasiparticles Q4, Q5, Q6 can be non-Abelian anyons present on computational quantum dots 1013, 1015, 1017. The method can be performed at block 1260 and can be performed in several different ways, three of which are illustrated at blocks 1263, 1266, 1269 respectively.

At block 1263, a succession of transport operations is performed similar to the operation of block 1220. To illustrate, quasiparticle Q4 can be transported from dot 1013 to dot 1033, quasiparticle Q5 can be transported from dot 1015 to dot 1013, and then quasiparticle Q4 can be transported from dot 1033 to dot 1015. This exchanges the positions of quasiparticles Q4, Q5 by a right-hand half-twist. A converse sequence of operations with Q5 moved to dot 1033, Q4 sliding over to dot 1015, and then Q5 to dot 1013 would have exchanged the same quasiparticles by a left-hand half-twist. Braiding transformations can be extended to a third quasiparticle Q6. For example, the Q4↔Q5 exchange can be followed by a Q4↔Q6 exchange (either right-hand or left-hand half-twist) mediated by ancillary dot 1035. These and similar half-twist transport operations can be combined in various ways to implement additional braiding transformations.

Block 1266 can implement braiding using a succession of interaction operations similar to the combination of blocks 1230, 1250, which interact two quasiparticles and then reverse any electrode voltage changes to restore the quasiparticles to their initial localized positions. To illustrate, quasiparticle Q4 on dot 1013 can be interacted with an ancillary quasiparticle QA on dot 1033, followed by an interaction of quasiparticle Q5 with an ancillary quasiparticle on dot 1035, and then an interaction between the ancillary quasiparticles on dots 1033, 1035. This trio of operations (Q4↔QA followed by Q5↔QB and then QA↔QB) can couple the quasiparticles Q4, Q5 with a particular sense which can be labeled a "right-hand" interaction. Performing the interactions in opposite order (viz. Q5↔QB followed by Q4↔QA and then QA↔QB) can couple the quasiparticles Q4, Q5 with an opposite sense which can be labeled a "left-hand" interaction. Braiding can be extended to a third quasiparticle with a similar interaction (right-hand or left-hand) between Q5 (on dot 1015) and Q6 (on dot 1017) to achieve a braiding transformation of quasiparticles Q4, Q5, Q6. As for block 1263, additional interactions can be added for more complex braiding transformations.

Lastly, block 1269 can implement braiding using a succession of fusion measurements to the combination of blocks 1230, 1240, which fuse and measure to neighboring quasiparticles. To illustrate, quasiparticle Q4 on dot 1013 can be fused with an ancillary quasiparticle QA on dot 1033 and measured, followed by a fusion and measurement between quasiparticle Q5 and an ancillary quasiparticle on dot 1035, and then a fusion operation between the fused ancillary quasiparticles on dots 1033, 1035. This trio of operations (Q4⊗QA followed by Q5⊗QB and then QA⊗QB) can couple the quasiparticles Q4, Q5 with a particular sense which can be labeled a "right-hand" coupling. Performing the interactions in opposite order (viz. Q5⊗QB followed by Q4⊗QA and then QA⊗QB) can couple the quasiparticles Q4, Q5 with an opposite sense which can be labeled a "left-hand" coupling. Braiding can be extended to a third quasiparticle with a similar coupling (right-hand or left-hand) between Q5 (on dot 1015) and Q6 (on dot 1017) to effect a braiding transformation of quasiparticles Q4, Q5, Q6. As for blocks 1263, 1266, additional fusion measurements can be added to implement more complex braiding transformations.

4. Splitting

Figure 12D:
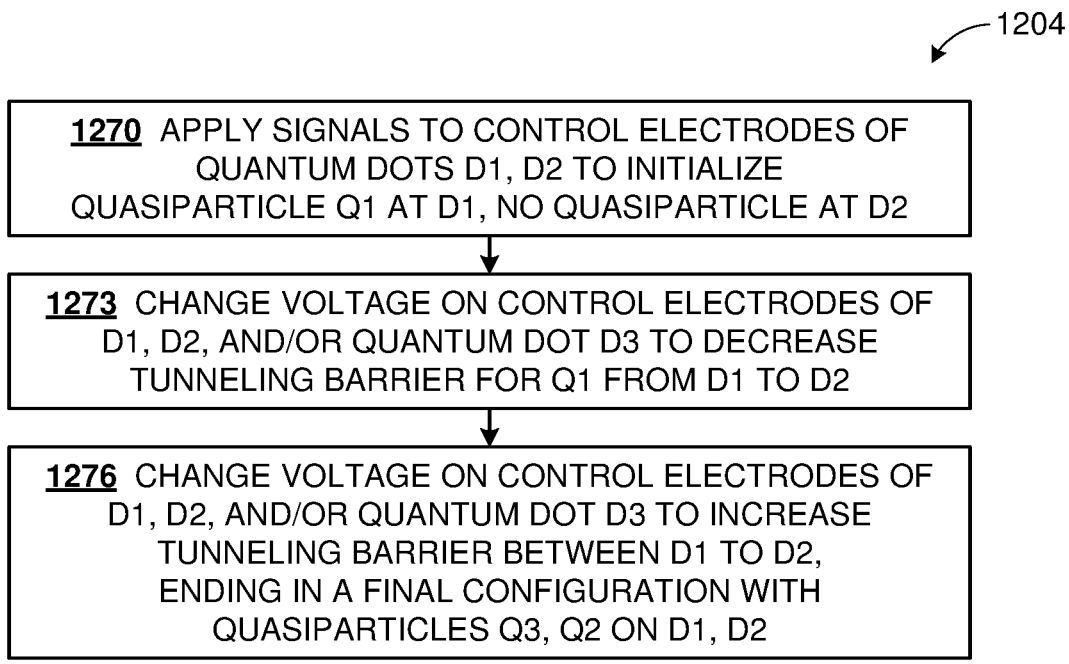

Continuing to FIG. 12D, a method is described for splitting a single quasiparticle into a pair of quasiparticles. Initially, at block 1270, signals can be applied to control electrode of quantum dot D1 to initialize a quasiparticle Q1 at dot D1. Meanwhile a proximate quantum dot D2 can be configured with no localized quasiparticle at dot D2. As initially configured, dot D2 can optionally have a pinning potential, or can have a common potential with an adjacent top electrode. In varying examples, quasiparticle Q1 can be generated from the vacuum state, or from one or more other pre-existing quasiparticles, as described herein. In varying examples, dots D1, D2 can be adjacent or can be separated by one or more intermediate quantum dots D3 through which tunneling between D1, D2 can be controlled.

Then, at block 1273, voltage on one or more of quantum dots D1, D2, or any intermediate quantum dots D3 can be controlled as described herein to decrease a tunneling barrier between D1, D2. Particularly the joint system can thereby couple to configurations having distinct quasiparticles on dots D1, D2, subject to the fusion rules of the instant qubit. Finally, at block 1276, voltage on one or more of quantum dots D1, D2, or any intermediate quantum dots D3 can be controlled as described herein to increase or restore a tunneling barrier between D1, D2. Particularly, the method can end with a final configuration for the qubit having decoupled distinct quasiparticles Q3, Q2 at dots D1, D2 respectively. With reference to FIG. 15, an exemplary splitting operation can start with a configuration similar to 1520, proceed through 1530 to 1534 (or, 1536) to couple quantum dots D1, D2, and return from 1534 (or, 1536) to 1530 with quasiparticles localized in the respective pinning potentials at D1, D2.

In additional examples, quasiparticle splitting (qs) can be performed using an operational sequence similar to Table 2 below. The splitting sequence qs1→qs3 is conceptually reverse to a portion qf1→qf3 of the fusion sequence described above.

TABLE 2

| | Quasiparticle Splitting |
|---|---|
| No. | Operation |
| qs1 | Start from an initial configuration that localizes one quasiparticle on dot D1 and no quasiparticle on dot D2. |
| qs2 | Tune the dots in an adiabatic manner, changing the localizing potentials of dots 1 and 2, while using an intermediate dot (if needed) to turn on interactions between the dots from the initial configuration toward a final configuration. |
| qs3 | End in the final configuration with one quasiparticle localized on dot D1 and another quasiparticle localized on dot D2. |

The final configuration and the initial configuration obey the fusion rules of the device. That is, if the topological charge of the initial quasiparticle is c, then the topological charges a, b of the final quasiparticles satisfy $N^c_{ab} \neq 0$. The quasiparticle of the initial configuration can be regarded as a fusion channel for the quasiparticles of the final configuration. In further examples, splitting can be performed on an initial configuration which is a superposition of states z satisfying $N^z_{ab} \neq 0$. In such examples, a measurement similar to operation qf4 can be included as part of the splitting operation sequence, to determine a single post-measurement state |a, b; c⟩, using a similar notation as for fusion operations, with a, b, c being respective topological charges of final and initial quasiparticles. Adiabaticity can be maintained for the c channel, and can be disregarded for other components z of the superposed initial configuration. While the presence of local noise can cause rapid decoherence of the initial superposition, the fusion channel measurement renders consideration as to the coherence or incoherence of the superposed states moot.

Combinations of the methods described in context of FIGS. 12A-12D can be implemented as a set of computationally universal operations, all of which are topologically protected, on a single qubit. Similar operations between quantum dots of neighboring qubits can be implemented to provide a set of computationally universal operations on a pair of qubits, all topologically protected. Although some examples of the disclosed technologies utilize fully topologically protected computation operations, this is not a requirement. In other examples a set of computation operations can include a mix of topologically protected operations and other operations. Such a configuration can be useful with $v=\frac{1}{2}$ non-Abelian fractional quantum Hall states, for example, to gain the advantage of a large bandgap as described herein. The computation operations can be performed by control electronics similar to those described in context of blocks 380 or 1080, or elsewhere herein.

XV. Example Software Architecture

Figure 13:
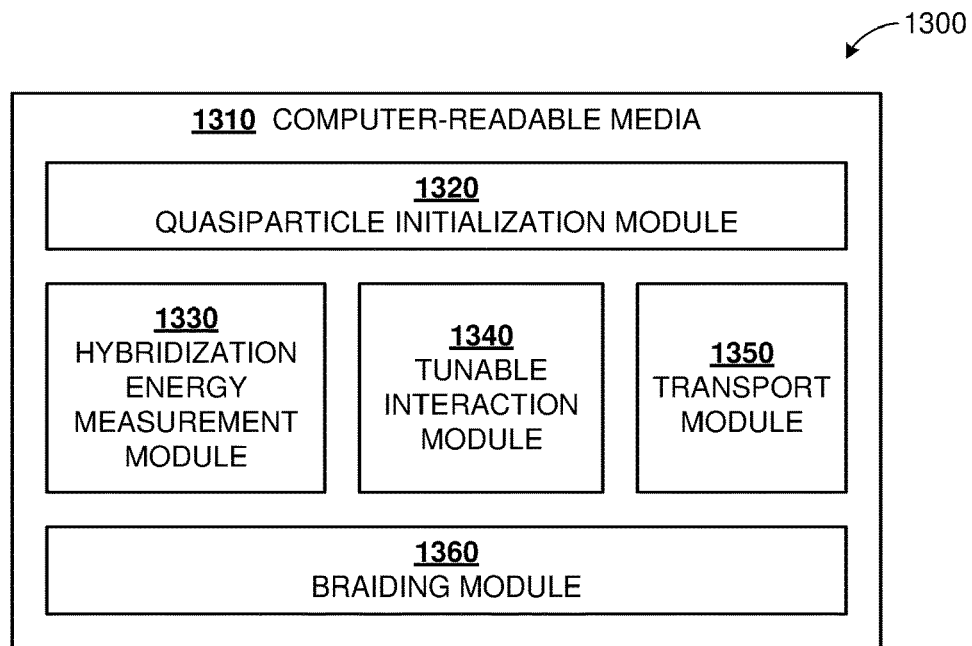
FIG. 13 is a diagram illustrating an example software architecture for the disclosed technologies.

FIG. 13 is a diagram 1300 illustrating an example software architecture for the disclosed technologies. Software for performing computing operations on disclosed devices (e.g. FIG. 1, 3, 4, 5, 7, 8, or 10) can be organized as a suite of modules and stored on computer-readable media 1310.

Software module 1320 can store instructions which, when executed by a controller similar to 1080 or 380, cause two or more non-Abelian topological quasiparticles to be initialized on two or more quantum dots of a qubit in a topological computing system. In some examples, the instructions of module 1320 can form the two quasiparticles by splitting a vacuum state in a two-dimensional electron gas, as described in context of block 1210 or elsewhere in this disclosure.

Software module 1330 can store instructions which, when executed by a controller similar to 1080 or 380, cause hybridization of quantum states of two quantum dots, and measurement of the hybridization energy. In some examples, the instructions of module 1330 can implement operations similar to those described in context of 1230 and 1240, or elsewhere in this disclosure.

Software module 1340 can store instructions which, when executed by a controller similar to 1080 or 380, cause a tunable interaction between two quasiparticles on respective quantum dots of a qubit. In some examples, the instructions of module 1330 can implement operations similar to those described in context of blocks 1230 and 1250, or elsewhere in this disclosure.

Software module 1350 can store instructions which, when executed by a controller similar to 1080 or 380, cause transport of a quasiparticle from one quantum dot to another quantum dot within a topological qubit. In some examples, the instructions of module 1350 can implement operations similar to those described in context of blocks 1220, or elsewhere in this disclosure.

Software module 1360 can store instructions which, when executed by a controller similar to 1080 or 380, cause braiding of quasiparticles on two or more quantum dots of one or more qubits. In some examples, the instructions of module 1360 can implement operations similar to those described in context of block 1260 or elsewhere in this disclosure.

Additional details of software modules 1330, 1340, 1350, 1360 are provided in context of FIG. 14.

XVI. Fourth Example Methods

Figures 14A, 14B, 14C:
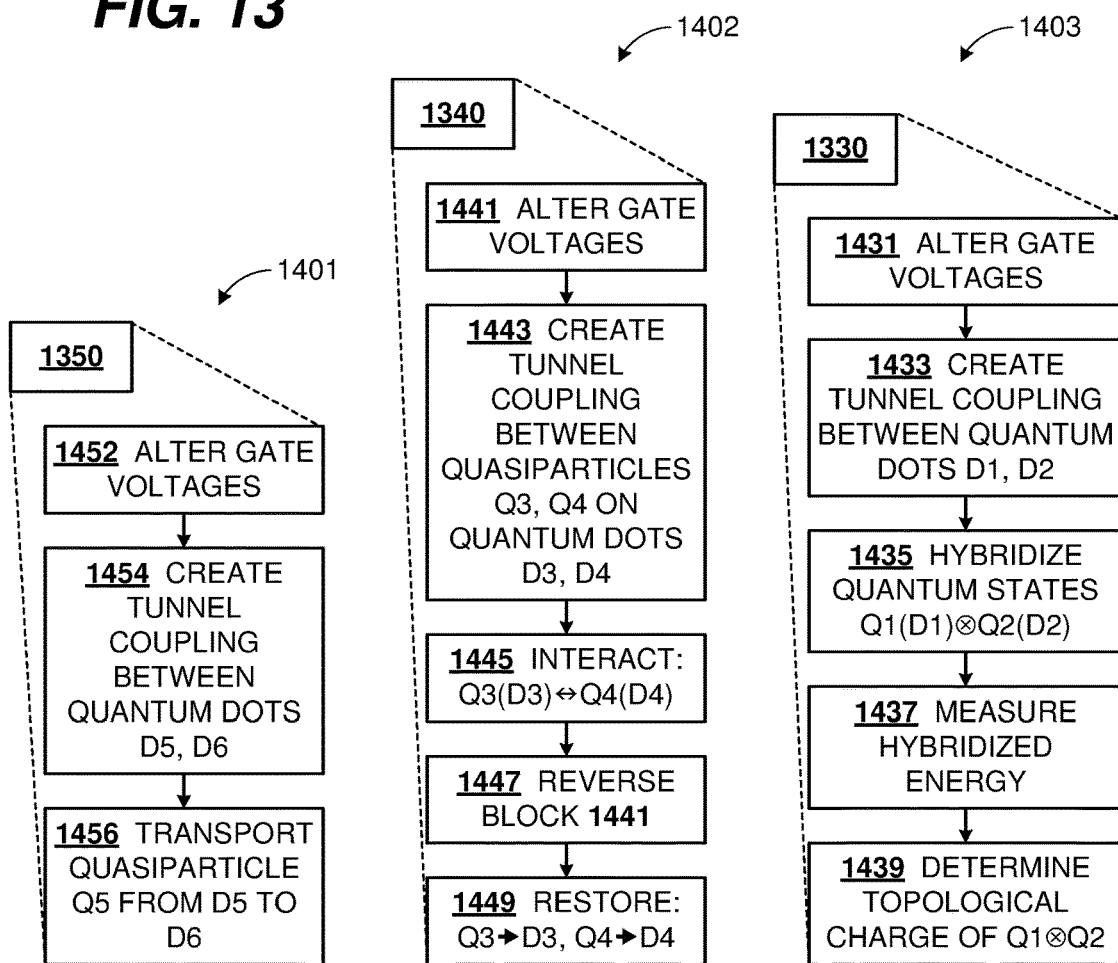
FIG. 14A-14F are flowcharts illustrating exemplary methods corresponding to the software modules of FIG. 13.
Figure 14D:
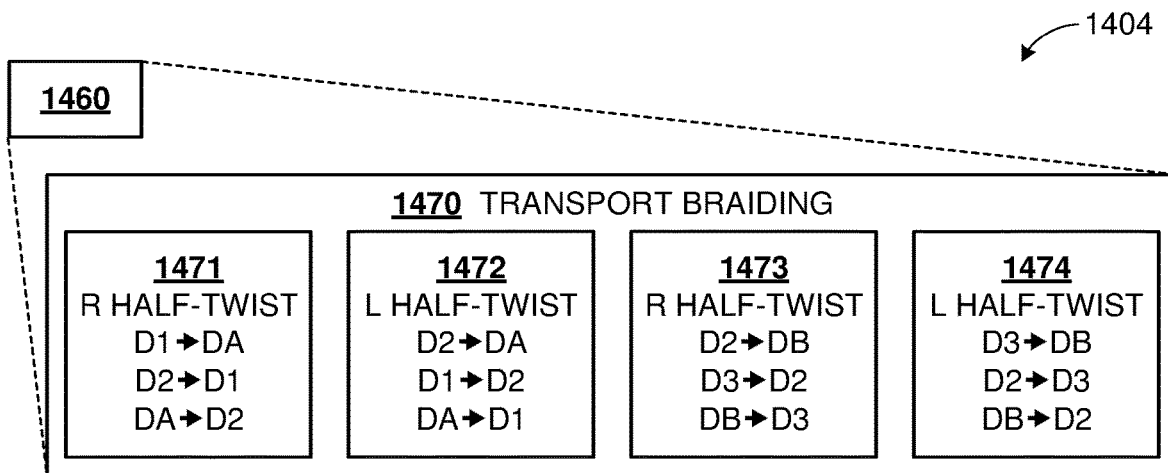
Figure 14E:
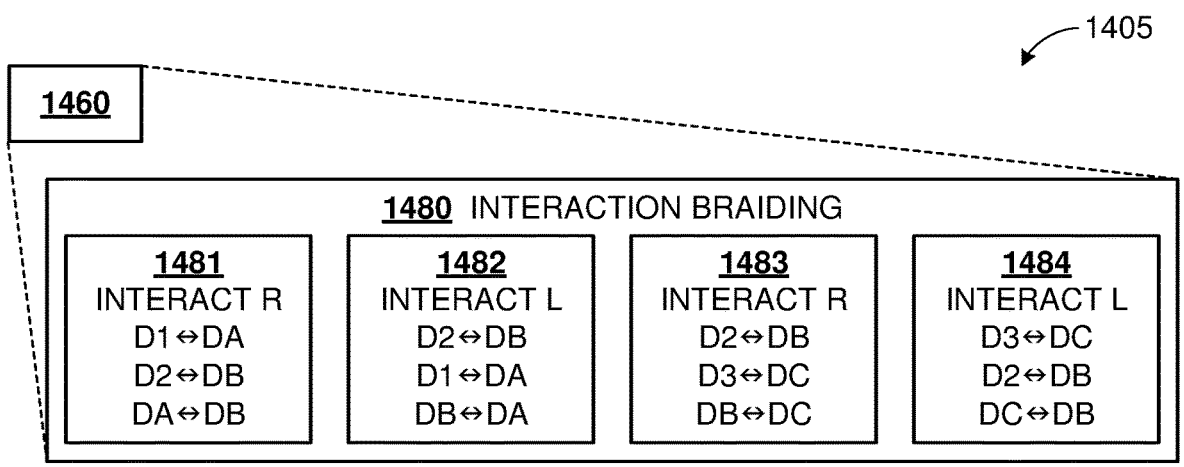
Figure 14F:
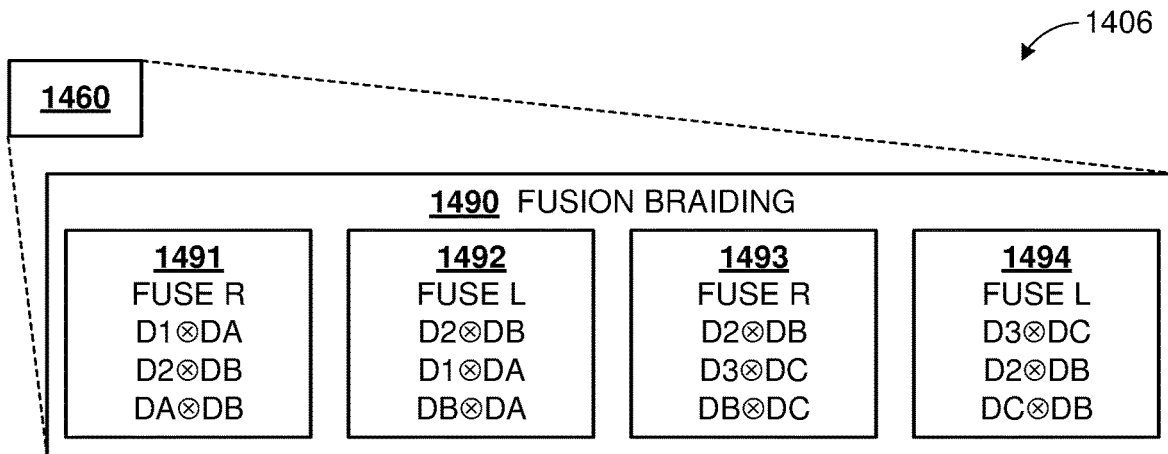

FIG. 14A-14F are a group of flowcharts 1301-1306 illustrating exemplary methods corresponding to the software modules of FIG. 13. FIGS. 14A-14C are associated with modules 1350, 1340, 1330 respectively, while FIGS. 14D-14F are associated with braiding module 1360.

FIG. 14A shows exemplary operations 1452, 1454, 1456 that can be implemented through execution of module 1350 as shown. At process block 1452, gate voltages of one or more quantum dot control gates of a qubit can be altered. Thereby, at block 1454, one or more tunnel couplings can be created between two or more of the quantum dots (e.g. including dots D5, D6) of the qubit, and at block 1456, a quasiparticle can be transported from quantum dot D5 to quantum dot D6.

FIG. 14B shows exemplary operations 1441, 1443, 1445, 1447, 1449 that can be implemented through execution of module 1340 as shown. At process block 1441, gate voltages of one or more quantum dot control gates of a qubit can be altered. Thereby, at block 1443, tunnel couplings can be created between two or more of the quantum dots of the qubit (e.g. including dots D3, D4), and at block 1445 quasiparticles Q3 (localized on dot D3) and Q4 (localized on dot D4) can interact. At block 1447, the gate voltage alteration of block 1441 can be reversed, and at block 1449, the interacting quasiparticles Q3, Q4 can revert to their original localizations at dots D3, D4 respectively.

FIG. 14C shows exemplary operations 1431, 1433, 1435, 1437, 1439 that can be implemented through execution of module 1330 as shown. At process block 1431, gate voltages of one or more quantum dot control gates of a qubit can be altered. Thereby, at block 1433, one or more tunnel couplings can be created between two or more quantum dots (e.g. including dots D1, D2) of the qubit. Quasiparticles Q1, Q2 on the dots D1, D2 can have energy levels altered due to the tunnel coupling, leading to hybridization of their quantum states at block 1435. At block 1437, the hybridized energy can be measured, and based on the measured energy, the topological charge of the hybridized quasiparticles Q1⊗Q2 can be determined at block 1439.

FIGS. 14D-14F show exemplary operations that can be performed to implement braiding through execution of module 1360, based on transport operations, interaction operations, and fusion operations respectively. FIGS. 14D-14F illustrate operations to support braiding of non-Abelian quasiparticles on computational dots D1, D2, D3, with two ancillary dots DA, DB. To illustrate with reference to FIG. 10A, computational dots D1, D2, D3 can be computational dots 1011, 1013, 1015 respectively, and ancillary dots DA, DB can be ancillary dots 1031, 1033 respectively. However, any other computational quantum dots can be braided similarly.

FIG. 14D shows braiding performed at block 1470 using a suite of transport operations in blocks 1471-1474, in a similar manner as described in context of block 1263. Block 1471 can perform a right-hand half-twist between dots D1, D2 using ancillary dot DA with the ordered operations shown. A quasiparticle on dot D1 can be transported to dot DA, then a quasiparticle on dot D2 can be transported to dot D1, and finally the quasiparticle on dot DA can be transported to dot D2 to complete the half-twist. Block 1472 illustrates a sequence of operations for a left-hand half-twist between dots D1, D2. In similar fashion, blocks 1473-1474 illustrate sequences of operations for right-hand and left-hand half-twists between computational dots D2, D3 using an ancillary dot DB. Within process block 1470, the operations of blocks 1471-1474 can be selectively performed in an order and as many times as programmed, to effect a desired simple or complex braiding transformation.

As an alternative, FIG. 14E shows braiding performed at block 1480 using a suite of interaction operations in blocks 1481-1484, in a similar manner as described in context of block 1266. Block 1481 can perform a right-hand interaction between dots D1, D2 using ancillary dots DA, DB with the ordered operations shown. A quasiparticle on dot D1 can be interacted with a quasiparticle on dot DA, then a quasiparticle on dot D2 can be interacted with a quasiparticle on dot DB, followed by interaction between the quasiparticles on dots DA, DB to complete the right-hand interaction. Block 1482 illustrates a sequence of operations for a left-hand interaction between dots D1, D2. In similar fashion, blocks 1483-1484 illustrate sequences of operations for right-hand and left-hand half-twists between computational dots D2, D3 using an ancillary dot DB. Within process block 1480, the operations of blocks 1481-1484 can be selectively performed in an order and as many times as programmed, to effect a desired simple or complex braiding transformation.

As another alternative, FIG. 14F shows braiding performed at block 1490 using a suite of fusion measurement operations in blocks 1491-1494, in a similar manner as described in context of block 1269. Block 1491 can perform a right-hand fusion measurement between dots D1, D2 using ancillary dots DA, DB with the ordered operations shown. A quasiparticle on dot D1 can be fused with a quasiparticle on dot DA, then a quasiparticle on dot D2 can be fused with the resulting quasiparticle on dot DB, followed by fusion of the quasiparticles on dots DA, DB to complete the right-hand interaction. Block 1492 illustrates a sequence of operations for a left-hand fusion between dots D1, D2. In similar fashion, blocks 1483-1484 illustrate sequences of operations for right-hand and left-hand fusion measurements between computational dots D2, D3 using an ancillary dot DB. Within process block 1490, the operations of blocks 1491-1494 can be selectively performed in an order and as many times as programmed, to effect a desired simple or complex braiding transformation.

In examples, the operations of FIGS. 14A-14F can be performed on quantum dots fabricated as van der Waals heterostructures as described in context of FIGS. 1, 5, or elsewhere in this disclosure. The quasiparticles involved in these operations can be non-Abelian anyons and can be embodied in one or more topological phases in an active layer of the van der Waals heterostructure.

XVII. Additional Example Features

1. Transverse Size of a Quasiparticle

The transverse extent R of a quasiparticle localized at a quantum dot depends on (1) the separation between the top electrode layer and the active layer, which can be the same as the thickness of the top dielectric layer, and commonly in the range of tens of nm; and (2) the extent of the dot electrode not shielded by the top electrode, which can also be in the range of tens of nm. Where (1) and (2) are comparable, the transverse extent can be comparable to and greater than the larger of (1) and (2). Where (1) and (2) are widely disparate, the larger among (1) and (2) can dominate.

2. Error Rates

The error rate of a topological quasiparticle confined at a quantum dot depends on spatial and energy factors. Commonly, the larger factor can dominate the overall error rate. In one mechanism, thermal fluctuations can result in errors, with an error rate scaling as $\exp(-\Delta/kT)$, where k is Boltzmann's constant ($1.38 \times 10^{-23}$ JK$^{-1}$), T is the operating temperature, and $\Delta$ is the bandgap of the topological phase. For a $v=\frac{1}{2}$ non-Abelian fractional quantum Hall state, a van der Waals heterostructure can have $\Delta/k$ in a range 1.0-2.0 K, 1.5-2.5 K, or 2.5-3 K, compared to about 0.5-0.6 K for comparative GaAs. At common operating temperatures of 20 mK, this translates to a thermal error rate improvement from about $10^{-13}$ to about $10^{-65}$.

For a $v=3/5$ non-Abelian fractional quantum Hall state offering topologically protected and computationally universal operations as disclosed herein, a van der Waals heterostructure can have $\Delta/k$ of about 2000 mK, compared to about 80 mK for comparative GaAs, which translates to an improvement from about 0.018 to $4 \times 10^{-5}$. Thus, $v=3/5$ can be acceptable for a van der Waals heterostructure based quantum computer, while being completely impractical for GaAs.

Comparing $v=3/5$ with $v=\frac{1}{2}$, in some examples the former can be preferred for reasons of computational universality, as outweighing the higher thermal error rate. In other examples, $v=\frac{1}{2}$ (with supporting $\pi/8$ gates for computational universality) can be preferred as enabling higher temperature operation and reduced refrigeration requirements for cooling.

Turning to spatial factors, the spatial dependence of error rate scales as $\exp(-R/\xi)$, where R is the minor transverse extent of the quasiparticle and $\xi$ is the correlation length. Van der Waals heterostructures such as graphene have very high electron mobility (orders of magnitude greater than competing materials) resulting in correlation lengths on the order of 10-25 nm, considerably better (smaller) than GaAs or other competing materials. With R on the order of 30-100 nm, acceptable spatial error rates can be achieved.

3. Non-Topologically Protected Operations

In some examples, a $v=\frac{1}{2}$ non-Abelian fractional quantum Hall state can be used with supporting non-topologically protected $\pi/8$ gates (or, T gates) to obtain computational universality, similar to that used in other quantum computing architectures. Because of lacking topological protection, such $\pi/8$ gates have susceptibility for errors, which can be compensated with support circuitry. In this way, benefits of the large $v=\frac{1}{2}$ bandgap for a van der Waals heterostructure can be obtained.

4. Energy Profiles

FIG. 15 is a diagram 1500 illustrating exemplary energy profiles for two quantum dots separated by an intermediate quantum dot, a configuration similar to that described in context of FIGS. 7A-7B. Computational (or ancillary) quantum dots D1 1512, D2 1516, and intermediate quantum dot DX 1514 are positioned above respective openings in top electrode layer 1510 as shown. Dashed lines indicate edges of the dot electrodes D1 1512, D2 1516, DX 1514 for convenience of illustration. Arrow 1505 indicates a direction of increasing energy applicable to all energy profile graphs 1520-1550, which correspond to different voltage patterns on dot electrodes D1 1512, D2 1516, DX 1514.

Graph 1520 illustrates a configuration suitable for a quasiparticle localized at D1, while graph 1530 illustrates a configuration suitable for two quasiparticles localized at D1, D2 respectively. Although graph 1530 can also support a single quasiparticle at D1, the configuration of graph 1520 can be preferred when D2 is empty, to avoid a quasiparticle becoming localized at D2 due to noise or tunneling. Dot DX is in an OFF state in both graphs 1520, 1530. As illustrated, DX is set to the same voltage VT as the top electrode, however this is not a requirement. In other examples, the voltage VDX on DX can be set lower than VT to increase the barrier between D1, D2.

Graphs 1532, 1534, 1536 depict energy profiles as the voltage VDX on dot DX is gradually relaxed to lower the tunneling barrier. In graphs 1532, 1534 a barrier between D1, D2 remains, however a potential well has developed at dot DX, which can localize a quasiparticle at dot DX. As voltage VDX is increased further, graph 1536 illustrates disappearance of any tunneling barrier between D1, D2, however the most favorable state for a quasiparticle is in the deep potential well at DX.

To avoid unwanted trapping of quasiparticles at intermediate dot DX, the voltages V1, V2 on dots D1, D2 can be unbalanced, to raise the energy at D1 and lower the energy at D2 as shown in graph 1540. Then, graphs 1542-1550 depict evolution of the energy profile as voltage VDX on intermediate dot DX is increased, to progressively lower the energy profile in the vicinity of dot DX. In graph 1542, a barrier remains between dots D1, DX, whereas in graph 1544, the barrier has disappeared, allowing free passage of a quasiparticle from D1 to D2. In both graphs 1542, 1544, the most favorable (lowest energy) position for a quasiparticle is localized at dot D2.

As voltage VDX on dot DX is increased further, graphs 1546, 1548, 1550 show progressive development of a potential well at dot DX, similar to that of graph 1538.

5. Multiple Intermediate Quantum Dots

Figure 16:
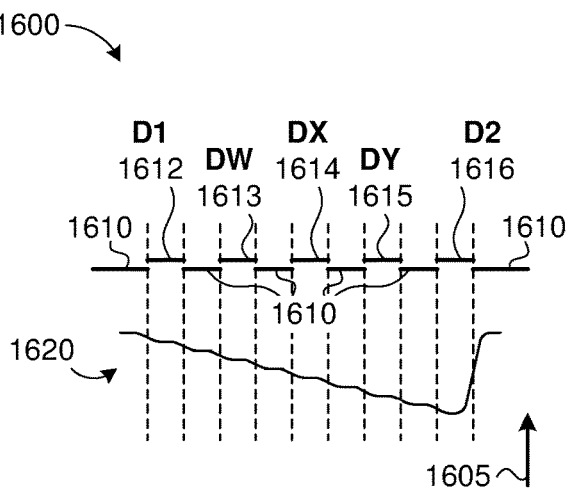
FIG. 16 is a diagram illustrating an exemplary energy profile for two quantum dots separated by multiple intermediate quantum dots according to another example of the disclosed technologies.

FIG. 16 is a diagram 1600 illustrating exemplary energy profiles for two quantum dots separated by multiple intermediate quantum dots in another example of the disclosed technologies. Dots D1 1612, D2 1616 are arranged relative to top electrode 1610 similarly to the configuration of FIG. 15. However, the single intermediate quantum dot DX 1514 has been replaced with a string of three intermediate dots DW 1613, DX 1614, DY 1615 as shown.

Energy profile graph 1620 demonstrates the more precise control of energy profile that can be achieved with multiple intermediate quantum dots DW, DX, DY. As illustrated, a monotonic and generally smooth energy profile can be obtained, with preferred lowest energy position located at D2. Arrow 1605 indicates a direction of increasing energy for graph 1620.

6. Shaped Quantum Dots with Multiple Control Electrodes

Figure 17:
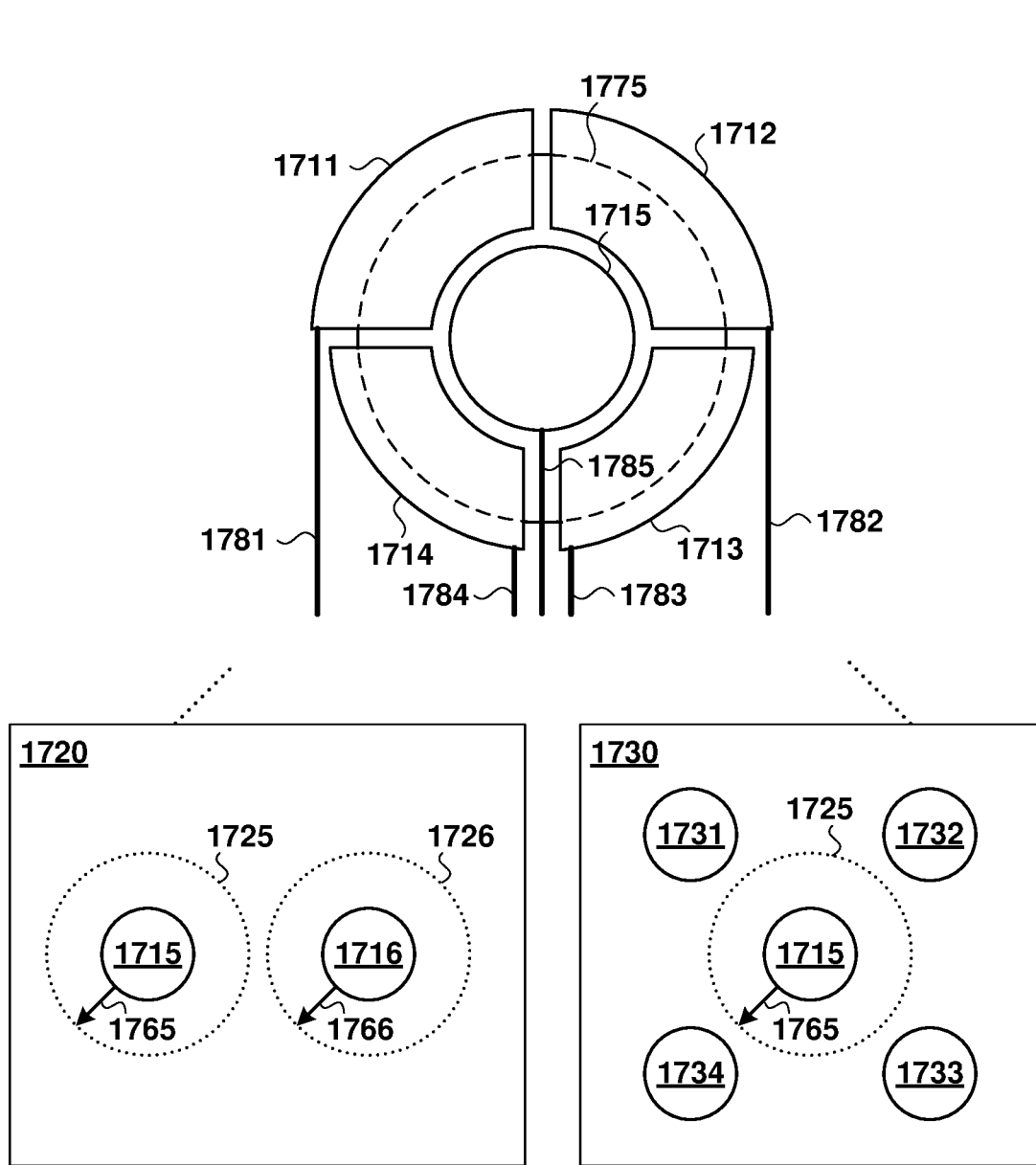
FIG. 17 is a diagram illustrating another example control electrode configuration according to the disclosed technologies.

FIG. 17 is a diagram 1700 illustrating another example control electrode configuration according to the disclosed technologies. In this example, multiple control electrodes allow the size or shape of a quantum dot to be dynamically varied for more flexible control of a localized quasiparticle or of tunneling barriers for confined quasiparticles. Insets 1720, 1730 illustrate associated use cases.

Shown in top view, central control electrode 1715 and its electrical lead 1785 are positioned above an aperture 1775 in a top electrode layer. The configuration can be similar to that of control electrodes 714, 716 of FIGS. 7A-7B, however unlike FIGS. 7A-7B, the transverse extent of control electrode 1715 is smaller than the transverse extent of aperture 1775. Additional portions of the aperture 1775 can be covered by multiple additional control electrodes 1711-1714, each having a respective independent electrical lead 1781-1784. Although FIG. 17 shows four control electrodes 1711-1714 arranged in an annulus, this is not a requirement, and other numbers or arrangements of supplementary control electrodes can be used.

In some instances, control electrodes 1711-1714 can be set to match the voltage on an adjacent top electrode. In such instances, a suitable voltage on central control electrode 1715 can be used to control a quantum dot whose transverse extent is determined, at least in part, by the diameter of control electrode 1715. In other instances, voltages on control electrodes 1711-1714 can be set to match the voltage on control electrode 1715, distinct from the voltage on any adjacent top electrode. In such instances, a common voltage on control electrodes 1711-1715 can be adjusted to control a quantum dot whose transverse extent is based at least partly on the diameter of the aperture 1775. Other voltage patterns can also be used. For example, one, two, or three of control electrodes 1711-1714 can be set to match the voltage on central electrode 1715, while the remaining control electrode(s) can be set to match the voltage on an adjacent top electrode. As another example, one or more of the control electrodes 1711-1714 can be set to a voltage between the voltage of the central electrode 1715 and the voltage of the adjacent top electrode.

Inset 1720 depicts an illustrative use case of a configuration similar to that of electrodes 1711-1715 described above. The effective diameter of control electrode 1715 can be expanded to diameter 1725 by switching control electrodes (not shown in inset 1720) from the top electrode voltage to the voltage of control electrode 1715, as indicated by arrow 1765. An adjacent quantum dot of similar construction can have a central control electrode 1716 which can similarly be expanded to aperture diameter 1766 as indicated by arrow 1766. Thus, in a first state, the effective diameters of the control electrodes 1715, 1716 are small, the transverse confinement areas are small, and a separation between the quantum dots is relative large, resulting in a large tunneling barrier between them. In a second state, the effective diameters of the control electrodes are expanded to the aperture diameters 1725, 1726, the transverse confinement areas of the associated quantum dots are increased, and the tunneling barrier can be dramatically decreased, by one or more orders of magnitude. In examples, the quantum dots associated with electrodes 1715, 1716 can be computational quantum dots, ancillary quantum dots, or intermediate quantum dots, in any combination.

Inset 1730 depicts another use case. A quantum dot having the central control electrode 1715 can be situated among an array of four neighboring control electrodes 1731-1734 representing respective quantum dots. As above, central electrode 1715 can be surrounded by a ring of control electrodes 1711-1714 (not shown in inset 1730) whereby the effective transverse extent of control electrode 1715 can be expanded up to the perimeter of aperture 1725, in selectable directions. For example, setting the control voltage of control electrode 1711 to match control electrode 1715 can deform the quantum dot underneath control electrode 1715 towards the neighboring quantum dot of electrode 1731. The other control electrodes 1712-1714 can be held at the top electrode voltage during such deformation. Similarly, excitation of each of the other control electrodes 1712-1714 can deform the quantum dot beneath electrode 1715 towards dot electrodes 1732-1734 respectively. Still further, excitation of two among control electrodes 1711-1714 can deform the shape of the dot beneath electrode 1715 towards two of the neighboring quantum dots 1731-1734 simultaneously, allowing any selectable pair among dots 1731-1734 to be coupled (i.e. a decrease in a tunneling barrier e.g. for purpose of transport, tunable interaction, or fusion). In examples, the four dots 1731-1734 can be computational quantum dots of a qubit, and dot electrode 1715 can control a common intermediate quantum dot having variable size or shape.

7. Hamiltonian Notation

Quantum dots, qubits, or other computing structures described herein can be described or analyzed using Schrodinger's equation $E\psi=H$, where $\psi$ is a wavefunction of the instant structure, H is a Hamiltonian operator, and E is an energy eigenvalue of the structure. Several operations of interest herein can be described in terms of two interacting quantum dots (which can be denoted by superscripts 1, 2) having initial and final configurations (denoted by subscripts i, f). In such case, the Hamiltonian can be expressed as:

$$H = \begin{bmatrix} E_i^{(1)} + E_i^{(2)} & \Gamma^* \\ \Gamma & E_f^{(1)} + E_f^{(2)} \end{bmatrix}. \tag{2}$$

In Equation (2), $\Gamma$ can be a tunneling amplitude from initial to final configuration, $\Gamma^*$ its complex conjugate, and the several $E_c^{(k)}$ terms can be numerically equal to energy values of configuration c on quantum dot k. Within scope of this description are transport ($E_i^{(2)}=E_f^{(1)}=0$, for dot D2 initially empty, and dot D1 empty after the transport operation), splitting ($E_i^{(2)}=0$, for dot D2 initially empty), fusion ($E_f^{(2)}=0$, for dot D2 empty afterward), and initialization ($E_i^{(2)}=E_i^{(1)}=0$, for initialization from a vacuum state), as special cases. The Hamiltonian description can be extended with additional $E_c^{(k)}$ terms for additional quantum dots, or with additional rows and columns for coupling between more than two configurations.

In the special case where $E_i^{(1)}+E_i^{(2)}=E_f^{(1)}+E_f^{(2)}$, degeneracy is avoided due to the tunneling amplitude, and a level splitting of $2\cdot\Gamma$ is obtained. This phenomenon is sometimes termed an "avoided crossing." Because adiabaticity can be defined with respect to the instantaneous energy gap, and in order to maintain topological protection or other adiabatic invariants, the rate of variation of control voltages or other system parameters can be configured to be slow in relation to the tunneling amplitude and the energy gap at the avoided crossing.

8. Localization

When the depth $\Phi_D$ of the local potential well at a dot exceeds a critical value related to the energy gap of the FQH phase, the most energetically favorable state can have a quasiparticle localized on the jth dot, so it can act as a trap for such a quasiparticle. For simplicity, we primarily consider the etched holes defining the dots to be circular with radius $R_D$, which would yield potential wells at each dot that are nearly circularly symmetric. Numerical simulations have demonstrated that circular potential wells energetically favor localization of the "fundamental" quasiparticle, which has the minimal quasiparticle charge Qqp. For non-Abelian FQH states, the fundamental quasiparticle is also a non-Abelian anyon, as desired. For example, in the Moore-Read state at $$\bar{v} = \frac{1}{2},$$

the fundamental quasiparticles have electric charge $$\pm\frac{e}{4}$$

and carry non-Abelian Bing charge σ; in the $Z_3$ Read-Rezayi state at $$\bar{v} = \frac{3}{5},$$

the fundamental quasiparticles have electric charge $$\pm\frac{e}{5}$$

and carry non-Abelian Fibonacci charge ε.

However, a given dot-defining aperture can alternatively be etched to have a different, non-circular geometry. The precise profile of the potential well of the corresponding quantum dot depends on the choice of geometry, so this design freedom can be used to achieve a desired effect, such as making the potential well more energetically favorable for localizing a particular quasiparticle type. Such customized potential well geometries can also be implemented in a tunable way using an array of gates at each dot's aperture, and can be dynamically varied. FIG. 17 illustrates an example with multiple gates 1711-1715 situated at aperture 1775 of a single quantum dot.

9. Intermediate States

When, the dot potentials must pass through a range that energetically favors the localization of other quasiparticle types in order to continuously tune between the off configuration of a dot (with no localized quasiparticle) and the configuration localizing a quasiparticle of type a. In this case, the intermediate states, which correspond to localizing other quasiparticle types on both dots, will enter the low-energy theory when tuning between these configurations. This situation is conceptually no different than a two-level operation described in context of Equation (2). Indeed, one can typically decompose a complex operation involving intermediate states into a sequence of tuning steps, each of which can be described using Equation (2).

XVIII. Example Determination of Topological Invariants

Fusion and braiding properties of non-Abelian quasiparticles can be characterized by a unitary modular tensory category (UMTC) having parameters known in the art as "F-symbols" and "R-symbols," which are topological invariants of a system. It can be desirable to determine these parameters experimentally in order to design effective computing operations or to establish the performance of an instant quantum computing device.

The disclosed technologies include computation and modification operations which can be used, as described herein, for creating, manipulating, or measuring quasiparticles that are localized within the bulk of a topological material or quantum computing system. While a localized quasiparticle can carry a definite value of topological charge, disclosed operations can also give rise to superpositions of states. Particularly, operations on non-Abelian quasiparticles can give rise to transient non-localized superpositions of states, as a result of which the disclosed operations can also be used to determine the controlling F-symbols or R-symbols and thereby characterize a given topological quantum computing device.

TABLE 3 lists a set of characterization operations (co):
Table 3 - Operations for device characterization

| No. | Operation |
|---|---|
| co1 | Localization of a quasiparticle with specific topological charge value. Localization of a quasiparticle in the bulk material can be implemented using a local pinning potential that energetically favors one particular topological charge value. |
| co2 | Measurement of the collective topological charge of pairs of quasiparticles. |
| co3 | Moving localized quasiparticles through the bulk material. Moving quasiparticles though the bulk material can be done with adiabatic transport that moves the locations of pinning potentials. |
| co4 | Splitting one localized quasiparticle into two separate quasiparticles with specific topological charge values. Splitting a quasiparticle into two quasiparticles can be done using an adiabatic process where the initial pinning potential is adiabatically transformed into two separate, appropriately chosen pinning potentials. The topological charge values involved in a splitting processes can be assured can respect the fusion rules and avoid spawning stray quasiparticles. Pair-creation from vacuum can be considered a special case of a splitting operation, starting from a trivial vacuum state. |

In order to characterize a device, in some embodiments the measurement of the topological charge of pairs of quasiparticles can distinguish between all available distinct fusion channels. This can involve a calibration of the measurements to identify the signatures of the possible topological charge values, which can be done with a preceding set of calibration procedures. For example, calibration procedures can be performed using a calibration measurement of some local quantity that is correlated with the topological charge, such as a localized energy density or charge distribution. Generally, two quasiparticles can be moved into sufficiently close proximity of each other to support interaction, and then the local calibration measurement can be performed. The proximal distance between quasiparticles required for a measurement can be set according to the reach of an instant measurement device.

In further examples, the fusion channel, topological charge, or calibration measurements could potentially be performed via nonlocal methods, such as interferometry or other measurement devices capable of coherently coupling across distances that are long compared to the correlation length. Such nonlocal methods can also enable measurement of the collective fusion channels of not just pairs of quasiparticles, but clusters of three or more quasiparticles. However, nonlocal measurements are not required, and local measurements (e.g. capacitance measurement) can be used for characterizing a device and its UMTC properties.

Fusion of two quasiparticles can be regarded as a combination of (3) moving localized particles to a common location and (2) measuring the collective topological charge at the common location. Accordingly, fusion is omitted from the list 1-4 above. Moreover, the operations of (3) moving and (4) splitting quasiparticles are not required for device characterization operations. One or both of (3) moving and (4) splitting can be omitted from some embodiments or can be retained in other embodiments. In some examples, (1) localization of quasiparticles and (2) pairwise measurements of their topological charge can suffice for device characterization. Still further, tunable interactions can also be included as an alternate operation for device characterization.

As an alternative to moving or splitting a quasiparticle (including initialization) using adiabatic transport, anyonic teleportation or measurement-only methods can be used equivalently. In such examples, interferometric methods can be used to perform collective topological charge measurement of multiple quasiparticles. Alternatively, an instant computing device can be restricted to initial states that can be created by pairwise measurements in Abelian fusion channels. In certain examples, transport operations can be better suited to elucidating braiding properties as compared to measurement-only operations.

With topological protection, i.e. with quasiparticles kept isolated except while interacting, device characterization operations can be robust. That is, devices can be accurately characterized without precise knowledge of a governing Hamiltonian, fine-tuned control of the basic operations, or special care to avoid confounding geometric or dynamical phases. This robustness arises because the localized topological charges are not superposed, but can be moved and split deterministically, while the topologically protected non-local state space is probed. Diabatic corrections associated with performing transport in finite time and also be suppressed, albeit with polynomial rather than exponential scaling. Moreover, Ocneanu rigidity ensures that, for a given set of fusion rules, there are a finite number of possible UMTCs whose corresponding topological invariants differ by discrete amounts. Thus, error bars on measured quantities can be made small enough, e.g. through repeated measurements, to allow distinguishing candidate UMTC models to any desired confidence level.

As an example, a device can be initialized to have an a a' pair of conjugate quasiparticles formed from a first vacuum channel and another b b' pair of conjugate quasiparticles formed from a second vacuum channel. To illustrate with reference to FIG. 10A, quantum dots 1011, 1013, 1015, 1017 can respectively be initialized with the a', a, b, b' quasiparticles. Repeated fusion measurement on dots 1013, 1015 can provide the distribution of probabilities Pab(c) for various values of c, thus establishing the fusion rules for initial topological charges a, b. Similar fusion measurements can map out fusion rules for other initial configurations. Particularly, repeating the described procedure for all possible values of a, b allows determination of fusion coefficients Ncab and the quantum dimension da. Accordingly, practical computation operations can be developed for the instant quantum computing device and other devices of a similar configuration.

In some examples, distances between quasiparticles can be varied, such as with dot electrodes of variable size. In such examples, similar procedures can be extended to determine the correlation length of a given quasiparticle, which can also be valuable for designing efficient computation sequences.

XIX. Example Computing Environments

Figure 18:
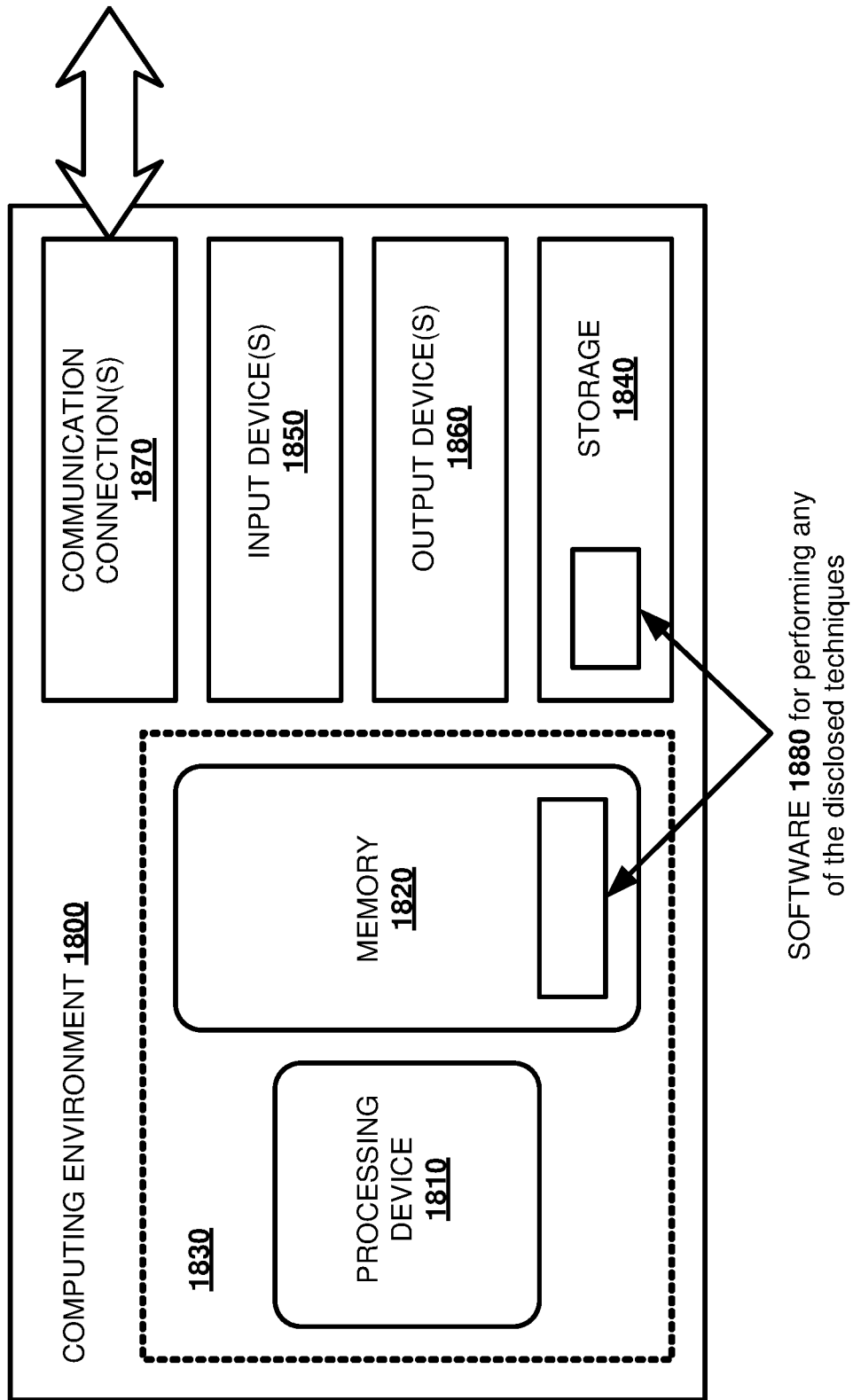
FIG. 18 illustrates a generalized example of a suitable classical computing environment with which aspects of the described embodiments can be implemented.

FIG. 18 illustrates a generalized example of a suitable classical computing environment 1800 in which aspects of the described embodiments can be implemented. The computing environment 1800 is not intended to suggest any limitation as to the scope of use or functionality of the disclosed technology, as the techniques and tools described herein can be implemented in diverse general-purpose or special-purpose environments that have computing hardware.

With reference to FIG. 18, the computing environment 1800 includes at least one processing device 1810 and memory 1820. In FIG. 18, this most basic configuration 1830 is included within a dashed line. The processing device 1810 (e.g., a CPU or microprocessor) executes computer-executable instructions. In a multi-processing system, multiple processing devices execute computer-executable instructions to increase processing power. The memory 1820 may be volatile memory (e.g., registers, cache, RAM, DRAM, SRAM), non-volatile memory (e.g., ROM, EEPROM, flash memory), or some combination of the two. The memory 1820 stores software 1880 implementing tools for performing any of the disclosed techniques for operating a quantum computer as described herein. The memory 1820 can also store software 1880 for synthesizing, generating, or compiling programs for performing any of the disclosed techniques.

The computing environment can have additional features. For example, the computing environment 1800 includes storage 1840, one or more input devices 1850, one or more output devices 1860, and one or more communication connections 1870. An interconnection mechanism (not shown), such as a bus, controller, or network, interconnects the components of the computing environment 1800. Typically, operating system software (not shown) provides an operating environment for other software executing in the computing environment 1800, and coordinates activities of the components of the computing environment 1800.

The storage 1840 can be removable or non-removable, and includes one or more magnetic disks (e.g., hard drives), solid state drives (e.g., flash drives), magnetic tapes or cassettes, CD-ROMs, DVDs, or any other tangible non-volatile storage medium which can be used to store information and which can be accessed within the computing environment 1800. The storage 1840 can also store instructions for the software 1880 implementing any of the disclosed techniques. The storage 1840 can also store instructions for the software 1880 for generating and/or synthesizing any of the described techniques, systems, or quantum circuits.

The input device(s) 1850 can be a touch input device such as a keyboard, touchscreen, mouse, pen, trackball, a voice input device, a scanning device, or another device that provides input to the computing environment 1800. The output device(s) 1860 can be a display device (e.g., a computer monitor, laptop display, smartphone display, tablet display, netbook display, or touchscreen), printer, speaker, or another device that provides output from the computing environment 1800.

The communication connection(s) 1870 enable communication over a communication medium to another computing entity. The communication medium conveys information such as computer-executable instructions or other data in a modulated data signal. A modulated data signal is a signal that has one or more of its characteristics set or changed in such a manner as to encode information in the signal. By way of example, and not limitation, communication media include wired or wireless techniques implemented with an electrical, optical, RF, infrared, acoustic, or other carrier.

As noted, the various methods and techniques for performing any of the disclosed technologies, for controlling a quantum computing device, to perform circuit design or compilation/synthesis as disclosed herein can be described in the general context of computer-readable instructions stored on one or more computer-readable media. Computer-readable media are any available media (e.g., memory or storage device) that can be accessed within or by a computing environment. Computer-readable media include tangible computer-readable memory or storage devices, such as memory 1820 and/or storage 1840, and do not include propagating carrier waves or signals per se (tangible computer-readable memory or storage devices do not include propagating carrier waves or signals per se). Computer-readable media do not include communication media.

Various embodiments of the methods disclosed herein can also be described in the general context of computer-executable instructions (such as those included in program modules) being executed in a computing environment by a processor. Generally, program modules include routines, programs, libraries, objects, classes, components, data structures, and so on, that perform particular tasks or implement particular abstract data types. The functionality of the program modules may be combined or split between program modules as desired in various embodiments. Computer-executable instructions for program modules may be executed within a local or distributed computing environment.

Figure 19:
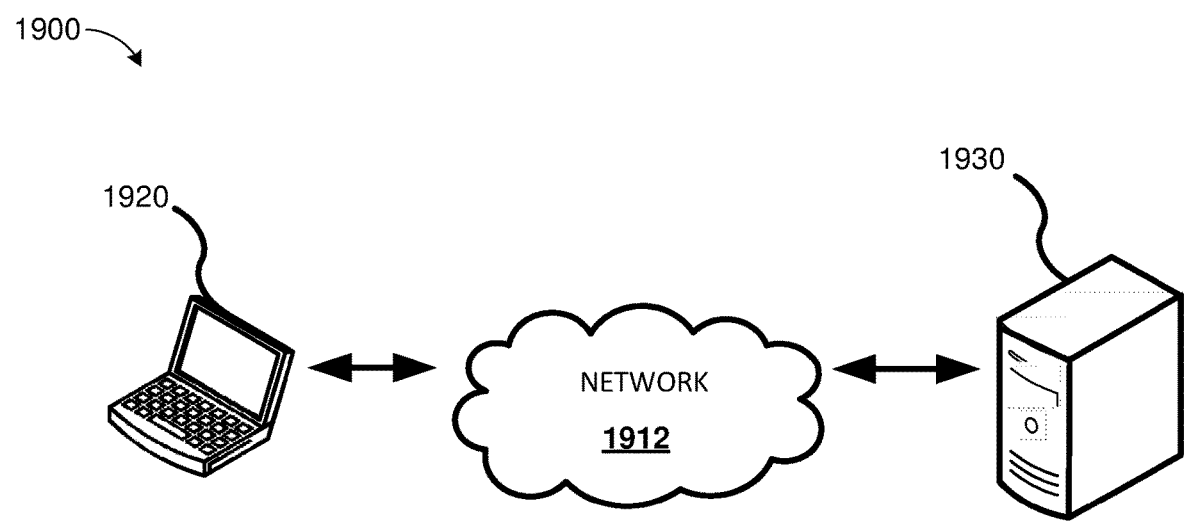
FIG. 19 illustrates an example of a possible network topology (e.g., a client-server network) for implementing a system according to the disclosed technologies.

An example of a possible network topology 1900 (e.g., a client-server network) for implementing a system according to the disclosed technology is depicted in FIG. 19. Networked computing device 1920 can be, for example, a computer running a browser or other software connected to a network 1912. The computing device 1920 can have a computer architecture as shown in FIG. 18 and discussed above. The computing device 1920 is not limited to a traditional personal computer but can comprise other computing hardware configured to connect to and communicate with a network 1912 (e.g., smart phones, laptop computers, tablet computers, or other mobile computing devices, servers, network devices, dedicated devices, and the like). Further, the computing device 1920 can comprise an FPGA or other programmable logic device. In the illustrated embodiment, the computing device 1920 is configured to communicate with a computing device 1930 (e.g., a remote server, such as a server in a cloud computing environment) via a network 1912. In the illustrated embodiment, the computing device 1920 is configured to transmit input data to the computing device 1930, and the computing device 1930 is configured to implement a technique for controlling a quantum computing device to perform any of the disclosed embodiments and/or a technique for operating quantum circuits for performing any of the techniques disclosed herein. The computing device 1930 can output results to the computing device 1920. Any of the data received from the computing device 1930 can be stored or displayed on the computing device 1920 (e.g., displayed as data on a graphical user interface or web page at the computing devices 1920). In the illustrated embodiment, the illustrated network 1912 can be implemented as a Local Area Network ("LAN") using wired networking (e.g., the Ethernet IEEE standard 802.3 or other appropriate standard) or wireless networking (e.g. one of the IEEE standards 802.11a, 802.11b, 802.11g, or 802.11n or other appropriate standard). Alternatively, at least part of the network 1912 can be the Internet or a similar public network and operate using an appropriate protocol (e.g., the HTTP protocol).

Figure 20:
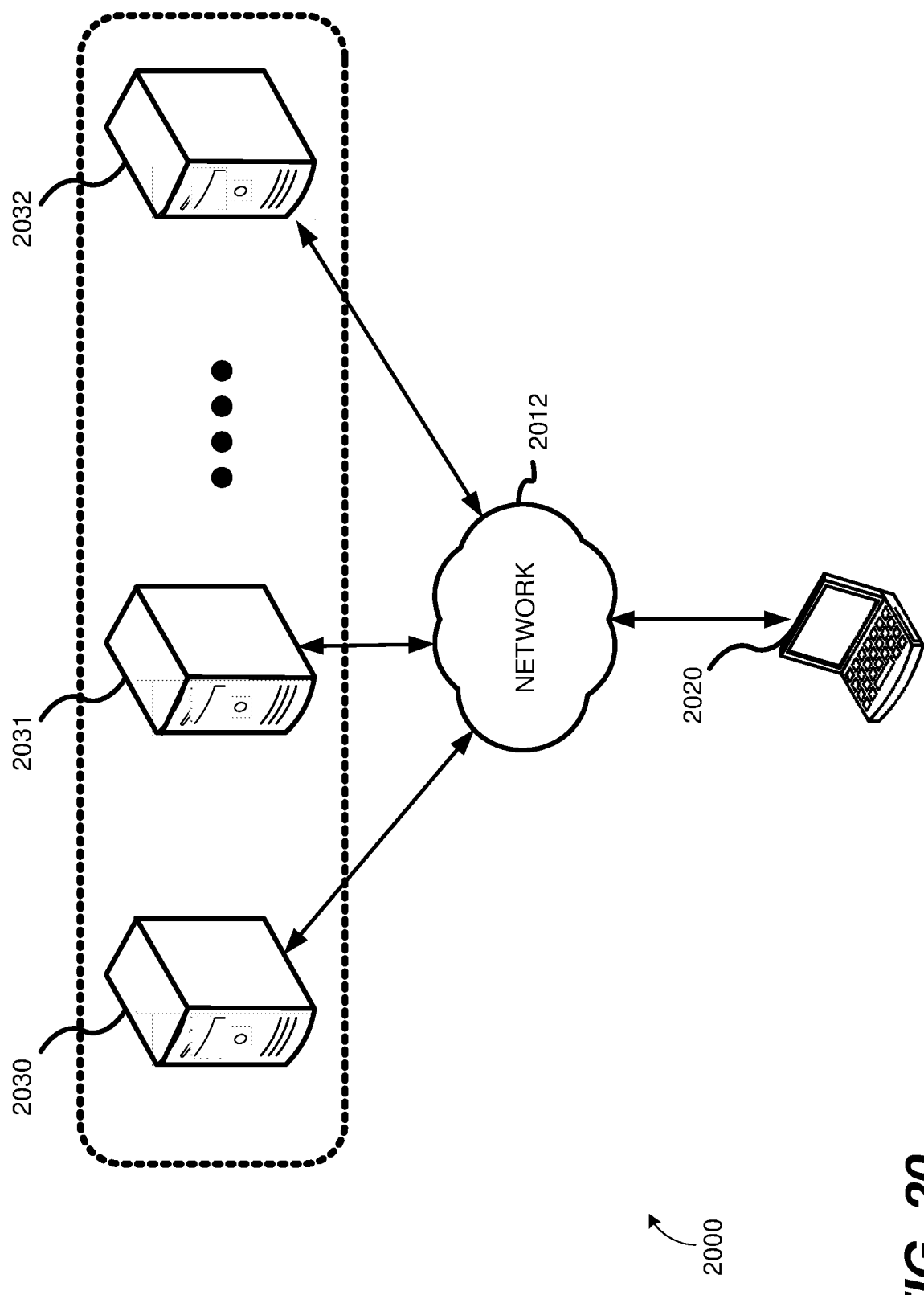
FIG. 20 illustrates another example of a possible network topology (e.g., a distributed computing environment) for implementing a system according to the disclosed technologies.

Another example of a possible network topology 2000 (e.g., a distributed computing environment) for implementing a system according to the disclosed technology is depicted in FIG. 20. Networked computing device 2020 can be, for example, a computer running a browser or other software connected to a network 312. The computing device 320 can have a computer architecture as shown in FIG. 18 and discussed above. In the illustrated embodiment, the computing device 2020 is configured to communicate with multiple computing devices 2030, 2031, 2032 (e.g., remote servers or other distributed computing devices, such as one or more servers in a cloud computing environment) via the network 2012. In the illustrated embodiment, each of the computing devices 2030, 2031, 2032 in the computing environment 2000 is used to perform at least a portion of the disclosed technology and/or at least a portion of the technique for controlling a quantum computing device to perform any of the disclosed embodiments and/or a technique for operating quantum circuits for performing any of the techniques disclosed herein. In other words, the computing devices 2030, 2031, 2032 form a distributed computing environment in which aspects of the techniques for performing any of the techniques as disclosed herein are shared across multiple computing devices. The computing device 2020 is configured to transmit input data to the computing devices 2030, 2031, 2032, which are configured to distributively implement a process, including performance of any of the disclosed methods, and to provide results to the computing device 2020. Any of the data received from the computing devices 2030, 2031, 2032 can be stored or displayed on the computing device 2020 (e.g., displayed as data on a graphical user interface or web page at the computing devices 2020). The illustrated network 2012 can be any of the networks discussed above with respect to FIG. 19.

Figure 21:
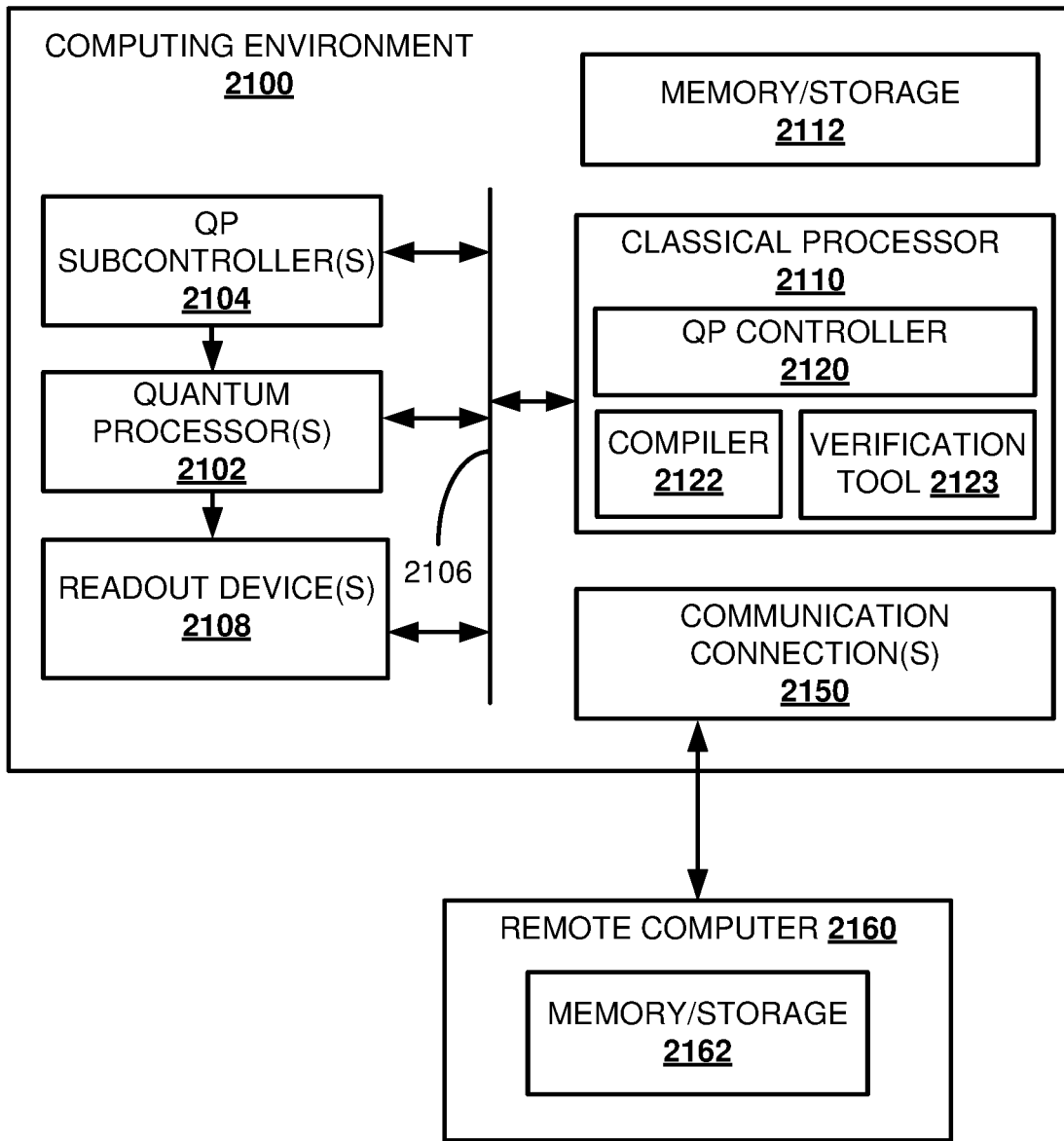
FIG. 21 illustrates an exemplary system for implementing the disclosed technologies in which the system includes one or more classical computers in communication with a quantum computing device.

With reference to FIG. 21, an exemplary system for implementing the disclosed technology includes computing environment 2100. In computing environment 2100, a quantum computer circuit description (including quantum circuits for performing any of the disclosed techniques as disclosed herein) can be used to program (or configure) one or more quantum processing units such that the quantum processing unit(s) implement operations according to the quantum computer circuit description.

The environment 2100 includes one or more quantum processing units 2102 and one or more readout device(s) 2108. The quantum processing unit(s) execute quantum operations that are precompiled and conform to the quantum computer circuit description. The quantum processing unit(s) can be one or more of, but are not limited to: (a) a superconducting quantum computer; (b) a quantum dot based quantum computer; (c) a fault-tolerant architecture for quantum computing; and/or (d) a topological quantum architecture (e.g., a topological quantum computing device using fractional quantum Hall states). The precompiled quantum operations can be sent into (or otherwise applied to) the quantum processing unit(s) via control lines 2106 at the control of quantum processor controller 2120. The quantum processor controller (QP controller) 2120 can operate in conjunction with a classical processor 2110 (e.g., having an architecture as described above with respect to FIG. 18) to implement the desired quantum computing process. In the illustrated example, the QP controller 2120 further implements the desired quantum computing process via one or more QP subcontrollers 2104 that are specially adapted to control a corresponding one of the quantum processor(s) 2102. For instance, in one example, the quantum controller 2120 facilitates implementation of the compiled quantum operations by sending instructions to one or more memories (e.g., lower-temperature memories), which then pass the instructions to low-temperature control unit(s) (e.g., QP subcontroller(s) 2104) that transmit, for instance, pulse sequences representing the gates to the quantum processing unit(s) 2102 for implementation. In other examples, the QP controller(s) 2120 and QP subcontroller(s) 2104 operate to provide appropriate magnetic fields, encoded operations, or other such control signals to the quantum processor(s) to implement the operations of the compiled quantum computer circuit description. The quantum controller(s) can further interact with readout devices 2108 to help control and implement the desired quantum computing process (e.g., by reading or measuring out data results from the quantum processing units once available, etc.)

With reference to FIG. 21, compilation is the process of translating a high-level description of a quantum algorithm into a quantum computer program comprising a sequence of quantum operations with gates, which can include the devices or circuits as disclosed herein (e.g., the devices or circuits configured to perform one or more of the procedures as disclosed herein). The compilation can be performed by a compiler 2122 using a classical processor 2110 (e.g., as shown in FIG. 21) of the environment 2100 which loads the high-level description from memory or storage devices 2112 and stores the resulting quantum computer program in the memory or storage devices 2112.

In other embodiments, compilation and/or verification can be performed remotely by a remote computer 2160 (e.g., a computer having a computing environment as described above with respect to FIG. 18) which stores the resulting quantum computer program in one or more memory or storage devices 2162 and transmits the quantum computer program to the computing environment 2100 for implementation in the quantum processing unit(s) 2102. Still further, the remote computer 2100 can store the high-level description in the memory or storage devices 2162 and transmit the high-level description to the computing environment 2100 for compilation and use with the quantum processor(s). In any of these scenarios, results from the computation performed by the quantum processor(s) can be communicated to the remote computer after and/or during the computation process. Still further, the remote computer can communicate with the QP controller(s) 2120 such that the quantum computing process (including any compilation, verification, and QP control procedures) can be remotely controlled by the remote computer 2160. In general, the remote computer 2160 communicates with the QP controller(s) 2120, compiler/synthesizer 2122, and/or verification tool 2123 via communication connections 2150.

In particular embodiments, the environment 2100 can be a cloud computing environment, which provides the quantum processing resources of the environment 2100 to one or more remote computers (such as remote computer 2160) over a suitable network (which can include the internet).

XX. General Considerations

The disclosed methods, apparatus, and systems should not be construed as limiting in any way. Instead, the present disclosure is directed toward all novel and nonobvious features and aspects of the various disclosed embodiments, alone or in various combinations and subcombinations with one another. Furthermore, any features or aspects of the disclosed embodiments can be used in various combinations and subcombinations with one another. For example, one or more method acts from one embodiment can be used with one or more method acts from another embodiment and vice versa. The disclosed methods, apparatus, and systems are not limited to any specific aspect or feature or combination thereof, nor do the disclosed embodiments require that any one or more specific advantages be present or problems be solved.

Various alternatives to the examples described herein are possible. The various aspects of the disclosed technology can be used in combination or separately. Different embodiments use one or more of the described innovations. Some of the innovations described herein address one or more of the problems noted. Typically, a given technique or tool does not solve all such problems.

As used in this application and in the claims, the singular forms "a," "an," and "the" include the plural forms unless the context clearly dictates otherwise. Additionally, the term "includes" means "comprises." Further, as used herein, the terms "or" and "and/or" mean any one item or combination of any items in the phrase.

XXI. Example Embodiments

The following clauses describe various features and combinations of features of various selected embodiments of the disclosed technologies. These clauses are illustrative, and the disclosed technologies are not limited to such embodiments.

1. A quantum dot comprising an all-van der Waals heterostructure.

1.1. The quantum dot of clause 1, wherein the heterostructure comprises:
 a plurality of distinct transverse van der Waals layers stacked vertically as a layer stack comprising, in order: a bottom electrode layer, a bottom dielectric layer, an active layer, a top dielectric layer, and a top electrode layer; and
 a dot electrode positioned over the top dielectric layer at an opening in the top electrode layer.

1.2. The quantum dot of clause 1.1, wherein the active layer supports non-Abelian topological phases.

1.3. The quantum dot of any one of clauses 1.1-1.2, wherein the active layer comprises a graphene monolayer, a graphene bilayer, or a transition metal dichalcogenide.

1.4. The quantum dot of any one of clauses 1.1-1.3, wherein the bottom dielectric layer or the top dielectric layer comprises boron nitride or a transition metal dichalcogenide.

1.5. The quantum dot of any one of clauses 1.1-1.4, wherein the bottom electrode layer or the top electrode layer comprises graphite.

1.6. The quantum dot of any one of clauses 1.1-1.5, wherein the dot electrode comprises graphite or a metal.

1.7. The quantum dot of any one of clauses 1.1-1.6, wherein at least one of the transverse van der Waals layers has a respective basal plane parallel to the respective transverse van der Waals layer.

1.8. The quantum dot of any one of clauses 1.1-1.7, wherein the active layer comprises a transition metal dichalcogenide having a thickness between 1 nm and 20 nm.

1.9. The quantum dot of any one of clauses 1.1-1.8, wherein the bottom dielectric layer or the top dielectric layer has a layer thickness between 10 nm and 200 nm.

1.10. The quantum dot of any one of clauses 1.1-1.9, wherein the bottom electrode layer, the top electrode layer, or the dot electrode has a thickness between 0.3 nm and 2 nm, or between 2 nm and 100 nm.

1.11. The quantum dot of any one of clauses 1.1-1.10, wherein a transverse extent of a portion of the dot electrode not shielded by electrode material of the top electrode layer is between 10 nm and 30 nm, or between 30 nm and 300 nm.

1.12. The quantum dot of any one of clauses 1.1-1.11, wherein a portion of the dot electrode not shielded by electrode material of the top electrode layer has an aspect ratio between 1:1 and 1.2:1, or between 1.5:1 and 10:1.

1.13. The quantum dot of any one of clauses 1.1-1.12, wherein the dot electrode comprises a material conductive at a predetermined operating temperature of the quantum dot structure.

1.14. The quantum dot of any one of clauses 1.1-1.13, wherein the dot electrode is formed within the top electrode layer.

1.15. The quantum dot of any one of clauses 1.1-1.13, wherein the dot electrode is formed above the top electrode layer.

1.16. The quantum dot of clause 1.15, further comprising a spacer between the top electrode layer and the dot electrode.

1.17. The quantum dot of clause 1.16, wherein the spacer comprises a van der Waals material, boron nitride, a transition metal dichalcogenide, or a same material as the top dielectric layer.

1.18. The quantum dot of any one of clauses 1.16-1.17, wherein the spacer has a thickness between 1 and 10 nm.

1.19. The quantum dot of any one of clauses 1.1-1.18, further comprising respective electrical leads coupled to the bottom electrode layer, the active layer, the top electrode layer, and the dot electrode.

1.20. The quantum dot of any of clauses 1-1.19, wherein the dot electrode is a first dot electrode and further comprising one or more additional dot electrodes positioned above respective portions of the opening in the top electrode layer.

1.21. The quantum dot of clause 1.20, wherein the first and additional dot electrodes are configured to be individually controlled.

1.22. The quantum dot of clause 1.20, wherein a transverse extent or shape of a quasiparticle localized at the quantum dot is configurable by individual control of the first and additional dot electrodes.

1.23. The quantum dot of any one of clauses 1-1.22, wherein the non-Abelian topological phases are fractional quantum Hall states.

1.24. An array of quantum dots comprising the quantum dot of any one of clauses 1.1-1.23, and further comprising:
 two or more additional dot electrodes over respective additional openings in the top electrode layer;
 wherein the heterostructure defines an array of quantum dots.

1.25. A qubit comprising the array of quantum dots of clause 1.24.

1.26. The qubit of clause 1.25, wherein the array of quantum dots comprises four primary quantum dots.

1.27. The qubit of clause 1.26, wherein the array of quantum dots comprises three intermediate quantum dots respectively positioned between successive pairs of the four primary quantum dots.

1.28. The qubit of clause 1.27, further comprising three ancillary quantum dots positioned to couple respectively with the successive pairs of the four primary quantum dots via additional intermediate quantum dots.

1.29. A topological quantum computer comprising a plurality of the qubits of any one of clauses 1.25-1.28.

1.30. The topological quantum computer of clause 1.29, wherein the plurality of qubits is arranged as a quasilinear array of qubits.

1.31. The topological quantum computer of clause 1.30, wherein the quasilinear array has an aspect ratio in a range 50:1 to 10000:1.

1.32. The topological quantum computer of clause 1.29, wherein the plurality of qubits is arranged as a two-dimensional array of qubits having length and width independently selectable in a range of two to 10,000 qubits.

1.33. The topological quantum computer of clause 1.32, wherein the two-dimensional array has width of at least two qubits and a length greater than or equal to the width.

1.34. The topological quantum computer of any one of clauses 1.29-1.33, further comprising:

a magnet configured to impose a magnetic field on the qubits;

power supplies configured to apply respective voltages to the bottom electrode layer, the active layer, and the top electrode layer;

control electronics configured to apply respective voltages to the first dot electrode or the additional dot electrodes to:

initialize a plurality of non-Abelian quasiparticles on the qubits;

perform computation operations on one or more of the qubits; or read fusion outputs of two or more of the non-Abelian quasiparticles; and cryogenics to maintain the qubits within a predetermined operating temperature range.

1.35. A method of manufacturing the heterostructure of any one of clauses 1-1.23, comprising:

epitaxially growing, laminating, or depositing successive layers of the layer stack on a substrate or on a preceding layer of the layer stack; and forming the dot electrode over an opening in the top electrode layer.

2. A quantum dot array comprising:

a plurality of quantum dots including first, intermediate, and second quantum dots independently configurable to support a given type of non-Abelian anyon under respective electromagnetic field environments, with the intermediate quantum dot further configurable between its respective electromagnetic field environment and an OFF state;

wherein, in a first case with the first and second quantum dots under their respective electromagnetic field environments and the intermediate quantum dot in the OFF state, a first tunneling barrier for the given type of non-Abelian anyon, between the first quantum dot and the second quantum dot, is above a first limit; and wherein, in a second case with the first and intermediate quantum dots under their respective electromagnetic field environments, a second tunneling barrier for the given type of non-Abelian anyon, between the first quantum dot and the intermediate quantum dot, is below a second threshold.

2.1. The quantum dot array of clause 2, wherein one or more of the first, intermediate, or second quantum dots are according to any one of clauses 1-1.23.

2.2. The quantum dot array of any one of clauses 2-2.1, wherein the first, intermediate, and second quantum dots share a common active layer or a common layer stack.

2.3. The quantum dot array of any one of clauses 2-2.2, wherein the first and intermediate quantum dots are proximate, and further comprising additional quantum dots arranged to form a linear sequence of quantum dots from the intermediate quantum dot to the second quantum dot.

2.4. A sequence of three or more quantum dot arrays of any one of clauses 2-2.3 arranged in a loop, wherein the second quantum dot of a given quantum dot array of the sequence is the first quantum dot of an immediately following quantum dot array of the sequence.

2.5. A sequence of N≥3 quantum dot arrays of any one of clauses 2-2.4 sequentially indexed from 1 to N, wherein the second quantum dots of quantum dot arrays 1:N−1 of the sequence are the first quantum dots of quantum dot arrays 2:N of the sequence.

2.6. A method of operating the quantum dot array of any one of clauses 2-2.3, comprising:

configuring the quantum dot array with a first non-Abelian anyon of the given type localized at the first quantum dot, and the intermediate quantum dot in the OFF state;

adjusting the electromagnetic field environment of the intermediate quantum dot to decrease the first tunneling barrier below the second threshold to cause transport of the first non-Abelian anyon from the first quantum dot to the second quantum dot.

2.7. The method of clause 2.6, wherein the adjusting results in a monotonic energy profile across an extent of the intermediate quantum dot.

2.8. A method of operating the quantum dot array of any one of clauses 2-2.3, comprising:

configuring the quantum dot array in a first state with first and second non-Abelian anyons of the given type respectively localized at the first and second quantum dots, and the intermediate quantum dot in the OFF state;

adjusting the electromagnetic field environment of the intermediate quantum dot to cause respective interaction strengths for a plurality of predetermined fusion channels of the first and second non-Abelian anyons; and subsequently reversing the adjusting to restore the first and second non-Abelian anyons to be respectively localized at the first and second quantum dots, in a second state;

wherein the first and second non-Abelian anyons in the second state have respective phase shifts relative to the first state that are dependent on the selected fusion rule.

2.9. The method of clause 2.8, wherein the adjusting and subsequent reversing are performed adiabatically.

2.10. A method of operating the quantum dot array of any one of clauses 2-2.3, comprising:

configuring the quantum dot array in a first state with first and second non-Abelian anyons of the given type respectively localized at the first and second quantum dots, and the intermediate quantum dot in the OFF state;

adjusting the electromagnetic field environment of the intermediate quantum dot to cause respective interaction strengths for a plurality of predetermined fusion channels of the first and second non-Abelian anyons; and during the adjusting, performing a measurement on the quantum dot array to identify one among the predetermined fusion channels.

2.11. The method of clause 2.10, wherein the measurement is an electrical measurement of capacitance between a pair of dots of the quantum dot array.

2.12. The method of clause 2.11, wherein the performing the measurement comprises detecting a shift in resonant frequency of a microwave resonator coupled to the pair of dots.

2.13. The method of any one of clauses 2.6-2.12, wherein the adjusting the electromagnetic field environment of the intermediate quantum dot is accompanied by:

adjusting the electromagnetic field environment of the first or second quantum dot.

2.14. One or more computer-readable media storing instructions executable by one or more hardware processors, the instructions comprising:

first instructions which, upon execution, cause performance of the method of any one of clauses 2.6-2.7;

second instructions which, upon execution, cause performance of the method of any one of clauses 2.8-2.9; and third instructions which, upon execution, cause performance of the method of any one of clauses 2.10-2.12.

2.15. The method of clause 2.10, wherein the measurement is a magnetic measurement of inductance shift between a pair of quasiparticles, obtained by magnetic coupling of microwaves.

3. A method of manufacturing a heterostructure, comprising:
forming a succession of van der Waals layers above a substrate, the van der Waals layers comprising a bottom electrode layer, a bottom dielectric layer, an active layer, a top dielectric layer, a top dielectric layer, and a top electrode layer; and
forming a dot electrode at an opening in the top electrode layer.

3.1. The method of clause 3, wherein the active layer comprises a material that can support non-Abelian topological phases.

3.2. The method of clause 3, wherein the van der Waals layers are formed in the order: bottom electrode layer, bottom dielectric layer, active layer, top dielectric layer, and top electrode layer, and the method further comprises:
forming an electrically insulating spacer above the top electrode layer prior to forming the dot electrode.

3.3. The method of clause 3, wherein the van der Waals layers are formed in the order: top electrode layer, top dielectric layer, active layer, bottom dielectric layer, and bottom electrode layer, and the method further comprises:
forming an electrically insulating spacer above the dot electrode prior to forming the top electrode layer.

3.4. The method of any one of clauses 3-3.3, wherein one or more of the forming operations are performed by deposition, exfoliation, lamination, or epitaxial growth.

3.5. The method of any one of clauses 3-3.4, further comprising etching the opening in the top electrode layer.

3.6. The method of any one of clauses 3-3.5, wherein the forming the dot electrode comprises:
depositing a metal using a lithography technique, wherein the dot electrode comprises the metal; or
epitaxially growing, laminating, or depositing a non-metallic material, wherein the dot electrode comprises the non-metallic material, and etching the non-metallic layer to delineate a perimeter of the dot electrode.

3.7. The method of any one of clauses 3-3.6, wherein the heterostructure defines a quantum dot.

3.8. The method of any one of clauses 3.7, wherein the quantum dot is according to any one of clauses 1-1.23.

3.9. The method of any one of clauses 3-3.8, wherein the dot electrode is a first dot electrode, the opening is a first opening, and the method further comprises:
forming a second dot electrode over a second opening in the top electrode layer; and
forming an intermediate dot electrode over an intermediate opening in the top electrode layer;
wherein the heterostructure is a quantum dot array according to any one of clauses 2-2.3, with the first, intermediate, and second dot electrodes being control electrodes of the first, intermediate, and second quantum dots respectively.

3.10. One or more computer-readable media storing instructions which, when executed by one or more hardware processors, cause the processors to control one or more manufacturing tools to perform the method of any one of clauses 3-3.9.

4. An all-van der Waals heterostructure comprising:
a layer stack of transverse van der Waals layers stacked vertically on a substrate, the layers comprising, in order:
a bottom electrode comprising graphite with a thickness in a first range 3-30 nm inclusive;
a bottom insulator comprising boron nitride with a thickness in a second range 20-100 nm inclusive;
a graphene bilayer;
a top insulator comprising boron nitride with a thickness in a third range 20-100 nm inclusive; and
a top electrode comprising graphite with a thickness in a fourth range 3-30 nm inclusive and having an aperture;
an electrically-insulating spacer having a thickness in a fifth range 2-5 nm inclusive above the top electrode and the aperture;
a dot electrode comprising a metal or graphite formed above the spacer and the aperture; and
respective electrical leads coupled to the bottom electrode, the graphene bilayer, the top electrode, and the dot electrode.

4.1. The all-van der Waals heterostructure of clause 4, wherein the dot electrode is a first dot electrode, and further comprising additional dot electrodes, wherein the first and additional dot electrodes are configured to individually control respective quantum dots in the all-van der Waals heterostructure.

5. A quantum computer comprising:
a coupled plurality of qubits formed as a quasilinear array of quantum dots, the quasilinear array having an aspect ratio in a range 50:1 to 10000:1;
wherein the array of quantum dots is configured to support localized non-Abelian quasiparticles; and
wherein the array of quantum dots comprises computational quantum dots and control quantum dots, each of the control quantum dots configured to control a tunneling barrier between a respective pair of the computational quantum dots.

5.1. The quantum computer of clause 5, wherein the array of quantum dots comprises a van der Waals heterostructure.

5.2. The quantum computer of any one of clauses 5-5.1, wherein at least one of the supported non-Abelian topological phases has an energy gap greater than 1.0 K, 1.5 K, 2.0 K, 2.5 K, or 3.0 K times Boltzmann's constant.

5.3. The quantum computer of any one of clauses 5-5.2, wherein the plurality of qubits is a number N of physical qubits forming N logical qubits.

5.4. The quantum computer of any one of clauses 5-5.3, wherein a given one of the qubits comprises a number C of the computational quantum dots, wherein the number C is 3, 4, or in a range 5-8.

5.5. The quantum computer of clause 5.4, wherein third dots of the array of quantum dots, distinct from the computational quantum dots and the control quantum dots, are configured to store ancillary quasiparticles, and the given qubit comprises a number A of the third dots, wherein A<C.

5.6. The quantum computer of clause 5.5, wherein additional control dots of the array of quantum dots are each positioned between a respective one of the computational quantum dots and a respective one of the third dots, and each of the additional control dots is configured to control a tunneling barrier between its respective computational quantum dot and its respective third dot.

5.7. The quantum computer of any one of clauses 5.5-5.6, wherein A=C−1 and the given qubit comprises a number I of the control dots, wherein I is at least 3·C−3.

5.8. The quantum computer of any one of clauses 5-5.7, further comprising control electronics coupled to the array of quantum dots and configured to perform a first set of topologically protected computation operations on a given one of the qubits.

5.9. The quantum computer of clause 5.8, wherein the first set of topologically protected computation operations is computationally universal.

5.10. The quantum computer of any one of clauses 5.8-5.9, wherein the control electronics is further configured to perform a second set of topologically protected operations on a given neighboring pair of the qubits.

5.11. The quantum computer of any one of clauses 5.8-5.10, wherein the first set of topologically protected operations comprises:
  initialization of respective quasiparticles at two or more computational quantum dots of the given qubit;
  measurement of a fusion outcome for two quasiparticles at respective computational quantum dots of the given qubit; and
    one or more of the following operations:
    transport of a quasiparticle among the computational quantum dots of the given qubit to a fourth computational quantum dot of the given qubit; or
    tunable interaction between two quasiparticles on respective quantum dots of the given qubit.

5.12. The quantum computer of clause 5.11, wherein the first set of topologically protected operations comprises the transport operations, and the control electronics is configured to perform a braiding operation on the given qubit using a sequence of the transport operations.

5.13. The quantum computer of clause 5.11, wherein the first set of topologically protected operations comprises the tunable interaction operations, and the control electronics is configured to perform a braiding operation on the given qubit using a sequence of the tunable interaction operations.

5.14. The quantum computer of clause 5.11, wherein the control electronics is configured to perform a braiding operation on the given qubit using a sequence of the measurement operations.

6. A method comprising:
  applying signals to control electrodes of first and second quantum dots of a qubit, to initialize first and second quasiparticles, which are non-Abelian topological quasiparticles localized at the first and second quantum dots respectively; and
  changing a voltage applied to a control electrode of a third quantum dot, positioned between the first quantum dot and a fourth quantum dot, of the qubit to decrease a tunneling barrier for the first quasiparticle between the first quantum dot and the fourth quantum dot and cause the first quasiparticle to be transported from the first quantum dot to the fourth quantum dot.

6.1. The method of clause 6, wherein the changing the voltage results in a monotonic energy profile across a transverse extent of the third quantum dot.

6.2. The method of any one of clauses 6-6.1, further comprising:
  changing a voltage applied to a control electrode of a fifth quantum dot of the qubit to increase a probability for the second quasiparticle to interact with a third quasiparticle localized at a sixth quantum dot of the qubit.

6.3. The method of clause 6.2, further comprising:
  measuring a fusion output of the second and third quasiparticles as the second and third quasiparticles interact.

6.4. The method of any one of clauses 6-6.3, further comprising:
  braiding the first and second quasiparticles through a succession of transport operations, interaction operations, or fusion output measurement operations.

6.5. One or more computer-readable media storing instructions which, when executed by one or more hardware processors, cause the processors to control one or more manufacturing tools to perform the method of any one of clauses 6-6.4.

7. One or more computer-readable media storing executable instructions, executable by one or more hardware processors, and comprising first instructions which, when executed, cause:
  a first alteration of one or more gate voltages at a set of gates to create one or more first tunnel couplings between two or more quantum dots fabricated as a Van der Waals heterostructure, the first tunnel couplings altering energy levels of two first non-Abelian quasiparticles on the two or more quantum dots, resulting in a hybridization of quantum states in the quantum system;
  measurement of a hybridization energy of the quantum system; and
  determination of a joint topological charge of the two first non-Abelian quasiparticles based on the measured hybridization energy.

7.1. The one or more computer-readable media of clause 7, wherein the executable instructions further comprise second instructions which, when executed, cause:
  a second alteration of one or more gate voltages at the set of gates to create one or more second tunnel couplings between the two or more quantum dots, the second tunnel couplings leading to interaction between two second non-Abelian quasiparticles on the two or more quantum dots; and
  a reversal of the second alteration.

7.2. The one or more computer-readable media of any one of clauses 7-7.1, wherein the executable instructions further comprise third instructions which, when executed, cause:
  a third alteration of one or more gate voltages at the set of gates to create one or more third tunnel couplings between the two or more quantum dots, the third tunnel couplings leading to transport of a third non-Abelian quasiparticle among the two or more quantum dots.

7.3. The one or more computer-readable media of any one of clauses 7-7.2, wherein the two or more quantum dots are three or more quantum dots, and wherein the executable instructions further comprise fourth instructions which, when executed, cause a braiding transformation on the three or more quantum dots using the first instructions, the second instructions, or the third instructions.

XXII. Concluding Remarks

The disclosed methods, apparatus, and systems should not be construed as limiting in any way. Instead, the present disclosure is directed toward all novel and nonobvious features and aspects of the various disclosed embodiments, alone and in various combinations and subcombinations with one another. The disclosed methods, apparatus, and systems are not limited to any specific aspect or feature or combination thereof, nor do the disclosed embodiments require that any one or more specific advantages be present or problems be solved.

In view of the many possible embodiments to which the principles of the disclosed technology may be applied, it should be recognized that the illustrated embodiments are examples of the disclosed technology and should not be taken as a limitation on the scope of the disclosed technology.

We claim:
1. A quantum dot array comprising:
  a plurality of quantum dots including first, intermediate, and second quantum dots independently controlled by a controller to support a given type of non-Abelian anyon under respective electromagnetic field environments, with the controller configured to vary the intermediate quantum dot between its respective electromagnetic field environment and an OFF state;

wherein, in a first case configured by the controller, with the first and second quantum dots under their respective electromagnetic field environments and the intermediate quantum dot in the OFF state, a first tunneling barrier of the given type of non-Abelian anyon, between the first quantum dot and the second quantum dot, is above a first limit; and wherein, in a second case configured by the controller, with the first and intermediate quantum dots under their respective electromagnetic field environments, a second tunneling barrier of the given type of non-Abelian anyon, between the first quantum dot and the intermediate quantum dot, is below a second threshold.

2. A sequence of N≥3 quantum dot arrays according to claim 1, the quantum dot arrays sequentially indexed from 1 to N, wherein the second quantum dots of quantum dot arrays 1:N−1 of the sequence are the first quantum dots of quantum dot arrays 2:N of the sequence.

3. A method of operating the quantum dot array of claim 1, comprising, by the controller:

configuring the quantum dot array with a first non-Abelian anyon of the given type localized at the first quantum dot, and the intermediate quantum dot in the OFF state;

adjusting the electromagnetic field environment of the intermediate quantum dot to decrease the first tunneling barrier below the second threshold to cause transport of the first non-Abelian anyon from the first quantum dot to the second quantum dot.

4. One or more computer-readable media storing instructions executable by one or more hardware processors, the instructions comprising:

first instructions which, upon execution, cause performance of the method of claim 3;

second instructions which, upon execution, cause performance of a second method comprising, by the controller:

configuring the quantum dot array in a first state with first and second non-Abelian anyons of the given type respectively localized at the first and second quantum dots, and the intermediate quantum dot in the OFF state;

adjusting the electromagnetic field environment of the intermediate quantum dot to cause respective interaction strengths for a plurality of predetermined fusion channels of the first and second non-Abelian anyons; and third instructions which, upon execution, cause performance of a third method following the second method and comprising, by the controller:

subsequently reversing the adjusting to restore the first and second non-Abelian anyons to be respectively localized at the first and second quantum dots, in a second state;

wherein the first and second non-Abelian anyons in the second state have respective phase shifts relative to the first state that are dependent on a selected channel among the plurality of predetermined fusion channels; and fourth instructions which, upon execution, cause performance of an operation following the second method and comprising:

during the adjusting, performing a measurement on the quantum dot array to identify one channel among the predetermined fusion channels.

5. A method of operating the quantum dot array of claim 1, comprising, by the controller:

configuring the quantum dot array in a first state with first and second non-Abelian anyons of the given type respectively localized at the first and second quantum dots, and the intermediate quantum dot in the OFF state;

adjusting the electromagnetic field environment of the intermediate quantum dot to cause respective interaction strengths for a plurality of predetermined fusion channels of the first and second non-Abelian anyons; and subsequently reversing the adjusting to restore the first and second non-Abelian anyons to be respectively localized at the first and second quantum dots, in a second state;

wherein the first and second non-Abelian anyons in the second state have respective phase shifts relative to the first state that are dependent on a selected channel among the plurality of predetermined fusion channels.

6. A method of operating the quantum dot array of claim 1, comprising:

configuring the quantum dot array in a first state with first and second non-Abelian anyons of the given type respectively localized at the first and second quantum dots, and the intermediate quantum dot in the OFF state;

adjusting the electromagnetic field environment of the intermediate quantum dot to cause respective interaction strengths for a plurality of predetermined fusion channels of the first and second non-Abelian anyons; and during the adjusting, performing a measurement on the quantum dot array to identify one channel among the predetermined fusion channels.

7. The method of claim 6, wherein the measurement is an electrical measurement of capacitance between a pair of dots of the quantum dot array.

8. The method of claim 6, wherein the measurement is a magnetic measurement of inductance shift between a pair of quasiparticles.

9. A quantum computer comprising:

a coupled plurality of qubits formed as a array of quantum dots, the array having an aspect ratio in a range 50:1 to 10000:1;

wherein the array of quantum dots is controlled by a controller to support localized non-Abelian quasiparticles; and wherein the array of quantum dots comprises computational quantum dots and control quantum dots, and the controller is configured to control each of the control quantum dots to vary a tunneling barrier between a respective pair of the computational quantum dots.

10. The quantum computer of claim 9, wherein at least one of the supported non-Abelian topological phases has an energy gap greater than 2.0 K times Boltzmann's constant.

11. The quantum computer of claim 9, wherein a given one of the qubits comprises a number C of the computational quantum dots, wherein the number C is 3, 4, or in a range 5-8.

12. The quantum computer of claim 11, wherein third dots of the array of quantum dots, distinct from the computational quantum dots and the control quantum dots, wherein the controller is configured to store ancillary quasiparticles at the third dots, and wherein the given qubit comprises a number A of the third dots, wherein A<C.

13. The quantum computer of claim 9, further comprising the controller, which is coupled to the array of quantum dots and configured to perform a first set of topologically protected computation operations on a given one of the qubits.

14. The quantum computer of claim 13, wherein the first set of topologically protected computation operations comprises:
    initialization of respective quasiparticles at two or more computational quantum dots of the given qubit;
    measurement of a fusion outcome for two quasiparticles at respective computational quantum dots of the given qubit; and
    one or more of the following operations:
        transport of a quasiparticle among the computational quantum dots of the given qubit to a fourth computational quantum dot of the given qubit; or
        tunable interaction between two quasiparticles on respective quantum dots of the given qubit.

15. The quantum computer of claim 14, wherein the controller is configured to perform a braiding operation on the given qubit using a sequence of the measurement operations.

16. A method comprising, by a controller:
    applying signals to control electrodes of first and second quantum dots of a qubit to initialize first and second quasiparticles, wherein the first and second quasiparticles are non-Abelian topological quasiparticles localized at the first and second quantum dots respectively; and
    changing a voltage applied to a control electrode of a third quantum dot, positioned between the first quantum dot and a fourth quantum dot of the qubit to decrease a tunneling barrier for the first quasiparticle between the first quantum dot and the fourth quantum dot and cause the first quasiparticle to be transported from the first quantum dot to the fourth quantum dot.

17. The method of claim 16, wherein the changing the voltage results in a monotonic energy profile across a transverse extent of the third quantum dot.

18. The method of claim 16, further comprising:
    changing a voltage applied to a control electrode of a fifth quantum dot of the qubit to increase a probability for the second quasiparticle to interact with a third quasiparticle localized at a sixth quantum dot of the qubit.

19. The method of claim 18, further comprising:
    measuring a fusion output of the second and third quasiparticles as the second and third quasiparticles interact.

20. The method of claim 16, further comprising:
    braiding the first and second quasiparticles through a succession of transport operations, interaction operations, or fusion output measurement operations.

* * * * *